United States Patent
Zhang et al.

(10) Patent No.: US 10,607,951 B2
(45) Date of Patent: Mar. 31, 2020

(54) GROUND PLANE VERTICAL ISOLATION OF, GROUND LINE COAXIAL ISOLATION OF, AND IMPEDANCE TUNING OF HORIZONTAL DATA SIGNAL TRANSMISSION LINES ROUTED THROUGH PACKAGE DEVICES

(71) Applicant: Intel Corporation, Santa Clara, CA (US)

(72) Inventors: Yu Amos Zhang, Santa Clara, CA (US); Gabriel Regalado Silva, Guadalajara (MX); Zhiguo Qian, Chandler, AZ (US); Kemal Aygun, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/774,958

(22) PCT Filed: Dec. 26, 2015

(86) PCT No.: PCT/US2015/000392
§ 371 (c)(1),
(2) Date: May 9, 2018

(87) PCT Pub. No.: WO2017/111834
PCT Pub. Date: Jun. 29, 2017

(65) Prior Publication Data
US 2018/0374804 A1    Dec. 27, 2018

(51) Int. Cl.
*H01L 23/66* (2006.01)
*H01L 23/48* (2006.01)
(Continued)

(52) U.S. Cl.
CPC .......... *H01L 23/66* (2013.01); *H01L 21/4857* (2013.01); *H01L 23/48* (2013.01);
(Continued)

(58) Field of Classification Search
CPC ... H01L 23/66; H01L 23/49838; H01L 24/16; H01L 2924/15311; H01L 2924/15192;
(Continued)

(56) References Cited

U.S. PATENT DOCUMENTS 9,013,040 B1   4/2015 Schmidt
2006/0012054 A1   1/2006 Memis
(Continued)

OTHER PUBLICATIONS

International Search Report and Written Opinion for International Patent Application No. PCT/US2015/000392 dated Aug. 31, 2016, 10 pgs.
(Continued)

*Primary Examiner* — Jasmine J Clark
(74) *Attorney, Agent, or Firm* — Schwabe, Williamson & Wyatt, P.C.

(57) ABSTRACT

A ground isolation transmission line package device includes (1) ground isolation planes between, (2) ground isolation lines surrounding, or (3) such ground planes between and such ground isolation lines surrounding horizontal data signal transmission lines (e.g., metal signal traces) that are horizontally routed through the package device. The (1) ground isolation planes between, and/or (2) ground isolation lines electrically shield the data signals transmitted in signal lines, thus reducing signal crosstalk between and increasing electrical isolation of the data signal transmission lines. In addition, data signal transmission lines may be tuned using eye diagrams to select signal line widths and ground isolation line widths that provide optimal data transmission performance. This package device provides higher frequency and more accurate data signal transfer
(Continued)

between different horizontal locations of the data signal transmission lines, and thus also between devices such as integrated circuit (IC) chips attached to the package device.

20 Claims, 17 Drawing Sheets

(51) Int. Cl.
*H05K 1/02* (2006.01)
*H01L 23/498* (2006.01)
*H01L 21/48* (2006.01)
*H01L 23/538* (2006.01)
*H01L 23/00* (2006.01)
*H01P 3/06* (2006.01)
*H01P 11/00* (2006.01)

(52) U.S. Cl.
CPC .... *H01L 23/49838* (2013.01); *H01L 23/5383* (2013.01); *H01L 23/5386* (2013.01); *H01L 24/16* (2013.01); *H01P 3/06* (2013.01); *H01P 11/005* (2013.01); *H05K 1/0218* (2013.01); *H05K 1/0219* (2013.01); *H01L 2223/6622* (2013.01); *H01L 2224/16227* (2013.01); *H01L 2224/16235* (2013.01); *H01L 2924/15192* (2013.01); *H01L 2924/15311* (2013.01); *H05K 1/0243* (2013.01)

(58) Field of Classification Search
CPC ............. H01L 21/4857; H01L 23/5383; H01L 23/5386; H01L 2224/16227; H01L 2224/16235; H01L 2223/6622; H05K 1/0243; H05K 1/0218; H05K 1/0219; H01P 11/005; H01P 3/06
See application file for complete search history.

(56) References Cited

U.S. PATENT DOCUMENTS

| | | |
|---|---|---|
| 2006/0081990 A1 | 4/2006 | Hsu |
| 2014/0151875 A1 | 6/2014 | Zhang et al. |
| 2014/0300003 A1 | 10/2014 | Kariyazaki et al. |
| 2018/0098420 A1* | 4/2018 | Kariyazaki ............. H01L 23/32 |
| 2018/0338375 A1* | 11/2018 | Shi ....................... H05K 1/0228 |

OTHER PUBLICATIONS

International Preliminary Report on Patentablity for International Patent Application No. PCT/US2015/000392, dated Jul. 5, 2018, 7 pages.

* cited by examiner

GROUND PLANE VERTICAL ISOLATION OF, GROUND LINE COAXIAL ISOLATION OF, AND IMPEDANCE TUNING OF HORIZONTAL DATA SIGNAL TRANSMISSION LINES ROUTED THROUGH PACKAGE DEVICES

CROSS-REFERENCE TO RELATED APPLICATION

This patent application is a U.S. National Phase Application under 35 U.S.C. § 371 of International Application No. PCT/US2015/000392, filed Dec. 26, 2015, entitled "GROUND PLANE VERTICAL ISOLATION OF, GROUND LINE COAXIAL ISOLATION OF, AND IMPEDANCE TUNING OF HORIZONTAL DATA SIGNAL TRANSMISSION LINES ROUTED THROUGH PACKAGE DEVICES," which designates the United States of America, the entire disclosure of which is hereby incorporated by reference in its entirety and for all purposes.

BACKGROUND

Field

Embodiments of the invention are related in general, to semiconductor device packaging and, in particular, to substrate packages, interposers, and printed circuit board (PCB) substrates upon which integrated circuit (IC) chips or other package devices may be attached, and methods for their manufacture. Such a substrate package device may have high speed horizontal data signal transmission lines extending through the package device for transmitting data between IC chips or other devices attached to the package device.

Description of Related Art

Integrated circuit (IC) chips (e.g., "chips", "dies", "ICs" or "IC chips"), such as microprocessors, coprocessors, graphics processors and other microelectronic devices often use semiconductor package devices ("packages") to physically and/or electronically attach the IC chip to a circuit board, such as a motherboard (or motherboard interface). The IC chip (e.g., "die") is typically mounted within a microelectronic substrate package that, among other functions, enables electrical connections between the die and a socket, a motherboard, or another next-level component. Some examples of such package devices are substrate packages, interposers, and printed circuit board (PCB) substrates upon which integrated circuit (IC) chips or other package devices may be attached.

There is a need in the field for an inexpensive and high throughput process for manufacturing such package devices. In addition, the process could result in a high package device yield and a package device of high mechanical stability. Also needed in the field, is a package device having better components for providing stable and clean power, ground, and high frequency transmit and receive data signals between its top surface and other components of or attached to the package device, such as from between different horizontal locations of horizontal data signal transmission lines in a level of the package device.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Figure 1:
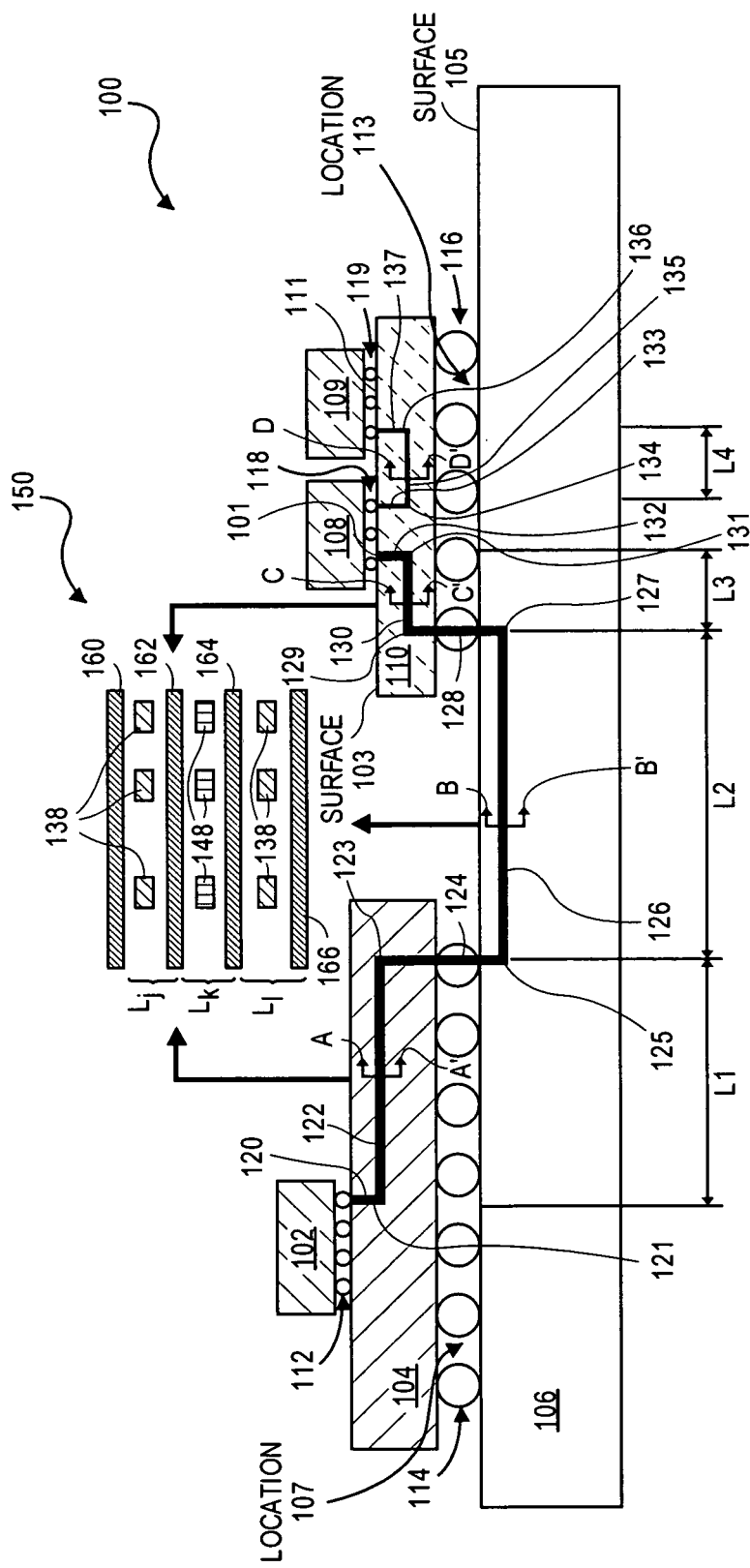
FIG. 1 is schematic cross-sectional side and length views of a computing system, including ground isolated horizontal data signal transmission line package devices.

Several embodiments of the invention with reference to the appended drawings are now explained. Whenever the shapes, relative positions and other aspects of the parts described in the embodiments are not clearly defined, the scope of embodiments of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

As integrated circuit (IC) chip or die sizes shrink and interconnect densities increase, physical and electrical connections require better components for providing stable and clean power high frequency transmit and receive data signals between different horizontal locations of, or a length of, horizontal data signal transmission lines in a level of package devices upon which the IC chip is mounted or is communicating the data signals. Some examples of such package devices are substrate packages, interposers, and printed circuit board (PCB) substrates upon which integrated circuit (IC) chips or other package devices may be attached. Such data signals may be received from or transmitted to contacts on the top or bottom surfaces of the package device that will be electrically connected through via contacts to the horizontal data signal transmission lines of the package device.

In some cases, an IC chip may be mounted within the package device, such as for "flip chip" bonding or packaging. In some cases, the IC chip may be mounted on the package device, which is also physically and electronically connected to another IC chip, so that the package device can provide data signal transfer between two IC chips. Here, in many cases, the package device must route hundreds or even thousands of high frequency data signals between two die. Some such package devices may be or use a silicon interposer, a silicon bridge, or an organic interposer technology.

According to some embodiments, it is possible for such a package device to provide higher frequency and more accurate data signal transfer between different horizontal locations of (or a length of) horizontal data signal transmission lines in one or more vertical levels of package devices upon which the IC chip is mounted or is communicating the data signals by having (or being manufactured by a process that forms): (1) ground isolation planes between, (2) ground isolation lines "coaxially" surrounding, or (3) such ground planes between and such ground isolation lines surrounding horizontal data signal transmission lines (e.g., conductor material or metal signal traces) that are horizontally routed through the package device. The (1) ground isolation planes between, and/or (2) ground isolation lines surrounding the horizontal data signal transmission lines may electrically shield the data signals transmitted in signal lines, thus reducing signal crosstalk between and increasing electrical isolation of the data signal transmission lines. In addition, the electrically shielded horizontal data signal transmission lines may be tuned using eye diagrams to select signal line widths and ground isolation line widths that provide optimal data transmission performance.

In some cases, the horizontal ground isolation planes are between different vertical levels of different types (e.g., "TX" or "RX") of data transmit (e.g., "TX") signal and data receive (e.g., "RX") signal transmission lines. In this case, the ground isolation planes may reduce crosstalk (and optionally may increase electrical isolation) between different adjacent vertical levels of the different types of TX and RX transmission lines, such as by reducing cross talk caused by a RX signal line on a vertically adjacent TX signal line (e.g., above or below the RX signal line); or vice versa. In some cases, there may be two or three adjacent vertical levels of the same type of TX and RX transmission lines between two horizontal isolation planes that are at different vertical heights in the package.

In some cases, the ground isolation lines surround (e.g., to the left, right, above and below; such as to form a "coaxial" type shielding) horizontal data RX or TX signal transmission lines in different vertical levels of data transmit signal (e.g., "TX") and data signal receive (e.g., "RX") transmission lines. Such "coaxial" type shielding or "surrounding" may be where a ground isolation lines are located horizontally adjacent (e.g., to the left and right) and vertically adjacent (e.g., above and below) the (or each) data signal transmission line. In some cases, the isolation lines surrounding the transmission lines may increase horizontal and vertical electrical isolation (and optionally may reduce crosstalk) of each of the surrounded (e.g., horizontally and vertically adjacent ones of) TX and RX transmission lines. This may include decrease crosstalk between a RX (or TX) signal line and a horizontally or vertically adjacent RX (or TX) signal line. In some cases, the isolation lines surrounding the transmission lines may reduce vertical crosstalk (and optionally may increase isolation) of each of the surrounded (e.g., vertically adjacent ones of) TX and RX transmission lines, such as by decreasing crosstalk between a RX signal line and a vertically adjacent TX signal line of a different level. In some cases, the isolation lines surrounding the transmission lines are used at dense interconnect regions, such as to form a "coaxial" routing design around each of the transmission lines to reduce crosstalk (and optionally may increase electrical isolation) between different vertically and horizontally adjacent data signal transmission lines. In these cases, there may be two or three vertically adjacent levels of one type of the TX and RX transmission lines, each transmission line being surrounded.

In some cases, such a package device is described as a package device having conductor material ground isolation planes between, and/or ground isolation lines ("coaxially") surrounding, horizontal data signal transmission lines horizontally routed through the package device (or through an interposer). Some embodiments of such a package device may be described as (e.g., devices, systems and processes for forming) a conductor material ground isolation "coaxial" surrounded and/or ground isolated plane isolated horizontal data signal transmission lines; a "ground isolated transmission line package device"; or a ground isolated horizontal data signal transmission line microprocessor package device.

Such a ground isolated transmission line package device having (1) ground isolation planes between and/or (2) ground isolation lines surrounding the horizontal data signal transmission lines may electrically shield the data signals transmitted in horizontally and/or vertically adjacent signal lines, thus reducing signal crosstalk between and increasing electrical isolation of the adjacent horizontal data signal transmission lines. In addition, such a package may have the electrically shielded horizontal data signal transmission lines tuned using test signals and eye diagrams to select signal line widths and ground isolation line widths that provide optimal data transmission performance of the signal lines (e.g., channel). In some cases, use of such a package increases the stability and cleanliness of high frequency transmit and receive data signals transmitted between different horizontal locations of horizontal data signal transmission lines in a level of the package device. In some cases, it may increase the usable frequency of transmit and receive data signals transmitted between the different horizontal locations of horizontal data signal transmission lines in a level of the package device, as compared to a package device not having ground isolated transmission line (e.g., as compared to a package device where the transmission lines do not have ground isolation planes between, or ground isolation lines ("coaxially") surrounding, horizontal data signal transmission lines). In some cases, such an increased speed (e.g., frequency) may include data signals between 7 and 25 gigatransfers per second (GT/s). In some cases, GT/s may refer to a number of operations (e.g. transmission of digital data such as the data signal herein) transferring data that occur in each second in some given data transfer channel such as a channel provided by signal lines 138 or 148; or may refer to a sample rate, i.e. the number of data samples captured per second, each sample normally occurring at the clock edge. 1 GT/s is $10^9$ or one billion transfers per second.

In some cases, the ground isolated transmission line package device reduces (e.g., improves or mitigates) crosstalk (e.g., as compared to the same package but without any ground isolated transmission lines, such as without (1) ground isolation planes between and/or (2) ground isolation lines surrounding the horizontal data signal transmission lines may reduce crosstalk between and increase isolation of horizontally and vertically adjacent ones of the horizontal data signal transmission lines on levels of the device (e.g., see levels Lj-Ll of FIGS. 1-4, or levels Lm-Lq of FIGS. 5-8, or levels Lm-Ly of FIGS. 9-12)) from very low speed transfer such as from 50 megatransfers per second-(MT/s) to a greater than 40 GT/s (or up to between 40 and 50 GT/s). In some cases, the ground isolated transmission line package device improves copper density in the package device (e.g., as compared to the same package but without any ground isolated transmission lines). In some cases, the ground isolated transmission line package device enhances the power delivery network for the input/output block (e.g., IO block such as including planes 160, 162 and 164; and lines 560, 562, 564 and 566) by improving (e.g., reducing resistance of) the ground impedance (e.g., as compared to the same package but without any ground isolated transmission lines), which helps to reduce the IO power network impedance (e.g., lower the resistance of power contacts).

In some cases, a ground isolated horizontal data signal transmission line package device has ground isolation planes separating horizontal data signal receive and transmit layers or levels (e.g., interconnect levels). Each level may have an upper layer of non-conductive (e.g., dielectric) material; a middle layer having conductor material (e.g., pure conductor or metal) data signal lines (e.g., traces) between non-conductive (e.g., dielectric) material portions; a lower layer of non-conductive (e.g., dielectric) material; and a lowest level ground isolation plane of conductor material (e.g., pure conductor or metal). The ground isolation planes between the horizontal data signal receive and transmit layers or levels (e.g., interconnect levels) may reduce crosstalk between (e.g., between TX signal lines and RX signal lines) and increase isolation of the horizontal data signal transmission lines of different horizontally adjacent levels or layers of the device package. This embodiment of a ground isolated horizontal data signal transmission line package device may be described as a ground isolation "plane" separated data signal package device (e.g., see device 150).

FIG. 1 is schematic cross-sectional side and length views of a computing system, including ground isolated horizontal data signal transmission line package devices. FIG. 1 shows a schematic cross-sectional side view of computing system 100 (e.g., a system routing signals from a computer processor or chip such as chip 102 to another device such as chip 108 or 109), including ground isolated horizontal data signal transmission line package devices, such as patch 104, interposer 106 and package 110. In some cases, system 100 has CPU chip 102 mounted on patch 104, which is mounted on interposer 106 at first location 107. It also shows chip 108 mounted on package 110 at first location 101; and chip 109 mounted on chip 110 at second location 111. Package 110 is mounted on interposer 106 at second location 113. For example, a bottom surface of chip 102 is mounted on top surface 105 of patch 104 using solder bumps or bump grid array (BGA) 112. A bottom surface of patch 104 is mounted on top surface 105 of interposer 106 at first location 107 using solder bumps or BGA 114. Also, a bottom surface of chip 108 is mounted on top surface 103 of package 110 at first location 101 using solder bumps or BGA 118. A bottom surface of chip 109 is mounted on surface 103 of package 110 at location 111 using solder bumps or BGA 119. A bottom surface of package 110 is mounted on surface 105 of interposer 106 at second location 113 using solder bumps or BGA 116.

In some cases, device 104, 106 or 110 may represent a substrate package, an interposer, a printed circuit board (PCB), a PCB an interposer, a "package", a package device, a socket, an interposer, a motherboard, or another substrate upon which integrated circuit (IC) chips or other package devices may be attached (e.g., such as microprocessor, coprocessor, graphics processor, memory chip, modem chip, or other microelectronic chip devices).

FIG. 1 also shows vertical data signal transmission lines 120 (e.g., data signal RX 138 and TX 148 transmission lines or traces) originating in chip 102 and extending vertically downward through bumps 112 and into vertical levels of patch 104. In some case, lines 120 may originate at (e.g., include signal contacts on) the bottom surface of chip 102, extend downward through bumps 112 (e.g., include some of bumps 112), extend downward through (e.g., include signal contacts on) a top surface of patch 104, and extend downward to levels Lj-Ll of patch 104 at first horizontal location 121 of patch 104 (e.g., include vertical signal lines within vertical levels Ltop-Ll of patch 104, such as where level Ltop is the topmost or uppermost level of patch 104 and has an exposed top surface; and level Ll is below level Ltop).

FIG. 1 also shows patch horizontal data signal transmission lines 122 (e.g., data signal RX 138 and TX 148 transmission lines or traces) originating at first horizontal location 121 in levels Lj-L1 of patch 104 and extend horizontally through level Lj-L1 along length L1 of levels Lj-L1 to second horizontal location 123 in levels Lj-L1 of patch 104. Length L1 may be between 5 and 15 millimeters (mm). In some cases it is between 8 and 13 mm. It can be appreciated that length L1 may be an appropriate line or trace length within a package device, that is less than or greater than those mentioned above.

Next, FIG. 1 shows vertical data signal transmission lines 124 (e.g., data signal RX 138 and TX 148 transmission lines or traces) originating in patch 104 and extending vertically downward through bumps 114 and into vertical levels of interposer 106. In some case, lines 124 may originate at (e.g., from horizontal data signal transmission lines in) levels Lj-L1 at second horizontal location 123 of patch 104, extend downward through bumps 114 (e.g., include signal contacts on the bottom surface of patch 104 and some of bumps 114 at location 107), extend downward through (e.g., include signal contacts on) top surface 105 of interposer 106, and extend downward to levels Lj-L1 of interposer 106 at first horizontal location 125 of interposer 106 (e.g., include vertical signal lines within vertical levels Ltop-L1 of interposer 106, such as where level Ltop is the topmost or uppermost level of interposer 106 and has an exposed top surface; and level L1 is below level Ltop).

FIG. 1 also shows interposer horizontal data signal transmission lines 126 (e.g., data signal RX 138 and TX 148 transmission lines or traces) originating at first horizontal location 125 in levels Lj-L1 of interposer 106 and extend horizontally through levels Lj-L1 along length L2 of levels Lj-L1 to second horizontal location 127 in levels Lj-L1 of interposer 106. Length L2 may be between 10 and 40 mm. In some cases it is between 15 and 30 mm. In some cases it is between 15 and 22 mm. It can be appreciated that length L2 may be an appropriate line or trace length within a package device, that is less than or greater than those mentioned above.

Next, FIG. 1 shows vertical data signal transmission lines 128 (e.g., data signal RX 138 and TX 148 transmission lines or traces) originating in interposer 106 and extending vertically upward through bumps 116 and into vertical levels of package 110. In some case, lines 124 may originate at (e.g., from horizontal data signal transmission lines in) levels Lj-L1 at second horizontal location 127 of interposer 106, extend upward through bumps 116 (e.g., include signal contacts on top surface 105 of interposer 106 and some of bumps 116 at location 113), extend upward through (e.g., include signal contacts on) a bottom surface of package 110, and extend upward to levels Lj-L1 of package 110 at first horizontal location 129 of package 110 (e.g., include vertical signal lines within vertical levels Llast-L1 of package 110, such as where level Llast is the lowest or bottommost level of package 110 and has an exposed bottom surface; and level L1 is above level Llast).

FIG. 1 also shows package device horizontal data signal transmission lines 130 (e.g., data signal RX 138 and TX 148 transmission lines or traces) originating at first horizontal location 129 in levels Lj-L1 of package 110 and extend horizontally through levels Lj-L1 along length L3 of levels Lj-L1 to second horizontal location 131 in levels Lj-L1 of package 110. Length L3 may be between 5 and 15 mm. In some cases it is between 10 and 15 mm. It can be appreciated that length L3 may be an appropriate line or trace length within a package device, that is less than or greater than those mentioned above.

Next, FIG. 1 shows vertical data signal transmission lines 132 (e.g., data signal RX 138 and TX 148 transmission lines or traces) originating in package 110 and extending vertically upward through bumps 118 and into chip 108. In some case, lines 132 may originate at (e.g., from horizontal data signal transmission lines in) levels Lj-L1 at second horizontal location 131 of package 110, extend upward through bumps 118 (e.g., include signal contacts on top surface 103 of package 110 and some of bumps 118 at location 101), extend upward through (e.g., include signal contacts on) a bottom surface of chip 108, and extend upward to and terminate at (e.g., include signal contacts on) a bottom surface of chip 108.

In some cases the data signal transmission signals transmitted and received (or existing) on the data signal transmission lines of lines 120, 122, 124, 128, 130 and 132 originate at (e.g., are generated or are provided by) chip 102 and chip 108. In some cases, these data signal transmission signals may be generated by active circuits, transistors, transmitter circuitry or other components of or attached to chip 102 and 108.

FIG. 1 also show vertical data signal transmission lines 133 (e.g., data signal RX 138 and TX 148 transmission lines or traces) originating in chip 108 and extending vertically downward through bumps 118 and into vertical levels of package 110. In some cases, lines 133 may originate at (e.g., include signal contacts on) the bottom surface of chip 108, extend downward through bumps 118 (e.g., include some of bumps 118), extend downward through (e.g., include signal contacts on) a top surface of package 110, and extend downward to levels Lj-L1 of package 110 at first horizontal location 134 of package 110 (e.g., include vertical signal lines within vertical levels Ltop-L1 of package 110, such as where level Ltop is the topmost or uppermost level of package 110 and has an exposed top surface; and level L1 is below level Ltop).

FIG. 1 also shows package device horizontal data signal transmission lines 135 (e.g., data signal RX 138 and TX 148 transmission lines or traces) originating at third horizontal location 134 in levels Lj-L1 of package 110 and extend horizontally through levels Lj-L1 along length L4 of levels Lj-L1 to second horizontal location 136 in levels Lj-L1 of package 110. Length L4 may be between 0.5 and 25 mm. In some cases it is between 1.0 and 15 mm. In some cases it is between 2 and 10 mm. It can be appreciated that length L1 may be an appropriate line or trace length within a package device, that is less than or greater than those mentioned above.

Next, FIG. 1 shows vertical data signal transmission lines 137 (e.g., data signal RX 138 and TX 148 transmission lines or traces) originating in package 110 and extending vertically upward through bumps 119 and into chip 109. In some case, lines 137 may originate at (e.g., from horizontal data signal transmission lines in) levels Lj-L1 at fourth horizontal location 136 of package 110, extend upward through bumps 119 (e.g., include signal contacts on top surface 103 of package 110 and some of bumps 119 at location 111), extend upward through (e.g., include signal contacts on) a bottom surface of chip 109, and extend upward to and terminate at (e.g., include signal contacts on) a bottom surface of chip 109.

In some cases the data signal transmission signals transmitted and received (or existing) on the data signal transmission lines of lines 133, 135 and 137 originate at (e.g., are generated or are provided by) chip 108 and chip 109. In some cases, these data signal transmission signals may be generated by active circuits, transistors, transmitter circuitry or other components of or attached to chip 108 and 109.

In some cases the data signal transmission signals of lines 120, 122, 124, 126, 128, 130, 132, 133, 135 and/or 137 are or include data signal transmission signals to an IC chip (e.g., chip 102, 108 or 109), patch 104, interposer 106, package 110, or another device attached to thereto. In some cases the data signal transmission signals of lines 120, 122, 124, 126, 128, 130, 132, 133, 135 and/or 137 are or include data signal transmission signals from or generated by a chip 102, 108 and/or 109; or another device attached to thereto.

In some cases the data signal transmission signals described herein are high frequency (HF) data signals (e.g., RX and TX data signals). In some cases, the signals have a speed of between 4 and 10 gigatransfers per second (GT/s). In some cases, the signals have a speed of between 6 and 8 gigatransfers per second. In some cases, the signals have a speed of between 4 and 5 Gigabits per second. In some cases, the signals have a speed of up to 10 Gigabits per second. In some cases, the signals have a speed of between 4 and 12 Giga-Transfers per second. In some cases the signals have a speed between 7 and 25 GT/s; and a voltage of between 0.5 and 2.0 volts. In some cases the signal has a speed between 6 and 15 GT/s. In some cases the signal has a voltage of between 0.4 and 5.0 volts. In some cases it is between 0.5 and 2.0 volts. In some cases it is a different speed and/or voltage level that is appropriate for receiving or transmitting data signals through or within a package device. In some cases, they are in a range between a very low speed transfer rate such as from 50 MT/s to greater than 40 GT/s (or up to between 40 and 50 GT/s).

In some cases, lines 120, 122 and 124 also include power and ground signal lines or traces (e.g., in addition to high frequency data signals receive and transmit lines 138 and 148). These power and ground lines are not shown. In some cases, they extend horizontally from location 121 to location 123 within levels Lj-Ll of patch 104. In some cases they extend horizontally from location 121 to location 123 within other levels of patch 104.

In some cases, lines 124, 126 and 128 also include power and ground signal lines or traces (e.g., in addition to high frequency data signals receive and transmit lines 138 and 148). These power and ground lines are not shown. In some cases, they extend horizontally from location 125 to location 127 within levels Lj-Ll of interposer 106. In some cases they extend horizontally from location 125 to location 127 within other levels of interposer 106. In some cases the power and ground signals transmitted and received (or existing) on the power and ground signal lines of lines 120, 122, 124 and 126 originate at or are provided by patch 104 or interposer 106. In some cases, these power and ground signals may be generated by power and ground circuits, transistors or other components of or attached to patch 104 or interposer 106.

In some cases, lines 128, 130 and 132 also include power and ground signal lines or traces (e.g., in addition to high frequency data signals receive and transmit lines 138 and 148). These power and ground lines are not shown. In some cases, they extend horizontally from location 129 to location 131 within levels Lj-Ll of package 110. In some cases they extend horizontally from location 129 to location 131 within other levels of package 110. In some cases the power and ground signals transmitted and received (or existing) on the power and ground signal lines of lines 128, 130 and 132 originate at or are provided by package 110 or interposer 106. In some cases, these power and ground signals may be generated by power and ground circuits, transistors or other components of or attached to package 110 or interposer 106.

In some cases, lines 133, 135 and 137 also include power and ground signal lines or traces (e.g., in addition to high frequency data signals receive and transmit lines 138 and 148). These power and ground lines are not shown. In some cases, they extend horizontally from location 134 to location 136 within levels Lj-Ll of package 110. In some cases they extend horizontally from location 134 to location 136 within other levels of package 110. In some cases the power and ground signals transmitted and received (or existing) on the power and ground signal lines of lines 133, 135 and 137 originate at or are provided by package 110 or interposer 106. In some cases, these power and ground signals may be generated by power and ground circuits, transistors or other components of or attached to package 110 or interposer 106

In some cases the power signal of lines 120, 122, 124, 126, 128, 130, 132, 133, 135 and/or 137 is or includes power signals to an IC chip (e.g., chip 102 or 108), patch 104, interposer 106, package 110, or another device attached to thereto. In some cases this power signal is an alternating current (AC) or a direct current (DC) power signal (e.g., Vdd). In some cases the power signal has a voltage of between 0.4 and 7.0 volts. In some cases it is between 0.5 and 5.0 volts. In some cases it is a different voltage level that is appropriate for providing one or more electrical power signals through or within a package device or IC chip.

In some cases the ground signal of lines 120, 122, 124, 126, 128, 130, 132, 133, 135 and/or 137 is or includes ground signals to an IC chip (e.g., chip 102 or 108), patch 104, interposer 106, package 110, or another device attached to thereto. In some cases this ground signal is a zero voltage direct current (DC) grounding signal (e.g., GND). In some cases the ground signal has a voltage of between 0.0 and 0.2 volts. In some cases it is a different but grounding voltage level for providing electrical ground signals through (or within) a package device or IC chip.

FIG. 1 also shows a schematic cross-sectional length view of a ground isolated horizontal data signal transmission line package device. In this case, the package device is ground isolation plane separated data signal package device 150. Device 150 may be a "package device" representing any of patch 104, interposer 106 or package 110. It can be appreciated that device 150 may represent another package device having horizontal data transmission lines.

In some cases, package device 150 represents horizontal data signal transmission lines 122 of patch 104 (e.g., between location 121 and location 123) in a cross section perspective through perspective A-A', such a cross section perpendicular to length (e.g., looking at a cross sectional view of the plane of height and width, and down direction L1). In some cases, package device 150 represents horizontal data signal transmission lines 126 of interposer 106 (e.g., between location 125 and location 127) in a cross section perspective through perspective B-B', such a cross section perpendicular to length (e.g., looking down direction L2). In some cases, package device 150 represents horizontal data signal transmission lines 130 of package 110 (e.g., between location 129 and location 131) in a cross section perspective through perspective C-C', such a cross section perpendicular to length (e.g., looking down direction L3). In some cases, package device 150 represents horizontal data signal transmission lines 135 of package 110 (e.g., between location 134 and location 136) in a cross section perspective through perspective D-D', such a cross section perpendicular to length (e.g., looking down direction L4).

In some cases, package device 150 represents all of horizontal data signal transmission lines 122, 126, 130 and 135. In some cases it represents any three of lines 122, 126, 130 and 135. In some cases it represents any two of lines 122, 126, 130 and 135. In some cases it represents only one of lines 122, 126, 130 and 135.

In some cases, package device 150 has package device ground isolation plane 160 separating package device horizontal data signal receive transmission lines 138 (e.g., data signal RX 138) of level Lj from adjacent (e.g., here "adjacent" describing vertically adjacent, such as by being in a level above or below level Lj) horizontal data signal transmit transmission lines (e.g., data signal TX or RX lines) of a level or layer of the package device that is above level Lj. Plane 160 may exist in any of patch 104 (e.g., extending as a continuous conductor material plane separating signal lines of level Lj from a layer above level Lj between locations 121 and 123); interposer 106 (e.g., extending as a continuous conductor material plane separating signal lines of level Lj from a layer above level Lj between locations 125 and 127); and/or package 110 (e.g., extending as a continuous conductor material plane separating signal lines of level Lj from a layer above level Lj between locations 129 and 131, and/or locations 134 and 136).

In some cases, package device 150 has package device ground isolation plane 162 separating package device horizontal data signal receive transmission lines 138 (e.g., data signal RX 138) of level Lj from adjacent horizontal data signal transmit transmission lines 148 (e.g., data signal TX 148) of level Lk of the package device that is below level Lj. Plane 162 may exist in any of patch 104 (e.g., extending as a continuous conductor material plane separating signal lines of level Lj from level Lk between locations 121 and 123); interposer 106 (e.g., extending as a continuous conductor material plane separating signal lines of level Lj from level Lk between locations 125 and 127); and/or package 110 (e.g., extending as a continuous conductor material plane separating signal lines of level Lj from level Lk between locations 129 and 131, and/or locations 134 and 136).

In some cases, package device 150 also has package device ground isolation plane 164 separating package device horizontal data signal transmit transmission lines 148 (e.g., data signal TX 148) of level Lk from adjacent horizontal data signal transmit receive lines 138 (e.g., data signal RX 138) of level Ll of the package device that is below level Lk. Plane 164 may exist in any of patch 104 (e.g., extending as a continuous conductor material plane separating signal lines of level Lk from level Ll between locations 121 and 123); interposer 106 (e.g., extending as a continuous conductor material plane separating signal lines of level Lk from level Ll between locations 125 and 127); and/or package 110 (e.g., extending as a continuous conductor material plane separating signal lines of level Lk from level Ll between locations 129 and 131, and/or locations 134 and 136).

In some cases, package device 150 has package device ground isolation plane 166 separating package device horizontal data signal receive transmission lines 138 (e.g., data signal RX 138) of level Ll from adjacent horizontal data signal transmit transmission lines (e.g., data signal TX or RX lines) of a level or layer of the package device that is below level Ll. Plane 166 may exist in any of patch 104 (e.g., extending as a continuous conductor material plane separating signal lines of level Ll from a layer below level Ll between locations 121 and 123); interposer 106 (e.g., extending as a continuous conductor material plane separating signal lines of level Ll from a layer below level Ll between locations 125 and 127); and/or package 110 (e.g., extending as a continuous conductor material plane separating signal lines of level Ll from a layer below level Ll between locations 129 and 131, and/or locations 134 and 136).

Figure 2A:
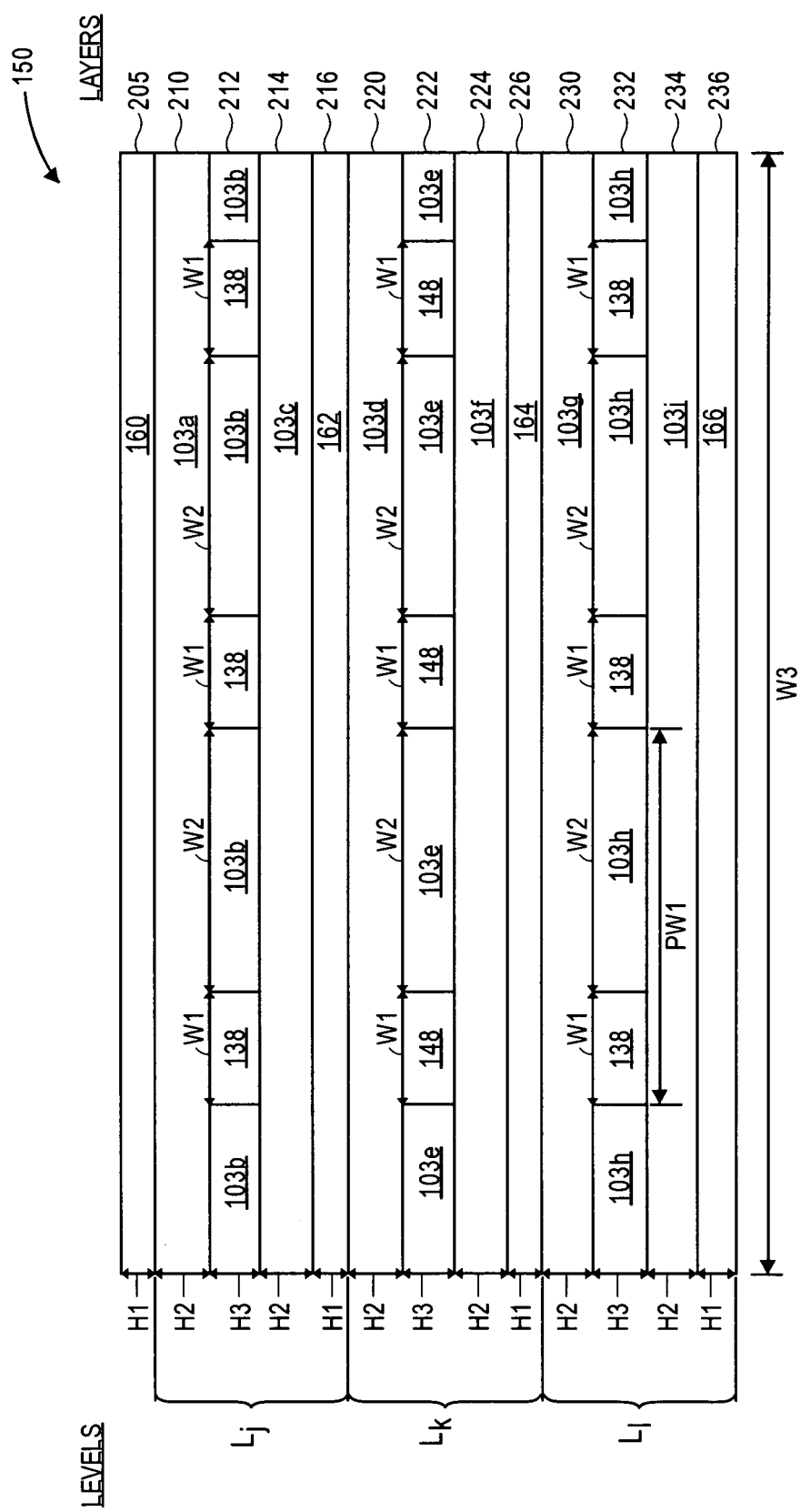
FIG. 2A is an exploded schematic cross-sectional length view of a ground isolated horizontal data signal transmission line package device of FIG. 1 showing ground isolation planes separating horizontal data signal receive and transmit layers or levels.

FIG. 2A is an exploded schematic cross-sectional length view of a ground isolated horizontal data signal transmission line package device of FIG. 1 showing ground isolation planes separating horizontal data signal receive and transmit layers or levels. FIG. 2A shows an exploded schematic cross-sectional length view of ground isolation plane separated data signal package device 150, such as a "package device" representing any of patch 104 (e.g., a view through perspective A-A'), interposer 106 (e.g., a view through perspective B-B') or package 110 (e.g., a view through perspective C-C' or D-D"). Package device 150 is shown having interconnect level Lj formed over or onto (e.g., touching) Level Lk which is formed over or onto Level Ll. Each level may have an upper layer of non-conductive (e.g., dielectric) material; a middle layer having conductor material (e.g., pure conductor or metal) data signal lines (e.g., traces) between non-conductive (e.g., dielectric) material portions; a lower layer of non-conductive (e.g., dielectric) material; and a lowest level ground isolation plane of conductor material (e.g., pure conductor or metal).

More specifically, FIG. 2A shows package device 150 having layer 205 that includes (e.g., along with other materials that are beyond the edge of width W3) or is (e.g., within width W3) package device conductor material (e.g., pure conductor or metal) ground isolation plane 160 separating upper layer 210 of package device dielectric material (and package device horizontal data signal receive transmission lines 138 (e.g., data signal RX 138)) of level Lj from package device non-conductor material (and vertically adjacent horizontal data signal transmit transmission lines (e.g., data signal TX or RX lines)) of a level or layer of the package device that is above plane 160.

Plane 160 may be directly physically connected to (e.g., formed in contact with), electrically coupled to, or directly attached to (e.g., touching) ground contacts or via contacts in the same layer 205 or level as plane 160. In some cases the ground plane 160 is or includes ground signals from patch 104, interposer 106, package 110, or another device attached to thereto. In some cases, a ground signal transmitted (or existing on) ground plane 160 originates at or is provided by patch 104, interposer 106 or package 110. In some cases, the ground signal may be generated by ground circuits, transistors or other components of or attached (e.g., such as from a motherboard or power supply electrically connected) to patch 104, interposer 106 or package 110. In some cases this ground signal is a zero voltage direct current (DC) grounding signal (e.g., GND). In some cases the ground signal has a voltage of between 0.0 and 0.2 volts. In some cases it is a different but grounding voltage level for providing electrical ground signals through (or within) a package device or IC chip.

Layer 205 (e.g., plane 160) may be formed onto (e.g., touching) or over layer 210 of level Lj. Layer 205 has height H1 and width W3. In some cases, height H1 may be approximately 15 micrometers (15×E-6 meter-"um") and width W3 is between 1 millimeter (mm) and 10 mm. In some cases, height H1 is between 10 and 20 micrometers (um). In some cases, it is between 5 and 30 micrometers. It can be appreciated that height H1 may be an appropriate height of a conductive material grounding plane within a package device for reducing cross talk and for isoating signal traces, that is less than or greater than those mentioned above.

In some cases, width W3 is between 1 millimeter (mm) and 20 mm. In some cases, it is between 100 micrometers and 2 mm. It can be appreciated that width W3 may be an appropriate width of a (e.g., single, set or layer of) horizontal data signal receive or transmit lines within a package device, that is less than or greater than those mentioned above. In some cases, width W3 can span from 1 percent to 100 percent of an entire width of a device package. In some cases, it can span from 20 percent to 90 percent of an entire width of a device package.

In some cases, the exact size of width W3 may depend on number of signal lines employed within each level (e.g., number of lines 138 or 148 in levels Lj-Ll). In some cases, the size of width W3 may also depend on the number of signal lines employed within the package device. In some cases, the size of width W3 can be scaled with or depend on the manufacturing or processing pitch (e.g., of the signal lines, such as shown as pitch PW1). The size of width W3 may also depend on the technology capability of forming the signal lines and package. In some cases, in general, the size of width W3 can span from around a hundred to a couple of hundred micrometers (×E-6 meter-"um" or "microns"). In some cases, it is between 80 and 250 um. In some cases it is between 50 and 300 um.

Level Lj is shown having upper layer 210 formed over or onto (e.g., touching) middle layer 212 which is formed over or onto lower layer 214 which is formed over or onto lowest layer 216.

Next, FIG. 2A shows upper layer 210 of level Lj that includes (e.g., along with other materials that are beyond the edge of width W3) or is (e.g., within width W3) package device non-conductive material plane 103a separating layer 205 from middle layer 212 of level Lj. Layer 210 (e.g., plane 103a) may be formed onto (e.g., touching) or over middle layer 212 of level Lj. Layer 210 has height H2 and width W3.

In some cases, height H2 is approximately 25 micrometers. In some cases, height H2 is between 20 and 30 micrometers (um). In some cases, it is between 10 and 40 micrometers. In some cases, height H2 is the same as height H1 noted above. It can be appreciated that height H2 may be an appropriate height of a dielectric material layer between the signal lines and grounding plane within a package device, that is less than or greater than those mentioned above.

Now, FIG. 2A shows middle layer 212 of level Lj that includes (e.g., along with other materials that are beyond the edge of width W3) or is (e.g., within width W3) package device conductor material (e.g., pure conductor or metal) horizontal data signal receive transmission lines 138 (e.g., a first type of data signal lines or traces, such as RX data signal lines) disposed (e.g., located) between package device non-conductive (e.g., dielectric) material portions, 103b. Layer 212 separates upper layer 210 from lower layer 214 of level Lj. Layer 212 (e.g., lines 138 and portions 103b) may be formed onto (e.g., touching) or over lower layer 214 of level Lj. Layer 212 has height H3 and width W3.

Horizontal data signal receive transmission lines 138 are shown having height H3 and width W1 (a width between horizontally adjacent portions 103b). Non-conductive material portions 103b are shown having height H3 and width W2 (a width between horizontally adjacent lines 138).

In some cases, height H3 may be approximately 15 micrometers (15×E-6 meter-"um"). In some cases, height H3 is between 10 and 20 micrometers (um). In some cases, it is between 5 and 30 micrometers. It can be appreciated that height H3 may be an appropriate height of a signal line layer (or data signal receive or transmit line) within a package device, that is less than or greater than those mentioned above. In some cases, height 113 is the same as height H1.

In some cases, width W1 is between 3 and 100 micrometers (um). In some cases, it is between 5 and 75 micrometers. In some cases, it is between 15 and 35 micrometers. It can be appreciated that width W1 may be an appropriate width of a data signal receive or transmit line within a package device, that is less than or greater than those mentioned above.

In some cases, width W2 is approximately 158 micrometers. In some cases, it is between 10 and 300 micrometers (um). In some cases, it is between 25 and 200 micrometers. In some cases, it is between 30 and 100 micrometers. It can be appreciated that width W2 may be an appropriate width of a non-conductive material between horizontally adjacent data signal receive or transmit lines within a package device, that is less than or greater than those mentioned above. In some cases, the size of width of the manufacturing or processing pitch between same edges (or centers of width W1) of horizontally adjacent data signal lines of device 150 is pitch PW1. PW1 may be equal to the sum of widths W1+W2. In some cases, pitch PW1 is approximately 206 micrometers.

In some cases, the aggregate (e.g., addition) of each pair of values for width W1/width W2 (e.g., spacing between signal lines) (e.g., value A of width W1 plus value B of width W2; or value O of width W1 plus value P of width W2, etc.) represents the same sum or constant (e.g., such as pitch width PW1). In some cases, the sum is between 100 and 200 um. In some cases, it is between 120 and 150 um. In some cases it is between 130 and 140 um. In some cases, pair values may be values between (1) width W1 between 60 and 80 um, and width W2 between 55 and 75 um; and (2) width W1 between 25 and 45 um, and width W2 between 90 and 110 um. In some cases, pair values may be width W1/width W2 of 70/65 um, 65/70 um, 60/75 um, 55/80 um, 50/85 um, 45/90 um, 40/95 um, or 35/100 um.

Next, FIG. 2A shows lower layer 214 of level Lj that includes (e.g., along with other materials that are beyond the edge of width W3) or is (e.g., within width W3) package device non-conductive material plane 103c separating middle layer 212 from lowest layer 216 of level Lj. Layer 214 (e.g., plane 103c) may be formed onto (e.g., touching) or over lowest layer 216 of level Lj. Layer 214 has height H2 and width W3.

Then, FIG. 2A shows lowest layer 216 of level Lj that includes (e.g., along with other materials that are beyond the edge of width W3) or is (e.g., within width W3) package device conductor material (e.g., pure conductor or metal) ground isolation plane 162 separating lower layer 214 of level Lj from upper layer 220 of vertically adjacent level Lk which is below level Lj. Layer 216 (e.g., plane 162) may vertically separate package device horizontal data signal receive transmission lines 138 (e.g., a first type of data signal lines or traces, such as RX data signal lines disposed between package device non-conductive material portions 103b) of level Lj (e.g., layer 212) from package device horizontal data signal transmit transmission lines 148 (e.g., a second type of data signal lines or traces, such as TX data signal lines disposed between package device non-conductive material portions 103e) of vertically adjacent level Lk (e.g., layer 222) that is below level Lj.

Plane 162 may be directly physically connected to (e.g., formed in contact with), electrically coupled to, or directly attached to (e.g., touching) ground contacts or via contacts in the same layer 216 or level as plane 162. In some cases the ground plane 162 is or includes ground signals from patch 104, interposer 106, package 110, or another device attached to thereto. In some cases, a ground signal transmitted (or existing on) ground plane 162 originates at or is provided by patch 104, interposer 106 or package 110. In some cases, the ground signal may be generated by ground circuits, transistors or other components of or attached (e.g., such as from a motherboard or power supply electrically connected) to patch 104, interposer 106 or package 110. In some cases this ground signal is a zero voltage direct current (DC) grounding signal (e.g., GND). In some cases the ground signal has a voltage of between 0.0 and 0.2 volts. In some cases it is a different but grounding voltage level for providing electrical ground signals through (or within) a package device or IC chip.

Layer 216 (e.g., plane 162) may be formed onto (e.g., touching) or over layer 220 of level Lk. Layer 216 has height H1 and width W3 (e.g., as noted above for plane 160).

Level Lk is shown having upper layer 220 formed over or onto (e.g., touching) middle layer 222 which is formed over or onto lower layer 224 which is formed over or onto lowest layer 226.

Next, FIG. 2A shows upper layer 220 of level Lk that includes (e.g., along with other materials that are beyond the edge of width W3) or is (e.g., within width W3) package device non-conductive material plane 103d separating layer 216 from middle layer 222 of level Lk. Layer 220 (e.g., plane 103d) may be formed onto (e.g., touching) or over middle layer 222 of level Lk. Layer 220 has height H2 and width W3.

Now, FIG. 2A shows middle layer 222 of level Lk that includes (e.g., along with other materials that are beyond the edge of width W3) or is (e.g., within width W3) package device conductor material (e.g., pure conductor or metal) horizontal data signal transmit transmission lines 148 (e.g., a second type of data signal lines or traces, such as TX data signal lines) disposed between package device non-conductive (e.g., dielectric) material portions 103e. Layer 222 separates upper layer 220 from lower layer 224 of level Lk. Layer 222 (e.g., lines 148 and portions 103e) may be formed onto (e.g., touching) or over lower layer 224 of level Lk. Layer 222 has height H3 and width W3.

Horizontal data signal transmit transmission lines 148 are shown having height H3 and width W1 (a width between horizontally adjacent portions 103e). Non-conductive material portions 103e are shown having height H3 and width W2 (a width between horizontally adjacent lines 148).

Next, FIG. 2A shows lower layer 224 of level Lk that includes (e.g., along with other materials that are beyond the edge of width W3) or is (e.g., within width W3) package device non-conductive material plane 103f separating middle layer 222 from lowest layer 226 of level Lk. Layer 224 (e.g., plane 103o) may be formed onto (e.g., touching) or over lowest layer 226 of level Lk. Layer 224 has height H2 and width W3.

Then, FIG. 2A shows lowest layer 226 of level Lk that includes (e.g., along with other materials that are beyond the edge of width W3) or is (e.g., within width W3) package device conductor material (e.g., pure conductor or metal) ground isolation plane 164 vertically separating lower layer 224 of level Lk from upper layer 230 of vertically adjacent level Ll which is below level Lk. Layer 226 (e.g., plane 164) may vertically separate package device horizontal data signal transmit transmission lines 148 (e.g., a second type of data signal lines or traces, such as TX data signal lines disposed between package device non-conductive material portions 103o of level Lk (e.g., layer 222) from package device horizontal data signal receive transmission lines 138 (e.g., a first type of data signal lines or traces, such as RX data signal lines disposed between package device non-conductive material portions 103h) of vertically adjacent level Ll (e.g., layer 232) that is below level Lk.

Plane 164 may be directly physically connected to (e.g., formed in contact with), electrically coupled to, or directly attached to (e.g., touching) ground contacts or via contacts in the same layer 226 or level as plane 164. In some cases the ground plane 164 is or includes ground signals from patch 104, interposer 106, package 110, or another device attached to thereto, as described for plane 162. In some cases this ground signal is a zero voltage direct current (DC) grounding signal (e.g., GND) or has a voltage, as described for plane 162.

Layer 226 (e.g., plane 164) may be formed onto (e.g., touching) or over layer 230 of level Ll. Layer 264 has height H1 and width W3 (e.g., as noted above for plane 160).

Level Lk is shown having upper layer 220 formed over or onto (e.g., touching) middle layer 222 which is formed over or onto lower layer 224 which is formed over or onto lowest layer 226.

Next, FIG. 2A shows upper layer 230 of level Ll that includes (e.g., along with other materials that are beyond the edge of width W3) or is (e.g., within width W3) package device non-conductive material plane 103g separating layer 226 from middle layer 232 of level Ll. Layer 230 (e.g., plane 103g) may be formed onto (e.g., touching) or over middle layer 232 of level Ll. Layer 230 has height H2 and width W3.

Now, FIG. 2A shows middle layer 232 of level Ll that includes (e.g., along with other materials that are beyond the edge of width W3) or is (e.g., within width W3) package device conductor material (e.g., pure conductor or metal) horizontal data signal receive transmission lines 138 (e.g., a first type of data signal lines or traces, such as RX data signal lines) disposed between package device non-conductive (e.g., dielectric) material portions 103h. Layer 232 separates upper layer 230 from lower layer 234 of level Ll. Layer 232 (e.g., lines 138 and portions 103h) may be formed onto (e.g., touching) or over lower layer 234 of level Ll. Layer 232 has height H3 and width W3.

Horizontal data signal receive transmission lines 138 are shown having height H3 and width W1 (a width between horizontally adjacent portions 103h). Non-conductive material portions 103h are shown having height H3 and width W2 (a width between horizontally adjacent lines 138).

Next, FIG. 2A shows lower layer 234 of level Ll that includes (e.g., along with other materials that are beyond the edge of width W3) or is (e.g., within width W3) package device non-conductive material plane 103i separating middle layer 232 from lowest layer 236 of level Ll. Layer 234 (e.g., plane 103i) may be formed onto (e.g., touching) or over lowest layer 236 of level Ll. Layer 234 has height H2 and width W3.

Then, FIG. 2A shows lowest layer 236 of level Ll that includes (e.g., along with other materials that are beyond the edge of width W3) or is (e.g., within width W3) package device conductor material (e.g., pure conductor or metal) ground isolation plane 166 vertically separating lower layer 234 of level Ll from an upper layer of an vertically adjacent lower level of device package 150 which is below level Ll. Layer 236 (e.g., plane 166) may vertically separate package device horizontal data signal receive transmission lines 138 (e.g., a first type of data signal lines or traces, such as RX data signal lines disposed between package device non-conductive material portions 103h) of level Ll (e.g., layer 232) from package device horizontal data signal transmit transmission lines 148 (e.g., a second type of data signal lines or traces, such as RX data signal lines disposed between package device non-conductive material portions) of a vertically adjacent lower level of device package 150 that is below level Ll.

Plane 166 may be directly physically connected to (e.g., formed in contact with), electrically coupled to, or directly attached to (e.g., touching) ground contacts or via contacts in the same layer 236 or level as plane 166. In some cases the ground plane 166 is or includes ground signals from patch 104, interposer 106, package 110, or another device attached to thereto, as described for plane 162. In some cases this ground signal is a zero voltage direct current (DC) grounding signal (e.g., GND) or has a voltage, as described for plane 162.

Layer 236 (e.g., plane 166) may be formed onto (e.g., touching) or over an upper layer of a vertically adjacent level of device package 150 that is below level Ll. Layer 266 has height H1 and width W3 (e.g., as noted above for plane 160).

Figure 2B:
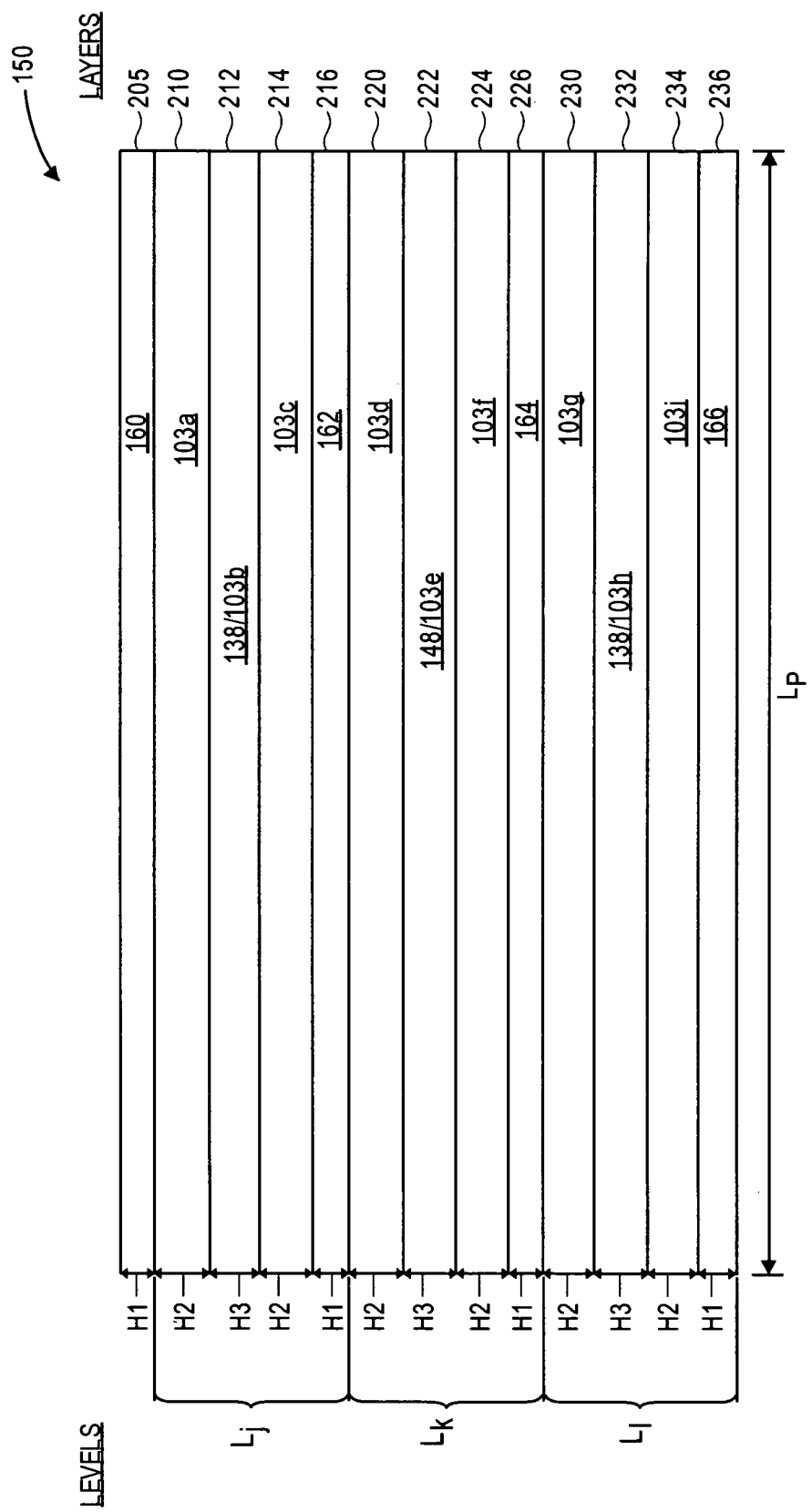
FIG. 2B is an exploded schematic cross-sectional side view of a ground isolated horizontal data signal transmission line package device of FIGS. 1 and 2A showing ground isolation planes separating horizontal data signal receive and transmit layers or levels.

FIG. 2B is an exploded schematic cross-sectional side view of a ground isolated horizontal data signal transmission line package device of FIGS. 1 and 2A showing ground isolation planes separating horizontal data signal receive and transmit layers or levels. FIG. 2B shows an exploded schematic cross-sectional side view of ground isolation plane separated data signal package device 150 of FIGS. 1 and 2A such as a "package device" representing any of patch 104 (e.g., along length Ll), interposer 106 (e.g., along length L2) or package 110 (e.g., along length L3 and/or L4). Package device 150 is shown having interconnect levels Lj, Lk and Ll (e.g., see FIG. 2A).

More specifically, FIG. 2B shows package device 150 having layers 205-236 along length Lp. Length Lp may represent any of lengths L1, L2, L3 or L4.

In some cases, length Lp is between 1 millimeter (mm) and 60 mm. In some cases, length Lp is between 100 micrometers and 2 mm. In some cases, length Lp is between 10 and 14 mm. In some cases, length Lp is between 7 and 20 mm. In some cases, length Lp is between 5 and 30 mm. In some cases, length Lp is between 40 and 50 mm. It can be appreciated that length Lp may be an appropriate length of a (e.g., single, set or layer of) horizontal data signal receive or transmit lines within a package device, that is less than or greater than those mentioned above. In some cases, length Lp can span from 10 percent to an entire length of a device package.

It can be appreciated that length Lp may represent a length that is not a straight line but that curves one or more times between two horizontal locations that horizontal data signal transmission lines are routed between (e.g., horizontal locations 121 and 123) in a level of package device 150. In some cases, length Lp will be different for different ones of the data signal transmit lines (RX and/or TX), such as depending on the routing of the lines between the two horizontal locations of that level. In some cases the two horizontal locations that horizontal data signal transmission lines are routed between (e.g., horizontal locations 121 and 123) in a level of package device 150 will be different for different ones of the horizontal data signal transmit lines (RX and/or TX) depending on the routing of the ends of the lines, such as for connection of the lines to signal contacts or via contacts of that level or another level of the package device.

FIG. 2B shows layer 205 that may include (e.g., along with other materials that are beyond the edge of length Lp) or is (e.g., within length Lp) ground isolation plane 160 vertically separating upper layer 210 of level Lj from a lowest layer of vertically adjacent level of device package 150 which is above level Lj. Layer 210 may include (e.g., along with other materials that are beyond the edge of length Lp) or is (e.g., within length Lp) package device non-conductive material plane 103a separating layer 205 from middle layer 212 of level Lj. Layer 212 is shown including (e.g., along with other materials that are beyond the edge of length Lp) or being (e.g., within length Lp) package device conductor material (e.g., pure conductor or metal) horizontal data signal receive transmission lines 138 (e.g., a first type of data signal lines or traces, such as RX data signal lines) disposed between package device non-conductive (e.g., dielectric) material portions 103b. For example, layer 212 is shown having "138/103b" which may represent lines 138 and/or portions 103b extending along length Lp. Layer 214 may include (e.g., along with other materials that are beyond the edge of length Lp) or be (e.g., within length Lp) package device non-conductive material plane 103c separating middle layer 212 from lowest layer 216 of level Lj. Layer 216 may include (e.g., along with other materials that are beyond the edge of length Lp) or be (e.g., within length Lp) package device conductor material (e.g., pure conductor or metal) ground isolation plane 162 vertically separating lower layer 214 of level Lj from upper layer 220 of vertically adjacent level Lk which is below level Lj.

FIG. 2B shows layer 220 that may include (e.g., along with other materials that are beyond the edge of length Lp) or be (e.g., within length Lp) package device non-conductive material plane 103d separating layer 216 from middle layer 222 of level Lk. Layer 222 may include (e.g., along with other materials that are beyond the edge of length Lp) or be (e.g., within length Lp) package device conductor material (e.g., pure conductor or metal) horizontal data signal transmit transmission lines 148 (e.g., a second type of data signal lines or traces, such as TX data signal lines) disposed between package device non-conductive (e.g., dielectric) material portions 103e. Layer 224 may include (e.g., along with other materials that are beyond the edge of length Lp) or be (e.g., within length Lp) package device non-conductive material plane 103f separating middle layer 222 from lowest layer 226 of level Lk. Layer 226 may include (e.g., along with other materials that are beyond the edge of length Lp) or be (e.g., within length Lp) package device conductor material (e.g., pure conductor or metal) ground isolation plane 164 vertically separating lower layer 224 of level Lk from upper layer 230 of vertically adjacent level Ll which is below level Lk.

FIG. 2B shows layer 230 that may include (e.g., along with other materials that are beyond the edge of length Lp) or be (e.g., within length Lp) package device non-conductive material plane 103g separating layer 226 from middle layer 232 of level Ll. Layer 232 may include (e.g., along with other materials that are beyond the edge of length Lp) or be (e.g., within length Lp) package device conductor material (e.g., pure conductor or metal) horizontal data signal receive transmission lines 143 (e.g., a first type of data signal lines or traces, such as RX data signal lines) disposed between package device non-conductive (e.g., dielectric) material portions 103h. Layer 234 may include (e.g., along with other materials that are beyond the edge of length Lp) or be (e.g., within length Lp) package device non-conductive material plane 103i separating middle layer 232 from lowest layer 236 of level Ll. Layer 236 may include (e.g., along with other materials that are beyond the edge of length Lp) or be (e.g., within length Lp) package device conductor material (e.g., pure conductor or metal) ground isolation plane 166 vertically separating lower layer 244 of level Ll from an upper layer of vertically adjacent level of device package 150 which is below level L1.

Figure 3A:
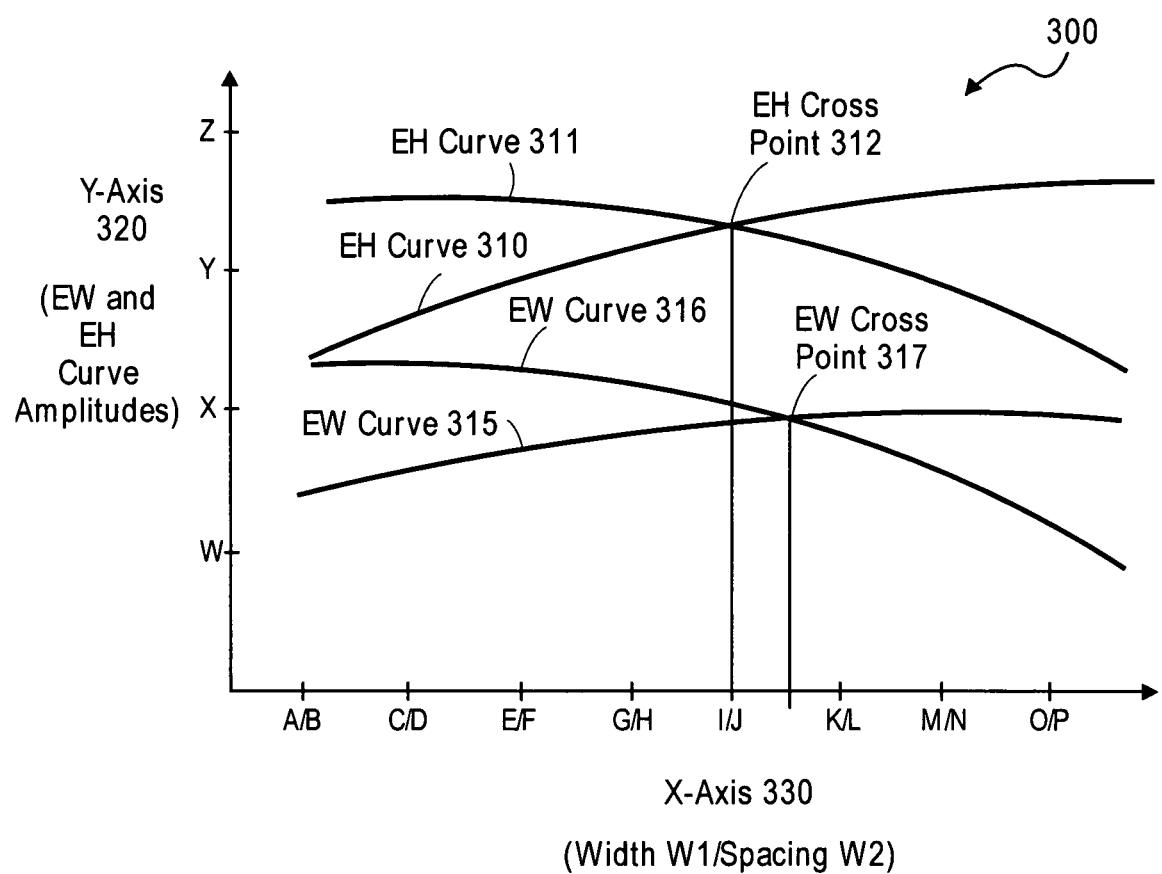
FIG. 3A shows a plot of eye height (EH) curves and eye width (EW) curves of an eye diagram produced by testing one of horizontal data signal transmission signal lines for a range of horizontal data signal transmission line width and spacing between horizontally adjacent signal lines.
Figure 3B:
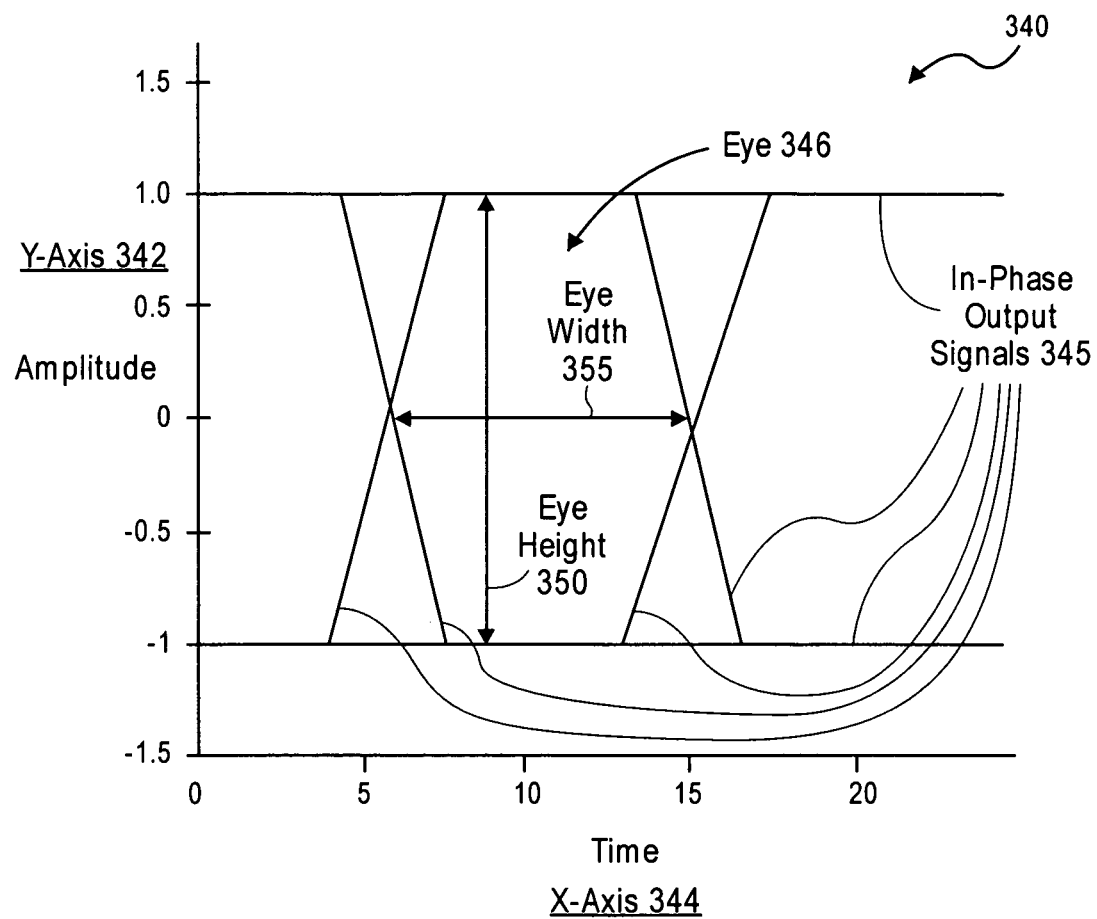
FIG. 3B shows an example of an eye-diagram for providing eye-height curves and eye-width curves of FIG. 3A.

FIG. 3A shows a plot of eye height (EH) curves and eye width (EW) curves of an eye diagram produced by testing one of horizontal data signal transmission signal lines for a range of horizontal data signal transmission line width and spacing between horizontally adjacent signal lines. FIG. 3B shows an example of an eye-diagram for providing eye-height curves and eye-width curves of FIG. 3A. In some cases, the horizontal signal lines 138 and 148 of device 150 are impedance tuned (e.g., see FIG. 3A) to minimize impedance discontinuity and crosstalk between vertically adjacent and horizontally adjacent ones of signal lines 138 or 148 (e.g., a channel) of device 150. This may include performing such tuning to determine or identify a selected target width W1 (and optionally height H3) of one of signal lines 138 or 148 (e.g., given other set or known heights and widths such as noted below) that provides a the best channel performance as showed as the lowest amplitude cross point of eye height (EH) or eye width (EW) curves (e.g., see FIG. 3A) of an eye diagram (e.g., see FIG. 3B) produced by testing one of signal lines 138 or 148. The EH and EW curves (e.g., curves 310-311 and 315-316) may be output signal measure (or computer modeled) at a location of the data signal line 138 or 148 when (e.g., as a result of running) one or more input test data signals are sent through length Lp of the data signal line. This testing may include sending simultaneous test signals, such as step up (e.g., _⌐) and down (e.g., ⌐_) signals, through one type of line (e.g., RX lines 138 or TX lines 148), one level of lines (e.g., layer 212, 222 or 232), or all lines 138 or 148 of device 150 having a given length Lp. This may include performing such tuning to determine or identify isolated horizontal data signal transmission line widths W1 and spacing W2 that are single line impedance tuned (e.g., see FIG. 3A) in the routing segment of device 150 along the channel of signal lines 138 and 148 along length LP.

Impedance tuning of the line may be based on or include as factors: horizontal data signal transmission line width W1, height H3, length Lp; width W2 between the line and a horizontally adjacent horizontal data signal transmission line of device 150; and height H2 between the line and a vertically adjacent grounding plane of device 150. In some cases, once the length Lp, width W2, height H2 and height H3 are known (e.g., predetermined or previously selected based on a specific design of a package device 150), then tuning is performed (e.g., computer simulation, actual "beta" device testing, or other laboratory testing) to determine or identify a range of width W1 that provides the best channel performance as showed as the lowest amplitude cross point of eye height (EH) or eye width (EW) curves of an eye diagram produced by testing one of signal lines 138 or 148.

For example, FIG. 3A shows a plot of eye height (EH) curves 310 and 311; and eye width (EW) curves 315 and 316 of an eye diagram (e.g., see FIG. 3B) produced by testing one of horizontal data signal transmission signal lines 138 or 148 for a range of horizontal data signal transmission line width W1 and spacing W2 between horizontally adjacent signal lines 138 or 148. The testing may include measuring or modeling an output signal in response to an input signals such as step up (e.g., _⌐) and down (e.g., ⌐_]) signals as noted above for FIG. 3A. EH curve 310 may be the EH curve for a first design or use of device 150 that is independent of (e.g., not based on or does not consider) the above noted factors (e.g., horizontal data signal transmission line width W1, height 113, length Lp; width W2 between the line and a horizontally adjacent horizontal data signal transmission line of device 150; and height H2 between the line and a vertically adjacent grounding plane of device 150). EH curve 311 may be the EH curve for a second, different design or use of device 150 that is independent of the above noted factors. EW curve 315 may be the EW curve for the first design or use of device 150 that is independent of the above noted factors. EW curve 316 may be the EW curve for the second, different design or use of device 150 that is independent of the above noted factors.

In some cases, such a design or use may include where the different curves represent different manufacture variation combinations, such as where a low impedance package (e.g., package 110) is connected to high impedance interposer (e.g., interposer 106). In some cases, such a design or use may include where the different curves represent different corner combinations, or possible component variation combinations. In some cases, such a design or use may include where the different curves represent different designs or uses to tune the impedance to maximize the channel performance. In some cases, FIG. 3A shows EH and EW curves from various channels combining possible package and interposer manufacturing corners, (max/typical/min impedance corners from manufacturing variations). In some cases, for example, max Z patch+min Z interposer+max Z package, where Z denotes impedance. In some cases, the common or intersection area below the EH or EW curvers shows the channel EH/EW solution space. In some cases, the optimized impedance value is tied to the the cross point of EH or EW curves which provides the max EH/EW enveloping all the possible channel manufacture variations.

FIG. 3B shows an example of an eye-diagram 342 for providing eye-height curves 310 and 311; and eye width (EW) curves 315 and 316 of FIG. 3A. FIG. 3B shows diagram 340 having vertical y-axis 342 indicating the amplitude of the output signal measured when the test signal is applied to the data signal line. X-axis 344 is a time scale mapping the an in-phase version of output data signals 345 measured when the output signals are time synchronized to be in phase such that the step up and step down test signals would normally form a rectangle or square, but form the central hexagon shaped "eye" 346. Eye 346 has y-axis eye-height 350 and x-axis eye-width 355. Thus, EH curves 310-311 may be examples of eye-height 350 for different designs, and different signal line width W1 and spacing W2 for device 550. Thus, EW curves 315-316 may be examples of eye-width 355 for different designs, and different signal line width W1 and spacing W2 for device 550.

It can be appreciated that an eye diagram (e.g., as shown in FIG. 3B) can be a common indicator of the quality of signals in high-speed digital transmissions (e.g., along data lines 138 and 148). An oscilloscope can be used to generate an eye diagram by overlaying sweeps of different segments of a long data stream driven by a master clock. The triggering edge may be positive or negative, but the displayed pulse that appears after a delay period may go either way; there is no way of knowing beforehand the value of an arbitrary bit. Therefore, when many such transitions have been overlaid, positive and negative pulses are superimposed on each other (e.g., as shown by signals 345 in FIG. 3B). Overlaying many bits produces an eye diagram, so called because the resulting image looks like the opening of an eye (e.g., as shown by eye 346 in FIG. 3B).

In an ideal world, eye diagrams (e.g., as shown by signals 345 in FIG. 3B) would look like rectangular boxes. In reality, communications are imperfect, so the transitions do not line perfectly on top of each other, and an eye-shaped pattern results (e.g., as shown by eye 346 in FIG. 3B). On an oscilloscope, the shape of an eye diagram will depend upon various types of triggering signals (e.g., input test signals), such as clock triggers, divided clock triggers, and pattern triggers. Differences in timing and amplitude from bit to bit cause the eye opening to shrink.

Also, for data links operating at gigahertz transmission speeds (e.g., device 150), variables that can affect the integrity of signals (e.g., the shape, EW and EH of the eye) can include: (e.g., data signal transmission lines 138 and 148) transmission-line effects; impedance mismatches; signal routing; termination schemes; grounding schemes; interference from other signal lines, connectors, and cables; and when signals on adjacent pairs of signal lines toggle, crosstalk among those signals on those lines can interfere with other signals on those lines (e.g., on lines 138 and 148).

In some cases, curves 310-311 and 315-316 are for a selected (e.g., predetermined, desired, constant or certain) length Lp of the horizontal data signal transmission line (e.g., RX line 138 or TX line 148) of ground isolation plane separated data signal package device 150. In some cases, curves 310-311 and 315-316 are also for a selected signal line height H3 and spacing H2 between the signal line and a vertically adjacent ground plane or other signal line.

In some other cases, tuning includes knowing length Lp, width W2 and height H2, then tuning to determine or identify a range of width W1 and height H3 that provides a predetermined or target impedance for the line.

More specifically, FIG. 3A shows graph 300 plotting the amplitude of tuning curves 310-311 and 315-316 along vertical Y-axis 320 for different pairs of width W1 of a signal line (e.g., RX line 138 or TX line 148) and spacing W2 between horizontally adjacent one of the signal lines (e.g., RX or TX lines 138 or 148) along horizontal X-axis 330. Although FIG. 3A shows the amplitude of curves 310-311 and 315-316 on the same graph 300, it can be appreciated that they may be on different graphs having different amplitude scaled Y-axis but the same X-axis 330 (e.g., the curves are all shown vertically scaled on graph 300 (e.g., moved up or down axis 320) to compare the cross points for the curves). Curves 310-311 and 315-316 may be output signal measure (or computer modeled) at a location of the data signal line when (e.g., as a result of running) the one or more test data signals are sent through length Lp of the data signal line (e.g., RX line 138 or TX line 148).

Graph 300 shows cross point 312 of EH curves 310 and 311. I can be appreciated that curves 310 and 311 represent more than two curves, but that those curves have a lowest Y-axis cross point at point 312. Graph 300 shows cross point 317 of EW curves 315 and 316. I can be appreciated that curves 315 and 316 represent more than two curves, but that those curves have a lowest Y-axis cross point at point 317.

FIG. 3A shows EW and EH curve amplitudes along vertical axis 320 having values W, X, Y and Z, such as representing different amplitudes for curves 310-311 or 315-316 (e.g., curves 315-316 or 310-311 may be scaled, respectively, to fit onto the same graph or plot). In some cases, for curves 310-311 values W, X, Y and Z, represent different linearly increasing EH signal amplitude values (e.g., voltage amplitudes of EH derived from a test signal) such as 0.1, 0.15, 0.2 and 0.25 volts. In some cases, for curves 315-316 values W, X, Y and Z, represent different linearly increasing EW signal time values (e.g., time values of EW derived from a test signal) such as 3.0, 3.5, 4.0 and 4.5 E-11 seconds.

FIG. 3A shows pairs of width W1/spacing W2 along horizontal axis 330 having pair values A/B, C/D, E/F, G/H, I/J, K/L, M/N and O/P. In some cases, the aggregate (e.g., addition) of each pair of values (e.g., value A plus value B; or value O plus value P, etc.) represents the same sum or constant (e.g., such as pitch width PW1). In some cases, the sum is between 100 and 200 um. In some cases, it is between 120 and 150 um. In some cases it is between 130 and 140 um. In some cases, pair values A/B represent width W1 between 60 and 80 um, and spacing W2 between 55 and 75 um; pair values O/P represent width W1 between 25 and 45 um, and spacing W2 between 90 and 110 um; and the other pairs are at linear intervals between values A/B, and values O/P. In some cases, pair values A/B represent width/spacing of 70/65 um, pair values C/D represent width/spacing of 65/70 um, pair values E/F represent width/spacing of 60/75 um, pair values G/H represent width/spacing of 55/80 um, pair values I/J represent width/spacing of 50/85 um, pair values K/L represent width/spacing of 45/90 um, pair values M/N represent width/spacing of 40/95 um, and pair values O/P represent width/spacing of 35/100 um.

In some cases, Y-axis 320 represents eye-height or eye-width which are the figures of merit to quantify the channel performance of the tested signal line (e.g., RX line 138 or TX line 148); and X-axis 330 is the combination of signal line width W1/line spacing W2 at constant pitch (line width W1+lines spacing W2=constant pitch PW, such as PW1). According to embodiments, the impedance tuning of horizontal signal line 138 or 148 of device 150 includes (or is) selecting (or "tuning") single horizontal routing signal line (e.g., TX and RX line) impedance, such as to select (or "tune" the TX and RX lines to or at) the combination of signal line width W1/line spacing W2 to an optimized point to achieve the best channel performance as showed as the lowest cross point of EH or EW curves (e.g., such as shown in FIG. 3A).

According to embodiments, the impedance tuning of horizontal signal line 138 or 148 of device 150 includes various possible selections of one or a range of locations on X-Axis 330 selected based on or as a result of a calculation using EH and EW cross point 312 and/or point 317. It can be appreciated that such tuning may include selecting or identifying one or a range of width/spacing W1/W2 along axis 330 for one or both of signal lines 138 and 148, based on or as a result of a calculation using cross point 312 and/or point 317.

In some cases, such impedance tuning includes or is selecting the lowest amplitude cross point 312 of eye height (EH) curves 310-312 or of eye width (EW) curves 315-316 of an eye diagram produced by testing one of signal lines 138 or 148. Here, for example, as shown in FIG. 3A, X-axis 330 location I/J which is under point 312; or a location at midpoint between I/J and K/L which is under point 312 may be chosen for width W1 and spacing W2 for one or both of signal lines 138 and 148. In some cases, one of those locations may be used for both of signal lines 138 and 148. In some cases, a range of width W1 and spacing W2 around either of those locations (e.g., a W1 and W2 tolerance, such as 5 or 10 percent around either location) may be used for both of signal lines 138 and 148. In some cases, a range of width W1 and spacing W2 between those locations (e.g., a W1 and W2 tolerance within that range or any location within that range) may be used for both of signal lines 138 and 148.

According to some embodiments, the impedance tuning includes or is selecting the lowest amplitude cross point 312 and point 317 produced by testing one of signal lines 138 or 148. Here, for example, as shown in FIG. 3A, an X-axis 330 location between (e.g., midpoint between, and average of, or another statistical calculation between) I/J which is under point 312 and a midpoint between I/J and K/L which is under point 312 may be chosen for width W1 and spacing W2 for one or both of signal lines 138 and 148. In some cases, the location between may be used for both of signal lines 138 and 148. In some cases, a range of width W1 and spacing W2 around the location between (e.g., a W1 and W2 tolerance, such as 5 or 10 percent around either location) may be used for both of signal lines 138 and 148. It can be appreciated that various other appropriate locations may be selected based on cross points 312 and 317.

It can be appreciated that such tuning as noted above may be for or represent tuning of a single one of, all of a level of, or all of lines 138 or 148 of device 150. It can be appreciated that such tuning as noted above may be represent by curves different than the convex curves 310-311 and 315-316 shown in FIG. 3A, such as where the selected width W1/spacing W2 along axis 330 is selected to be at the highest point of the different curve along the vertical axis 320.

In some cases, this impedance tuning provides (e.g., by determining or identifying a range of or selected target width W1 and spacing W2 for both of signal lines 138 and 148): (1) the best channel performance for lines 138 and 148 (e.g., having length LP; width W1; width W2 between the line and a horizontally adjacent horizontal data signal transmission line of device 150; and height H2 between the line and a vertically adjacent grounding plane of device 150), (2) electrical isolation of horizontal data signal transmission lines (e.g., signal lines 138 and 148) that are single line impedance tuned in the routing segment of device 150 along the channel (e.g., signal lines 138 or 148 along length LP), and (3) minimized impedance discontinuity and crosstalk between vertically adjacent and horizontally adjacent ones of signal lines 138 or 148 of device 150.

In some cases, the tuning above includes separately tuning lines 138 and 148 of interposer 106, patch 104 and package 110. In some cases, it includes separately tuning lines 138 and 148 of interposer 106 and patch 104 or package 110. In some cases, the tuning above includes tuning lines 138 and 148 of interposer 106 are tuned, but the signal lines of patch 104 and package 110 are not. In some cases, the width W1 and spacing W2 of lines 138 and 148 of interposer 106 are determined by tuning as noted above; and the width W1 and spacing W2 of patch 104 and package 110 are determined based on other factors, or design parameters that do not include the tuning noted above.

Figure 4:
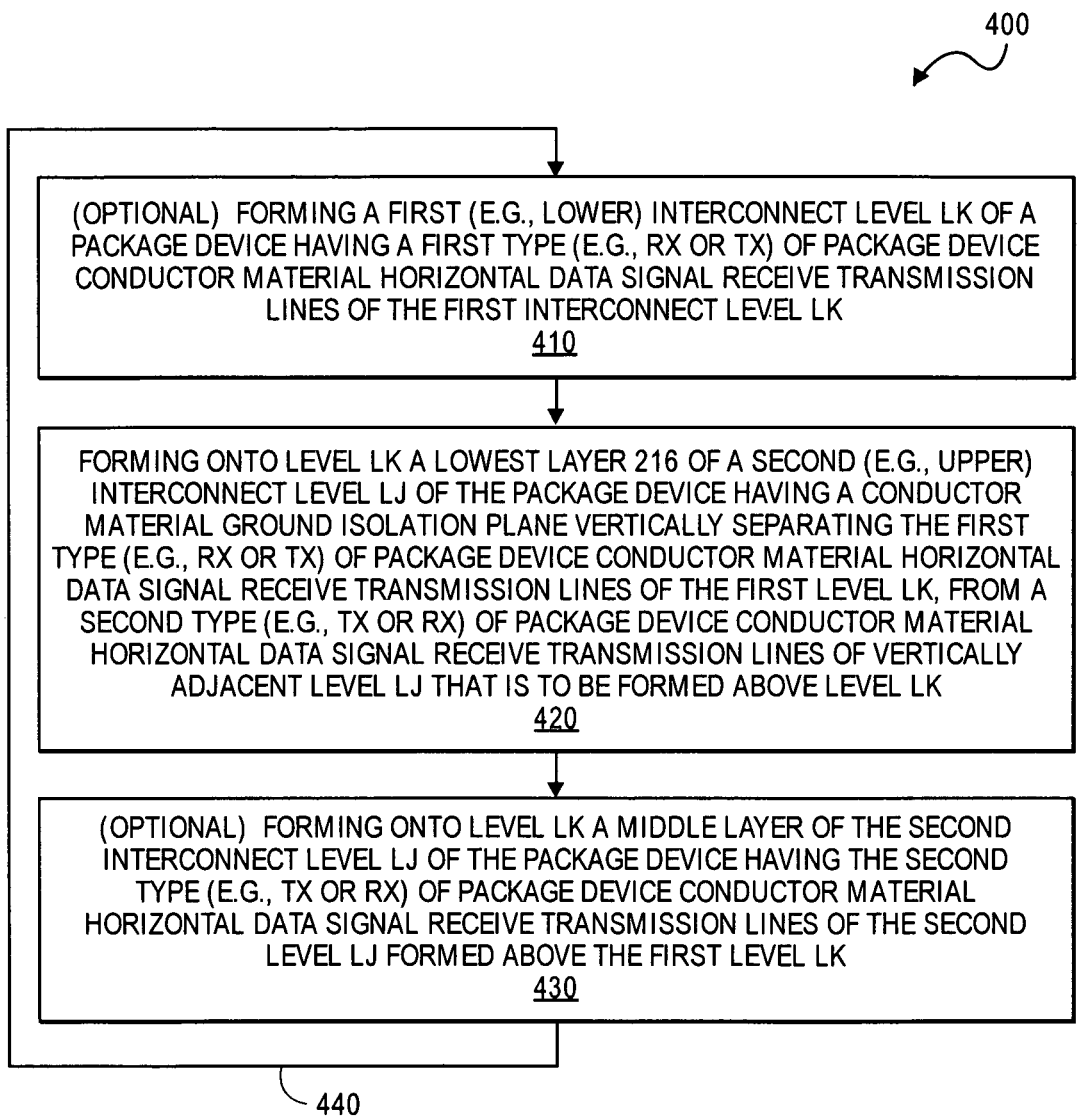
FIG. 4 is a flow chart illustrating a process for forming a ground isolated horizontal data signal transmission line package device, according to embodiments described herein.

FIG. 4 is a flow chart illustrating a process for forming a ground isolated horizontal data signal transmission line package device, according to embodiments described herein. FIG. 4 shows process 400 which may be a process for forming embodiments described herein of package 150 of any of FIGS. 1-3. It may also be a process for forming certain levels or layers of FIGS. 5-12 as noted further below. In some cases, process 400 is a process for forming a ground isolated horizontal data signal transmission line package device that has ground isolation planes separating horizontal data signal receive and transmit layers or levels (e.g., interconnect levels). Each level may have an upper layer of non-conductive (e.g., dielectric) material; a middle layer having conductor material (e.g., pure conductor or metal) data signal lines (e.g., traces) between non-conductive (e.g., dielectric) material portions; a lower layer of non-conductive (e.g., dielectric) material; and a lowest level ground isolation plane of conductor material (e.g., pure conductor or metal).

Process 400 begins at optional block 410 at which a first (e.g., lower) interconnect level Lk of a package device is formed, having a first type (e.g., RX or TX) of package device conductor material horizontal data signal transmission lines (e.g., a first type of data signal lines or traces, such as RX or TX data signal lines disposed between package device non-conductive material portions) of the first interconnect level Lk.

In some cases, block 410 may only include forming middle layer 222 of level Lk with first type of data TX signal 148 lines disposed horizontally between dielectric material portions 103e; and forming upper layer 220 of or having dielectric material onto layer 222. In some cases, block 410 includes first forming lowest layer 226, then layer forming lower layer 224 onto layer 226, then forming middle layer 222 (e.g., as noted above) onto layer 224 (and then forming upper layer 220 onto layer 222 as noted above).

A first example embodiment of block 410 may include (e.g., prior to forming the upper layer 220), forming a mask (e.g., dry film resist (DFR), not shown) over a top surface of a lower layer 224 (e.g., of ajinomoto build up films (ABF)), the mask having (1) first openings over layer 224 in which to form the first type of data TX signal 148 lines of layer 222. In some cases, the first openings may be horizontally open to and in communication with different, second openings in the mask over layer 224 in which data TX signal contacts or data TX signal via contacts will be formed. Some of these cases may include electroless plating of a seed layer of the conductor material over layer 224, prior to forming the masks layer. In this case, block 410 may then include simultaneously forming conductive material (e.g., plating on the exposed seed layer of the openings) to form the data TX signal 148 lines of layer 222 in the first openings (and optionally the data TX signal or data TX signal via contacts in the second openings of layer 222).

In some of these cases, simultaneously forming the conductive material may include forming that conductive material of all of data TX signal 148 lines of layer 222 (and optionally all of the data TX signal or data TX signal via contacts in the second openings of layer 222) during the same process, plating, deposition or growth of that conductive material in the first (and optionally second) openings. In some cases, simultaneously forming the conductive material includes electrolytic plating of conductor material in the first (and optionally second) openings (e.g., on the electroless plating of seed layer).

In some cases of these, after simultaneously forming the conductive material, the mask (e.g., DFR) is removed. This removal may also include removing the seed layer from between the openings. Then dielectric material 103e (e.g., ajinomoto build up films (ABF)) may be deposited where the mask was removed. In some cases, forming the mask includes forming a blanket layer of mask material and etching the blanket layer to form the first (and optionally second) openings.

Next, at block 420 a lowest layer of a second (e.g., upper) level Lj of the package device is formed over or onto (e.g., touching) level Lk; level Lj having a conductor material (e.g., pure conductor or metal) ground isolation plane vertically separating the first type (e.g., RX or TX) of package device conductor material horizontal data signal transmission lines of the first level Lk, from a second type (e.g., TX or RX; the opposite of the first type RX or TX, respectively) of package device conductor material horizontal data signal transmission lines (e.g., a second type of data signal lines or traces, such as TX or RX data signal lines disposed between package device non-conductive material portions) of vertically adjacent level Lj that is to be formed above level Lk.

In some cases, block 420 may only include forming lowest layer 216 of level Lj having a conductor material ground isolation plane 162 onto upper layer 220 of level Lk; and forming middle layer 212 of level Lj with second type of data RX signal 138 lines disposed horizontally between dielectric material portions 103*b*. In some cases, block 420 includes first forming lowest layer 216 onto layer 220 (e.g., as noted above), then forming lower layer 214 onto layer 216, then forming middle layer 212 (e.g., as noted above) onto layer 214; and then forming upper layer 210 of or having dielectric material onto layer 212.

A first example embodiment of block 420 may include (e.g., prior to forming the middle layer 212), forming a mask (e.g., DFR, not shown) over a top surface of upper layer 220 (e.g., of ajinomoto build up film (ABF)) of level Lk, the mask having (1) a first opening over layer 220 in which to form isolation plane 162 of layer 216. In some cases, the first opening may be horizontally open to and in communication with different, second openings in the mask over layer 220 in which ground contacts or ground vial contacts will be formed. Some of these cases may include electroless plating of a seed layer of the conductor material over layer 220, prior to forming the masks layer.

In this case, block 420 may then include simultaneously forming conductive material (e.g., plating on the exposed seed layer of the openings) to form the isolation plane 162 of layer 216 in the first openings (and optionally the ground contacts or ground vial contacts in the second openings of layer 216).

In some of these cases, simultaneously forming the conductive material may include forming that conductive material of all of isolation plane 162 of layer 216 (and optionally all of the ground contacts or ground vial contacts in the second openings of layer 216) during the same process, deposition or growth of that conductive material in the first (and optionally second) openings. In some cases, simultaneously forming the conductive material includes electrolytic plating of conductor material in the first (and optionally second) openings (e.g., on the electroless plating of seed layer).

In some cases of these, after simultaneously forming the conductive material, the mask (e.g., DFR) is removed. This removal may also include removing the seed layer from between the openings. Then dielectric material (e.g., ajinomoto build up film (ABF)) may be deposited where the mask was removed. In some cases, forming the mask includes forming a blanket layer of mask material and etching the blanket layer to form the first (and optionally second) openings.

Next, at optional block 430 a layer of the second interconnect level Lj of the package device is formed over or onto (e.g., touching) level Lk; level Lj having the second type (e.g., TX or RX; the opposite of the first type RX or TX, respectively) of package device conductor material horizontal data signal transmission lines (e.g., a second type of data signal lines or traces, such as TX or RX data signal lines disposed between package device non-conductive material portions) of level Lj formed above level Lk.

In some cases, block 430 may only include forming middle layer 212 of level LJ with second type of data TX signal 148 lines disposed horizontally between dielectric material portions 103*b*; and forming upper layer 210 of or having dielectric material onto layer 212. In some cases, block 430 includes first forming lowest layer 216, then layer forming lower layer 214 onto layer 216, then forming middle layer 212 (e.g., as noted above) onto layer 214 (and then forming upper layer 210 onto layer 212 as noted above).

A first example embodiment of block 430 may include (e.g., prior to forming the upper layer 210), forming a mask (e.g., DFR, not shown) over a top surface of a lower layer 214 (e.g., of ajinomoto build up film (ABF)), the mask having (1) first openings over layer 214 in which to form the second type of data RX signal 138 lines of layer 212. In some cases, the first openings may be horizontally open to and in communication with different, second openings in the mask over layer 214 in which data RX signal contacts or data RX signal via contacts will be formed. Some of these cases may include electroless plating of a seed layer of the conductor material over layer 214, prior to forming the masks layer. In this case, block 430 may then include simultaneously forming conductive material (e.g., plating on the exposed seed layer of the openings) to form the data RX signal 138 lines of layer 212 in the first openings (and optionally the data RX signal or data RX signal via contacts in the second openings of layer 212).

In some of these cases, simultaneously forming the conductive material may include forming that conductive material of all of data RX signal 138 lines of layer 212 (and optionally all of the data RX signal or data RX signal via contacts in the second openings of layer 212) during the same process, deposition or growth of that conductive material in the first (and optionally second) openings. In some cases, simultaneously forming the conductive material includes electrolytic plating of conductor material in the first (and optionally second) openings (e.g., on the electroless plating of seed layer).

In some cases of these, after simultaneously forming the conductive material, the mask (e.g., DFR) is removed. This removal may also include removing the seed layer from between the openings. Then dielectric material 103*b* (e.g., of ajinomoto build up film (ABF)) may be deposited where the mask was removed. In some cases, forming the mask includes forming a blanket layer of mask material and etching the blanket layer to form the first (and optionally second) openings.

In some cases, deposition or growing of conductor material in blocks 410, 420 and 430 may be by processes for forming package devices as noted further below. In some cases, deposition or growing of dielectric material in blocks 410, 420 and 430 may be by processes for forming package devices as noted further below. It can be appreciated that the descriptions herein for blocks 410, 420 and 430 may also include metal hot-press of ABF; pre-cure of ABF; CO2 or UV-YAG laser of ABF; drying of Cu seed layer; and/or flash etching and annealing of to full cure ABF as needed to perform the descriptions herein of blocks 410, 420 and 430.

Next, at return arrow 440, process 400 may continue by returning to a second performance of optional block 410 at which another "first" (e.g., lower) interconnect level of a package device is formed, having a first type (e.g., RX or TX) of package device conductor material horizontal data signal transmission lines. Then, process 400 may proceed with a second performance of block 420, and a second performance of optional block 430. Process 400 may continue this way until a predetermined or sufficient number of levels or return processes are completed to form a desired package device 150. In some cases, it may repeat 3 to 10 times.

Next, in a first example case of process 400, block 410 may only include forming layer 222 as described herein; block 420 may only include forming layer 216 as described herein; and block 430 may only include forming layer 212 as described herein. In a second example case, block 410 may include forming layers 220, 222 and 224 as described herein; block 420 may include forming layer 216 as described herein; and block 430 may include forming layers 210, 212 and 214 as described herein.

In a third example case, block 410 may include forming layer 232 as described herein; block 420 may include forming layer 226 as described herein; and block 430 may include forming layer 222 as described herein. In a fourth example case, block 410 may include forming layers 230, 232 and 234 as described herein; block 420 may include forming layer 226 as described herein; and block 430 may include forming layers 220, 222 and 224 as described herein.

Some cases may include the first and third example cases above (e.g., the third followed by the first example case). Some cases may include the second and fourth example cases above (e.g., the fourth followed by the second example case).

It can be appreciated that although FIGS. 1-4 show and corresponding descriptions describe embodiments for level Lj having. RX signal lines, level Lk having TX signal lines and level Ll having RX signal lines, the figures and descriptions also apply to embodiments where there are two layers of RX signals between planes 160 and 162; two layers of TX signals between planes 162 and 164; and two layers of RX signals between planes 164 and 166; etc.

For example, an embodiment of a process similar to process 400 of FIG. 4 may include performing block 410 twice before proceeding to block 420, thus forming first (e.g., lower) interconnect level Lk of a package device having two layers of the first type (e.g., RX or TX) of package device conductor material horizontal data signal transmission lines (e.g., a first type of data signal lines or traces, such as RX or TX data signal lines disposed between package device non-conductive material portions) of the first interconnect level Lk. Then performing block 420 to form the ground plane. Then performing block 430 twice after block 420, thus forming second (e.g., upper) interconnect level Lj of a package device having two layers of the second type (e.g., TX or RX; the opposite of the first type RX or TX, respectively) of package device conductor material horizontal data signal transmission lines (e.g., a first type of data signal lines or traces, such as TX or RX data signal lines disposed between package device non-conductive material portions) of the second interconnect level Lj.

In some cases, another embodiment of a process similar to process 400 of FIG. 4 may include performing block 410 three or four times; performing block 420; then performing lock 430 three or four times (e.g., the same number of times as block 410).

Some cases, the above two embodiments of a process similar to process 400 of FIG. 4 may include may include the first and third example cases of process 400 above (e.g., the third followed by the first example case). Some cases may include the second and fourth example cases above (e.g., the fourth followed by the second example case).

It can be appreciated that although FIGS. 1-4 show and corresponding descriptions describe embodiments for level Lj having RX signal lines, level Lk having TX signal lines and level Ll having RX signal lines, the figures and descriptions also apply to embodiments where the order can be reversed such as for embodiments where level Lj has TX signal lines, level Lk has RX signal lines and level Ll has TX signal lines.

It can be appreciated that although FIGS. 1-4 show and corresponding descriptions describe embodiments for levels having RX signal lines and TX signal lines, the figures and descriptions also apply to embodiments where other types of information, clock, timing, alternating current (AC) or data signals can be on those signal lines.

In some cases, ground planes 160-166 are each electronically coupled to (e.g., touching, formed with, or directly attached to) ground contacts of device 150, such as ground contacts disposed in the same layer as each ground plane, respectively. They may also each extend as a flat plane disposed between all of the horizontal TX and RX signal contacts of the levels above and blow each ground plane, respectively. For example, in some cases, ground isolation plane 162 extends as a horizontal flat ground isolation plane of conductive material disposed in a vertical position between all of the horizontal RX signal lines of level Lj (including embodiments where there are 1, 2, 3, or 4 layers of RX signal lines) and all of the horizontal TX signal lines of level Lk (including embodiments where there are 1, 2, 3, or 4 layers of RX signal lines); and/or plane 164 extends as a horizontal flat ground isolation plane of conductive material disposed in a vertical position between all of the horizontal TX signal lines of level Lk (including embodiments where there are 1, 2, 3, or 4 layers of RX signal lines) and all of the horizontal RX signal lines of level Ll (including embodiments where there are 1, 2, 3, or 4 layers of RX signal lines).

In some cases, ground planes of package device 150 (e.g., planes 160-166) may each be a ground isolation plane or planar structure across a layer vertically between each horizontal data signal transmission line (e.g., RX or TX) of a one level and all data signal transmission lines of all levels above (or below) that ground plane (e.g., that one level), thus reducing (e.g., by a factor or 2, 3, 5 or 10 times) "data signal transmission line" crosstalk between each of the horizontal data signal transmission lines of the one level (e.g., an "agressor") and all data signal transmission lines of all levels above (or below) that ground plane (e.g., that one level).

For example, in some cases, ground isolation plane 162 extends as a horizontal flat ground isolation plane of conductive material disposed in a vertical position between all of the horizontal RX signal lines of level Lj (including embodiments where there are 1, 2, 3, or 4 layers of RX signal lines) and each of the horizontal TX signal lines of level Lk (including embodiments where there are 1, 2, 3, or 4 layers of TX signal lines), thus reducing "data signal transmission line" crosstalk produced or created by all of the horizontal RX signal lines of level Lj (e.g., "agressors") from reaching each of the horizontal TX signal lines of level Lk. Also, in some cases, ground isolation plane 164 extends as a horizontal flat ground isolation plane of conductive material disposed in a vertical position between all of the horizontal TX signal lines of level Lk (including embodiments where there are 1, 2, 3, or 4 layers of RX signal lines) and each of the horizontal RX signal lines of level Ll (including embodiments where there are 1, 2, 3, or 4 layers of RX signal lines), thus reducing "data signal transmission line" crosstalk produced or created by all of the horizontal TX signal lines of level Lk (e.g., "agressors") from reaching each of the horizontal RX signal lines of level Ll.

For example, by being layers of conductive material electrically grounded (e.g., having a ground signal), each of ground isolation planes 162 and 164 (and optionally 160 and 162) extend as horizontal flat ground isolation planes of conductive material that may absorb, or shield electromagnetic crosstalk signals produced by one data signal transmission line of the vertically adjacent levels above (or below) the plane (e.g., an "agressor"), from reaching each of the data signal transmission line of the one level, due to the amount of grounded conductive material, and location of the conductive grounded material between the two levels. In some cases, each plane absorbing or shielding the electromagnetic crosstalk signals includes reducing electrical crosstalk caused by undesired capacitive, inductive, or conductive coupling of a first data signal type (e.g., RX or TX) received or transmitted through one of the horizontal data signal transmission lines of the vertically adjacent levels (e.g., an "agressor") from reaching (e.g., effecting or being mirrored in) a second data signal type (e.g., TX or RX; the opposite of the first type RX or TX, respectively) received or transmitted through each or any of the horizontal data signal transmission lines of the one level that the ground plane shields (e.g., where the plane is vertically between the vertically adjacent levels and the one level).

Such electrical crosstalk may include interference caused by two data signal types becoming partially superimposed on each other due to electromagnetic (inductive) or electrostatic (capacitive) coupling between the horizontal data signal transmission lines (e.g., conductive material) carrying the signals in vertically adjacent level (e.g., as noted above). Such electrical crosstalk may include where the magnetic field from changing current flow of a first horizontal data signal transmission line (e.g., an "agressor") induces current in a second horizontal data signal transmission line of another vertically adjacent level (e.g., as noted above). In some cases, the cross talk that is reduced is caused or dominated by mutual inductance and capacitance between the two signal lines.

In some embodiments, any or each of ground isolation plane 160, 162, 164 or 166 reduces electrical crosstalk as noted above (1) without increasing the distance or spacing W2 between the horizontal data signal transmission lines, and (2) without re-ordering any horizontal order or sequence of the horizontal data signal transmission lines in a layer or level.

In some cases, a ground isolated horizontal data signal transmission line package device has ground isolation lines surrounding horizontal data signal transmission lines (e.g., conductor material or metal signal traces) that are routed through the package device. The isolation lines may surround (e.g., vertically and horizontally separating) adjacent horizontal data signal receive (RX) and transmit (TX) signal lines of the package device layers or levels (e.g., interconnect levels).

More specifically, each level may have an upper layer of non-conductive (e.g., dielectric) material; and a lower layer having conductor material (e.g., pure conductor or metal) data signal lines (e.g., traces) between (1) horizontally adjacent non-conductive (e.g., dielectric) material portions that are between (2) horizontally adjacent ground isolation lines (e.g., traces) of conductor material (e.g., pure conductor or metal). One non-conductive material portion may be horizontally adjacent, to the outside of each data signal line; and one ground isolation line may be horizontally adjacent, to the outside of each of the non-conductive material portions. In other words, two ground isolation lines horizontally surround two non-conductive material portions that horizontally surround each data signal line. In some cases, the two ground isolation lines are described as horizontally surrounding (e.g., are horizontally to the left and right of) each data signal line.

Each level may also have horizontal (e.g., widthwise) staggered spacing of its lower layer conductor material data signal lines as compared to the ground isolation lines of a vertically adjacent level above it, so that its lower layer conductor material data signal lines are disposed directly below ground isolation lines of the vertically adjacent level above it. Here, the vertically adjacent non-conductive (e.g., dielectric) material upper layer of the level may vertically separate the lower layer conductor material data signal lines of the level from the ground isolation lines of the vertically adjacent level above it. Similarly, each level may also have staggered spacing of its lower layer conductor material data signal lines as compared to the ground isolation lines of a vertically adjacent level below it, so that its lower layer conductor material data signal lines are disposed directly above ground isolation lines of the vertically adjacent level below it. Here, the vertically adjacent non-conductive (e.g., dielectric) material upper layer of the vertically adjacent level below it may vertically separate the lower layer conductor material data signal lines of the level from the ground isolation lines of the vertically adjacent level below it. In other words, two ground isolation lines vertically surround two non-conductive material layers that vertically surround each data signal line. In some cases, the two ground isolation lines are described as vertically surrounding (e.g., are vertically above and below) each data signal line.

The combination of the two ground isolation lines are horizontally surrounding each data signal line; and the two ground isolation lines vertically surrounding each data signal line may be described as four ground isolation lines "coaxially" surrounding each data signal line.

The ground isolation lines horizontally, vertically or coaxially surrounding the horizontal data signal transmission lines may reduce crosstalk between and increase isolation of horizontally and vertically adjacent ones of the horizontal data signal transmission lines. In some cases, the isolation lines reduce crosstalk between vertically adjacent levels (e.g., between TX signal lines and RX signal lines in levels above and below each other), and increase isolation of the horizontal data signal transmission lines that are horizontally adjacent to each other (e.g., in a single vertical level or layer of the device package). This embodiment of a ground isolated horizontal data signal transmission line package device may be described as a ground isolation "coaxial" line separated data signal package device (e.g., see device 550).

Figure 5:
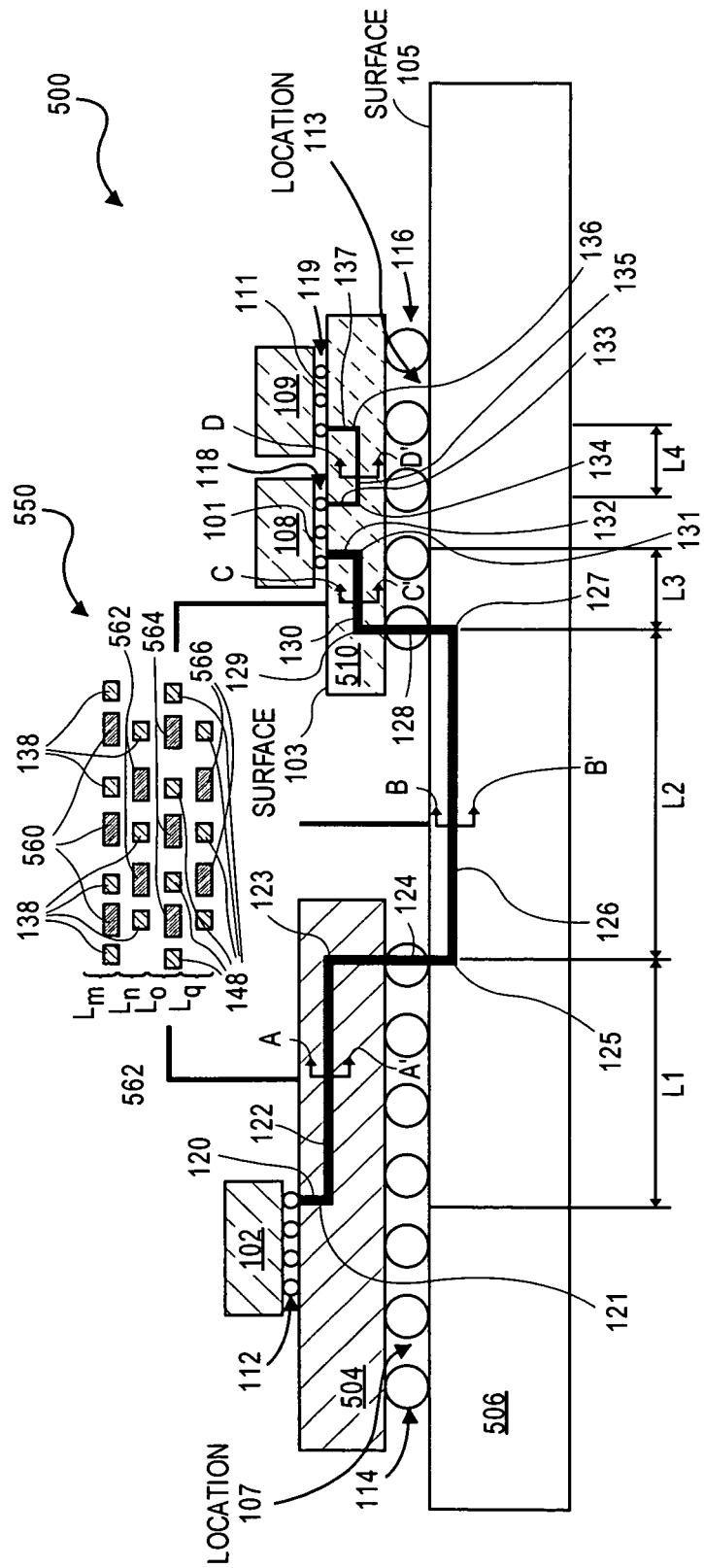
FIG. 5 is schematic cross-sectional side and length views of a computing system, including ground isolated horizontal data signal transmission line package devices.

FIG. 5 is schematic cross-sectional side and length views of a computing system, including ground isolated horizontal data signal transmission line package devices. FIG. 5 shows a schematic cross-sectional side view of computing system 500, including ground isolated horizontal data signal transmission line package devices, such as patch 504, interposer 506 and package 510. In some cases, system 500 has CPU chip 102 mounted on patch 504, which is mounted on interposer 506 at first location 107. It also shows chip 108 mounted on package 510 at first location 101; and chip 109 mounted on chip 510 at second location 111. Package 510 is mounted on interposer 506 at second location 113. For example, a bottom surface of chip 102 is mounted on top surface 105 of patch 504 using solder bumps or bump grid array (BGA) 112. A bottom surface of patch 504 is mounted on top surface 105 of interposer 506 at first location 107 using solder bumps or BGA 114. Also, a bottom surface of chip 108 is mounted on top surface 103 of package 510 at first location 101 using solder bumps or BGA 118. A bottom surface of chip 109 is mounted on surface 103 of package 510 at location 111 using solder bumps or BGA 119. A bottom surface of package 510 is mounted on surface 105 of interposer 506 at second location 113 using solder bumps or BGA 116.

In some cases the only difference between system 500 and 100 is the difference between patch 504 and 104; interposer 506 and 106; and package 510 and 110. In some cases the only difference between patch 504 and 104; interposer 506 and 106; and package 510 and 110 is that patch 504, interposer 506, and package 510 are or have ground isolation "coaxial" line separated data signal package device 550 instead of ground isolation plane separated data signal package device 150. In other words, in some cases the only difference between patch 504 and 104; interposer 506 and 106; and package 510 and 110 is that horizontal data signal transmission lines 122, 126, 130 and 135 are or have ground isolation "coaxial" line separated data signal package device 550 in place of ground isolation plane separated data signal package device 150.

FIG. 5 also show vertical data signal transmission lines 120 originating in chip 102 and extending vertically downward through bumps 112 and into vertical levels of patch 504, such as downward to levels Lm-Lq of patch 504 at first horizontal location 121.

FIG. 5 also shows patch horizontal data signal transmission lines 122 originating at first horizontal location 121 in levels Lm-Lq of patch 504 and extend horizontally through level Lm-Lq along length Ll of levels Lm-Lq to second horizontal location 123 in levels Lm-Lq of patch 504.

Next, FIG. 5 shows vertical data signal transmission lines 124 originating in patch 504 and extending vertically downward through bumps 114 and into vertical levels of interposer 506, such as downward to levels Lm-Lq of interposer 506 at first horizontal location 125.

FIG. 5 also shows interposer horizontal data signal transmission lines 126 originating at first horizontal location 125 in levels Lm-Lq of interposer 506 and extend horizontally through levels Lm-Lq along length L2 of levels Lm-Lq to second horizontal location 127 in levels Lm-Lq of interposer 506.

Next, FIG. 5 shows vertical data signal transmission lines 128 originating in interposer 506, such as originating at levels Lm-Lq at second horizontal location 127 of interposer 506 and extending vertically upward to levels Lm-Lq of package 510 at first horizontal location 129 of package 510.

FIG. 5 also shows package device horizontal data signal transmission lines 130 originating at first horizontal location 125 in levels Lm-Lq of package 510 and extend horizontally through levels Lm-Lq along length L3 of levels Lm-Lq to second horizontal location 131 in levels Lm-Lq of package 510.

Next, FIG. 5 shows vertical data signal transmission line's 132 originating in package 510, such as originating at levels Lm-Lq at second horizontal location 131 of package 510 and extending upward to and terminate at a bottom surface of chip 108.

FIG. 5 also show vertical data signal transmission lines 133 originating in chip 108 and extending vertically downward to levels Lm-Lq of package 510 at first horizontal location 134 of package 510.

FIG. 5 also shows package device horizontal data signal transmission lines 135 originating at third horizontal location 134 in levels Lm-Lq of package 510 and extend horizontally through levels Lm-Lq along length L4 of levels Lm-Lq to second horizontal location 136 in levels Lm-Lq of package 510.

Next, FIG. 5 shows vertical data signal transmission lines 137 originating in package 110, such as originating at levels Lm-Lq at fourth horizontal location 136 of package 510, and extending upward to and terminate at a bottom surface of chip 109.

In some cases the data signal transmission signals of lines 120, 122, 124, 126, 128, 130, 132, 133, 135 and/or 137 are or include data signal transmission signals to an IC chip (e.g., chip 102, 108 or 109), patch 504, interposer 506, package 510, or another device attached to thereto, such as described for FIG. 1.

In some cases, lines 120, 122 and 124 also include power and ground signal lines or traces, such as described for FIG. 1 (not shown) that also extend horizontally from location 121 to location 123 within levels Lm-Lq, or other levels of patch 504.

In some cases, lines 124, 126 and 128 also include power and ground signal lines or traces, such as described for FIG. 1 (not shown) that also extend horizontally from location 125 to location 127 within levels Lm-Lq, or other levels of interposer 506. In some cases the power and ground signals transmitted and received (or existing) on the power and ground signal lines of lines 120, 122, 124 and 126 originate at or are provided by patch 504 or interposer 506, or another device attached to thereto, such as described for FIG. 1.

In some cases, lines 128, 130 and 132 also include power and ground signal lines or traces, such as described for FIG. 1 (not shown) that also extend horizontally from location 129 to location 131 within levels Lm-Lq, or other levels of package 504. In some cases the power and ground signals transmitted and received (or existing) on the power and ground signal lines of lines 128, 130 and 132 originate at or are provided by package 510 or interposer 506, or another device attached to thereto, such as described for FIG. 1.

In some cases, lines 133, 135 and 137 also include power and ground signal lines or traces, such as described for FIG. 1 (not shown) that also extend horizontally from location 134 to location 136 within levels Lm-Lq, or other levels of package 504. In some cases the power and ground signals transmitted and received (or existing) on the power and ground signal lines of lines 133, 135 and 137 originate at or are provided by package 510 or interposer 506, or another device attached to thereto, such as described for FIG. 1.

FIG. 5 also shows a schematic cross-sectional length view of a ground isolated horizontal data signal transmission line package device. In this case, the package device is ground isolation "coaxial" line separated data signal package device 550 (e.g., instead of ground isolation plane separated data signal package device 150 of FIG. 1). Device 550 may be a "package device" representing any of patch 504, interposer 506 or package 510. It can be appreciated that device 550 may represent another package device having horizontal data transmission lines.

In some cases, package device 550 represents horizontal data signal transmission lines 122 of patch 504 through perspective A-A'; horizontal data signal transmission lines 126 of interposer 506 through perspective B-B'; horizontal data signal transmission lines 130 of package 510 through perspective C-C'; or horizontal data signal transmission lines 135 of package 510 through perspective D-D', such as described for package device 150 and patch 104, interposer 106 or package 110.

In some cases, package device 550 has package device ground isolation lines 560 of level Lm vertically separating each of package device horizontal data signal receive transmission lines 138 (e.g., data signal RX 138) of level Ln from each of vertically adjacent (e.g., directly above; or above, parallel to, and having at least part of the width of the two transmission lines overlapping along length Ll) horizontal data signal receive or transmit transmission line (e.g., data signal RX or TX lines) of a level or layer of the package device 550 that is above level Lm. Lines 560 of level Lm also separate each of the horizontal data signal lines of the level above level Lm from each of vertically adjacent (e.g., directly below; or below, parallel to, and having at least part of the width of the two transmission lines overlapping along length Ll) horizontal data signal receive RX transmission lines 138 of level Ln.

In some cases, package device 550 has package device ground isolation lines 560 of level Lm horizontally separating each of package device horizontal data signal receive transmission lines 138 (e.g., data signal RX 138) of level Lm from each of horizontally adjacent (e.g., directly beside such as to the left and right; beside, parallel to, and having at least part of the height of the two transmission lines overlapping along height H3) horizontal data signal receive transmission lines 138 (e.g., data signal RX lines) of level Lm of package device 550.

In some cases, package device 550 has package device ground isolation lines 562 of level Ln vertically separating each of package device horizontal data signal transmit transmission lines 148 (e.g., data signal TX 148) of level Lo from each of vertically adjacent (e.g., directly above; or above, parallel to, and having at least part of the width of the two transmission lines overlapping along length Ll) horizontal data signal receive transmission line (e.g., data signal RX line) of level Lm of the package device 550 that is above level Ln. Lines 562 of level Ln also separate each horizontal data signal RX line 138 of level Lm from each of vertically adjacent (e.g., directly below; or below, parallel to, and having at least part of the width of the two transmission lines overlapping along length Ll) horizontal data signal transmit TX transmission line 148 of level Lo below level Lm.

In some cases, package device 550 has package device ground isolation lines 562 of level Ln horizontally separating each of package device horizontal data signal receive transmission lines 138 (e.g., data signal RX 138) of level Ln from each of horizontally adjacent (e.g., directly beside such as to the left and right; beside, parallel to, and having at least part of the height of the two transmission lines overlapping along height H3) horizontal data signal receive transmission lines 138 (e.g., data signal RX lines) of level Ln of package device 550.

In some cases, package device 550 has package device ground isolation lines 564 of level Lo vertically separating each of package device horizontal data signal transmit transmission lines 148 (e.g., data signal TX 148) of level Lq from each of vertically adjacent (e.g., directly above; or above, parallel to, and having at least part of the width of the two transmission lines overlapping along length Ll) horizontal data signal receive transmission line (e.g., data signal RX line) of level Ln of the package device 550 that is above level Lo. Lines 564 of level Lo also separate each horizontal data signal RX line 138 of level Ln from each of vertically adjacent (e.g., directly below; or below, parallel to, and having at least part of the width of the two transmission lines overlapping along length Ll) horizontal data signal transmit TX transmission line 148 of level Lq below level Ln.

In some cases, package device 550 has package device ground isolation lines 564 of level Lo horizontally separating each of package device horizontal data signal transmit transmission lines 148 (e.g., data signal TX 148) of level Lo from each of horizontally adjacent (e.g., directly beside such as to the left and right; beside, parallel to, and having at least part of the height of the two transmission lines overlapping along height H3) horizontal data signal transmit transmission lines 148 (e.g., data signal TX 148) of level Lo of package device 550.

In some cases, package device 550 has package device ground isolation lines 566 of level Lq vertically separating each of package device horizontal data signal transmit transmission lines 148 (e.g., data signal TX 148) of level Lo from each of vertically adjacent (e.g., directly below; or below, parallel to, and having at least part of the width of the two transmission lines overlapping along length Ll) horizontal data signal transmission line (e.g., data signal TX or RX line) of a level of the package device 550 that is below level Lq. Lines 566 of level Lq also separate each horizontal data signal (e.g., TX or RX) line of a level of device 550 that is below level Lq from each of vertically adjacent (e.g., directly above; or above and having at least part of the width of the two transmission lines overlapping along length Ll) horizontal data signal transmit TX transmission line 148 of level Lo above level Lq.

In some cases, package device 550 has package device ground isolation lines 566 of level Lq horizontally separating each of package device horizontal data signal transmit transmission lines 148 (e.g., data signal TX 148) of level Lq from each of horizontally adjacent (e.g., directly beside such as to the left and right; beside, parallel to, and having at least part of the height of the two transmission lines overlapping along height H3) horizontal data signal transmit transmission lines 148 (e.g., data signal TX 148) of level Lq of package device 550.

Figure 6A:
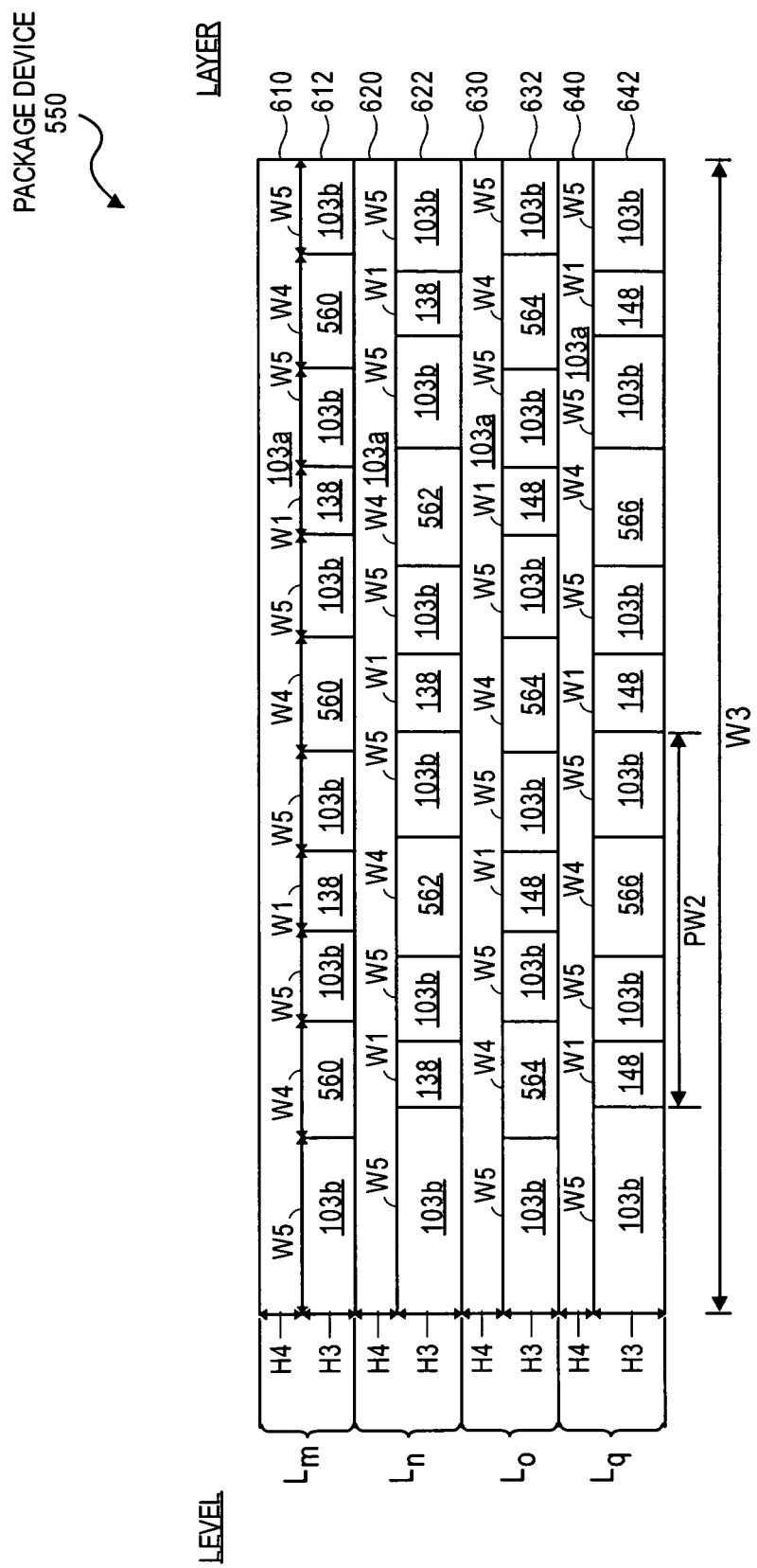
FIG. 6A is an exploded schematic cross-sectional length view of a ground isolated horizontal data signal transmission line package device of FIG. 5 showing ground isolation "coaxial" lines separating horizontal data signal receive and transmit lines.

FIG. 6A is an exploded schematic cross-sectional length view of a ground isolated horizontal data signal transmission line package device of FIG. 5 showing ground isolation "coaxial" lines separating horizontal data signal receive and transmit lines. FIG. 6A shows an exploded schematic cross-sectional length view of ground isolation "coaxial" line separated data signal package device 550, such as a "package device" representing any of patch 504 (e.g., a view through perspective A-A'), interposer 506 (e.g., a view through perspective B-B') or package 510 (e.g., a view through perspective C-C' or D-D"). Package device 550 is shown having interconnect level Lm formed over or onto (e.g., touching) Level Ln which is formed over or onto Level Lo which is formed over or onto (e.g., touching) Level Lq. Each level may have an upper layer of non-conductive (e.g., dielectric) material; a middle layer having conductor material (e.g., pure conductor or metal) data signal lines (e.g., traces) that are coaxially surrounded by ground isolation lines (e.g., conductor material or metal signal traces) that are routed through the package device, parallel to the data signal lines. The isolation lines may surround (e.g., vertically and horizontally separate) vertically and horizontally adjacent horizontal data signal receive (RX) and/or transmit (TX) signal lines of the package device levels (e.g., interconnect levels).

More specifically, FIG. 6A shows package device 550 having Level Lm with upper layer 610 formed over or onto (e.g., touching) middle layer 612 which is formed over or onto upper layer 620 of level Ln.

Upper layer 610 of level Lm may include (e.g., along with other materials that are beyond the edge of width W3) or be (e.g., within width W3) package device non-conductive material plane 103a separating layer 612 of level Lm from a level or layer above layer 610. Layer 210 (e.g., plane 103a) may be formed onto (e.g., touching) or over lower layer 612 of level Lm. Layer 610 has height H4 and width W3. In some cases, height H4 is between 10 and 30 micrometers (um). In some cases, it is between 18 and 21 micrometers. It can be appreciated that height H4 may be an appropriate height of a dielectric material layer between the signal lines and vertically adjacent grounding isolation lines within a package device, that is less than or greater than those mentioned above.

Now, FIG. 6A shows lower layer 612 of level Lm that includes (e.g., along with other materials that are beyond the edge of width W3) or is (e.g., within width W3) package device conductor material (e.g., pure conductor or metal) horizontal data signal receive transmission lines 138 (e.g., a first type of data signal lines or traces, such as RX data signal lines) disposed between (1) horizontally adjacent non-conductive (e.g., dielectric) material portions 103b that are between (2) horizontally adjacent ground isolation lines 560 (e.g., traces) of conductor material (e.g., pure conductor or metal) disposed distal to each of lines 138. Layer 612 separates upper layer 610 from upper layer 620 of level Ln. Layer 612 (e.g., lines 138, portions 103b, and lines 560) may be formed onto (e.g., touching) or over upper layer 620 of level Ln. Layer 212 has height H3 and width W3.

Horizontal data signal receive transmission lines 138 are shown having height H3 and width W1 (a width between horizontally adjacent portions 103b). Non-conductive material portions 103b are shown having height H3 and width W5 (a width between horizontally adjacent lines 138). Horizontal ground isolation lines 560 are shown having height H3 and width W4 (a width between horizontally adjacent portions 103b).

In some cases, width W5 may be between 5 and 50 um. In some cases, width W5 may be between 10 and 40 um. In some cases, width W5 may be between 20 and 35 um. It can be appreciated that width W2 may be an appropriate width of a non-conductive material between a horizontally adjacent data signal receive or transmit line and a horizontal ground isolation line within a package device, that is less than or greater than those mentioned above. In some cases, the size of width of the manufacturing or processing pitch between same edges (or centers of width W1) of horizontally adjacent data signal lines of device 550 (and device 950) is pitch PW2. PW2 may be equal to the sum of widths W1+2×W5+W4.

It can be appreciated that in some cases, height H3 may be an appropriate height of a ground isolation line within a package device, that is less than or greater than those mentioned above. In some cases, height H3 is the same as height H1.

In some cases, width W4 is between 30 and 235 um. In some cases, width W4 is between 50 and 150 micrometers (um). In some cases, it is between 80 and 135 micrometers. It can be appreciated that width W4 may be an appropriate width of a ground isolation line within a package device, that is less than or greater than those mentioned above.

Lines 560 may be directly physically connected to (e.g., formed in contact with), electrically coupled to, or directly attached to (e.g., touching) ground contacts or via contacts in the same layer 612 or level Lm as lines 560. In some cases, lines 560 are or include ground signals from patch 504, interposer 506, package 510, or another device attached to thereto. In some cases, a ground signal transmitted (or existing) on ground lines 560 originates at or is provided by patch 504, interposer 506 or package 510. In some cases, the ground signal may be generated by ground circuits, transistors or other components of or attached (e.g., such as from a motherboard or power supply electrically connected) to patch 504, interposer 506 or package 510. In some cases this ground signal is a zero voltage direct current (DC) grounding signal (e.g., GND). In some cases the ground signal has a voltage of between 0.0 and 0.2 volts. In some cases it is a different but grounding voltage level for providing electrical ground signals through (or within) a package device or IC chip.

Layer 612 may be formed onto (e.g., touching) or over layer 620 of level Ln. Layer 620 has height H4 and width W3 (e.g., as noted above for layer 610).

Level Ln is shown having upper layer 620 formed over or onto (e.g., touching) lower layer 622 which is formed over or onto upper layer 630 of level Lo.

Level Ln may be similar to level Lm except that is has ground isolation lines 562 instead of lines 560; and layer 622 is horizontally offset (e.g., moved) along width W3 from (e.g., with respect to) layer 612 by a width equal to (½×W4 plus W5 plus ½×W2) or equal to a width that causes each of lines 562 of layer 622 to be centered directly under each of lines 138 of layer 612.

Lines 562 may be directly physically connected to (e.g., formed in contact with), electrically coupled to, or directly attached to (e.g., touching) ground contacts or via contacts in the same layer 622 or level Ln as lines 562. In some cases the ground lines 562 are or include ground signals from patch 504, interposer 506, package 510, or another device attached to thereto, as described for lines 560. In some cases this ground signal is a zero voltage direct current (DC) grounding signal (e.g., GND) or has a voltage, as described for lines 560.

Layer 622 may be formed onto (e.g., touching) or over layer 630 of level Lo. Layer 630 has height H4 and width W3 (e.g., as noted above for layer 610).

Level Lo is shown having upper layer 630 formed over or onto (e.g., touching) lower layer 632 which is formed over or onto upper layer 640 of level Lq.

Level Lo may be similar to level Lm except that is has ground isolation lines 564 instead of lines 560; and has data signal transmit TX lines 148 instead of RX lines 138. Layer 632 is horizontally offset (e.g., moved) along width W3 from (e.g., with respect to) layer 622 by a width equal to (½×W4 plus W3 plus ½×W2) or equal to a width that causes each of lines 564 of layer 632 to be centered directly under each of lines 138 of layer 622.

Lines 564 may be directly physically connected to (e.g., formed in contact with), electrically coupled to, or directly attached to (e.g., touching) ground contacts or via contacts in the same layer 632 or level Lo as lines 564. In some cases the ground lines 564 are or include ground signals from patch 504, interposer 506, package 510, or another device attached to thereto, as described for lines 560. In some cases this ground signal is a zero voltage direct current (DC) grounding signal (e.g., GND) or has a voltage, as described for lines 560.

Layer 632 may be formed onto (e.g., touching) or over layer 640 of level Lq. Layer 640 has height H4 and width W3 (e.g., as noted above for layer 610).

Level Lq is shown having upper layer 640 formed over or onto (e.g., touching) lower layer 642 which may be formed over or onto an upper layer of a level below level Lq.

Level Lq may be similar to level Ln except that is has ground isolation lines 566 instead of lines 560; and has data signal transmit TX lines 148 instead of RX lines 138. Layer 642 is horizontally offset (e.g., moved) along width W3 from (e.g., with respect to) layer 632 by a width equal to (½×W4 plus W3 plus ½×W2) or equal to a width that causes each of lines 566 of layer 642 to be centered directly under each of lines 148 of layer 632.

Lines 566 may be directly physically connected to (e.g., formed in contact with), electrically coupled to, or directly attached to (e.g., touching) ground contacts or via contacts in the same layer 642 or level Lq as lines 566. In some cases the ground lines 566 are or include ground signals from patch 504, interposer 506, package 510, or another device attached to thereto, as described for lines 560. In some cases this ground signal is a zero voltage direct current (DC) grounding signal (e.g., GND) or has a voltage, as described for lines 560.

Figure 6B:
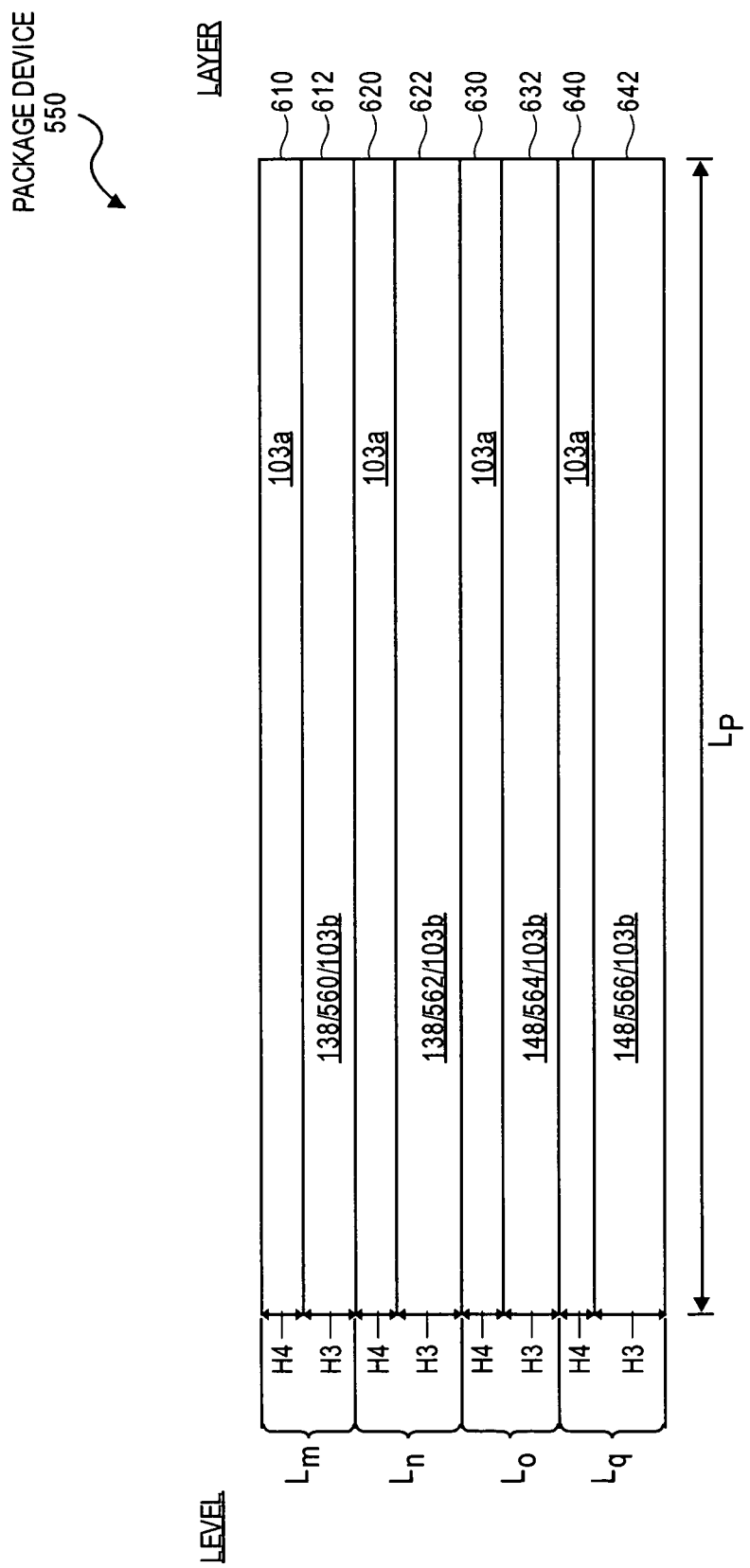
FIG. 6B is an exploded schematic cross-sectional side view of a ground isolated horizontal data signal transmission line package device of FIGS. 5 and 6A showing ground isolation "coaxial" lines separating horizontal data signal receive and transmit lines.

FIG. 6B is an exploded schematic cross-sectional side view of a ground isolated horizontal data signal transmission line package device of FIGS. 5 and 6A showing ground isolation "coaxial" lines separating horizontal data signal receive and transmit lines. FIG. 6B shows an exploded schematic cross-sectional side view of ground isolation "coaxial" line separated data signal package device 550 of FIGS. 5 and 6A such as a "package device" representing any of patch 504 (e.g., along length Ll), interposer 506 (e.g., along length L2) or package 510 (e.g., along length L3 and/or L4). Package device 550 is shown having interconnect levels Lm, Ln, Lo and Lq (e.g., see FIG. 6A).

More specifically, FIG. 6B shows package device 550 having levels Lm-Lq and layers 610-642 along length Lp. Length Lp may represent any of lengths L1, L2; L3 or L4. In some cases, levels Lm-Lq and layers 610-642 in FIG. 6B may include (e.g., along with other materials that are beyond the edge of length Lp) or are (e.g., within length Lp) the same as in the descriptions above for levels Lm-Lq and layers 610-642 in FIGS. 5 and 6A, respectively.

FIG. 6B shows layer 612 that may include (e.g., along with other materials that are beyond the edge of length Lp) or be (e.g., within length Lp) lines 138, lines 560 and portions 103b. For example, layer 612 is shown having "138/560/103b" which may represent lines 138, lines 560, and/or portions 103b extending along length Lp. FIG. 6B shows layer 622 that may include (e.g., along with other materials that are beyond the edge of length Lp) or be (e.g., within length Lp) lines 138, lines 562 and portions 103b. FIG. 6B shows layer 632 that may include (e.g., along with other materials that are beyond the edge of length Lp) or be (e.g., within length Lp) lines 148, lines 564 and portions 103b. FIG. 6B shows layer 642 that may include (e.g., along with other materials that are beyond the edge of length Lp) or be (e.g., within length Lp) lines 148, lines 566 and portions 103b. In some cases, ground isolation lines 560, 562, 564 or 566 are each electronically coupled to (e.g., touching, formed with, or directly attached to) ground contacts of device 550, such as ground contacts disposed in the same layer as each ground plane, respectively.

The embodiments of a ground isolated horizontal data signal transmission line package device 550 may be described as a ground isolation "coaxial" line separated data signal package device 550. The ground isolation lines 560, 562, 564 or 566 horizontally, vertically and coaxially surrounding the horizontal data signal transmission lines 138 RX or 148 TX in each of levels Lm-Lq may (1) reduce crosstalk between vertically adjacent ones of the horizontal data signal transmission lines 138 RX or 148 TX of different levels of levels Lm-Lq; and (2) increase electronic isolation of horizontally adjacent ones of the horizontal data signal transmission lines 138 RX or 148 TX in each of same level of levels Lm-Lq.

More specifically, FIGS. 5-6B show that each of levels Lm-Lq may have an upper layer of non-conductive (e.g., dielectric) material 103a; and a lower layer having conductor material (e.g., pure conductor or metal) data signal lines (e.g., traces) 138 RX or 148 TX between (1) horizontally adjacent non-conductive (e.g., dielectric) material portions 103b that are between (2) horizontally adjacent ground isolation lines 560, 562, 564 or 566 (e.g., traces) of conductor material (e.g., pure conductor or metal). One non-conductive material portion 103b may be horizontally adjacent, to the outside of each data signal 138 RX or 148 TX line (e.g., neighboring, bordering, adjoining, or flanking each data signal line); and one ground isolation line 560, 562, 564 or 566 may be horizontally adjacent, to the outside of each of the non-conductive material portions 103b (e.g., neighboring, bordering, adjoining, or flanking the side of each non-conductive material portion at is disposed away from or distal to the data signal line) in each of levels Lm-Lq. In other words, two ground isolation lines (e.g., two of each of lines 560, 562, 564 or 566) horizontally surround (e.g., are horizontally to the left and right of) two non-conductive material portions 103b that horizontally surround (e.g., are horizontally to the left and right of) each data signal line 138 RX or 148 TX in each of levels Lm-Lq. In some cases, the two ground isolation lines (e.g., two of each of lines 560, 562, 564 or 566) are described as horizontally surrounding (e.g., are horizontally to the left and right of) each data signal line 138 RX or 148 TX in each of levels Lm-Lq.

In some cases, each date signal RX line of level Ln (e.g., layer 622) can be said to be horizontally surrounded by two ground isolation lines 562 of level Ln (e.g., layer 622). Also, in some cases, each date signal TX line of level Lo (e.g., layer 632) can be said to be horizontally surrounded by two ground isolation lines 564 of level Lo (e.g., layer 632).

In some cases, ground lines of package device 550 (e.g., lines 560, 562, 564 and 566) may reduce (e.g., mitigate or decrease) (e.g., by a factor or 2, 3, 5 or 10 times) "data signal transmission line" crosstalk (and optionally may increase electronic isolation by the same factor) between one of the horizontal data signal transmission lines of one level (e.g., an "agressor" of level Lm, Ln, Lo or Lq) and a horizontally adjacent data same type (e.g., RX or TX) signal transmission line of the same level (e.g., that one level Lm, Ln, Lo or Lq).

For example, in some cases, ground isolation lines 560 of package device 550 may decrease (e.g., by a factor or 2, 3, 5 or 10 times) "data signal transmission line" horizontal electronic crosstalk (and optionally may increase electronic isolation by the same factor) caused or produced at one RX data signal transmission line 138 of level Lm (e.g., of layer 612) by two "agressor" horizontal RX data signal transmission lines 138 of the same level Lm (e.g., of layer 612) that are disposed horizontally adjacent to (e.g., to the left and right of) the one RX data signal line. Such a decrease in crosstalk may represent or mitigate this crosstalk to a minimum acceptable crosstalk value between the horizontally adjacent RX or TX data signal lines. This may occur for each of the horizontal RX data signal lines in level Lm. It can be appreciated that ground isolation lines 562 can cause the same horizontal electronic crosstalk decrease (and optionally isolation increase) to occur for each of the RX data signal lines in level Ln. In some cases, ground isolation lines 564 can cause the same horizontal electronic crosstalk decrease (and optionally isolation increase) to occur for each of the TX data signal lines in level Lo. In some cases, ground isolation lines 566 can cause the same horizontal electronic crosstalk decrease (and optionally isolation increase) to occur for each of the TX data signal lines in level Lq.

Each level of levels Lo-Lq of FIGS. 5-6B may also have staggered horizontal (e.g., lateral) spacing of its lower layer conductor material data signal lines 138 RX or 148 TX as compared to ground isolation lines 560, 562, 564 or 566 of a vertically adjacent level above it, so that its lower layer conductor material data signal lines 138 RX or 148 TX are disposed directly below ground isolation lines 560, 562, 564 or 566 of the vertically adjacent level above it. Here, the vertically adjacent non-conductive (e.g., dielectric) material layer 103a of the upper layer of each level Lo-Lq may separate (e.g., be disposed vertically between) the lower layer conductor material data signal lines 138 RX or 148 TX of the level from the ground isolation lines 560, 562, 564 or 566 of the vertically adjacent level above it. Similarly, each level Lo-Lq may also have staggered horizontal spacing of its lower layer conductor material data signal lines 138 RX or 148 TX as compared to ground isolation lines 560, 562, 564 or 566 of a vertically adjacent level below it, so that its lower layer conductor material data signal lines 138 RX or 148 TX are disposed directly above ground isolation lines 560, 562, 564 or 566 of the vertically adjacent level below it. Here, the vertically adjacent non-conductive (e.g., dielectric) material layer 103a of the vertically adjacent level below it may separate (e.g., be disposed vertically between) the lower layer conductor material data signal lines 138 RX or 148 TX of the level from the ground isolation lines 560, 562, 564 or 566 of the vertically adjacent level below it. In other words, two ground isolation lines (e.g., a pair of 560 and 564; or 562 and 566) vertically surround (e.g., are vertically to the top and bottom of) two non-conductive material layers 103a that vertically surround (e.g., are vertically to the top and bottom of) each data signal line RX or 148 TX. In some cases, the two ground isolation lines (e.g., a pair of 560 and 564; or 562 and 566) are described as vertically surrounding (e.g., are vertically above and below) each data signal line 138 RX or 148 TX in each of levels Lm-Lq.

In some cases, each date signal RX line of level Ln (e.g., layer 622) can be said to be vertically surrounded by ground isolation line 560 of level Lm (e.g., layer 612) and line 564 of level Lo (e.g., layer 632). Also, in some cases, each date signal TX line of level Lo (e.g., layer 632) can be said to be vertically surrounded by ground isolation line 562 of level Ln (e.g., layer 622) and line 566 of level Lq (e.g., layer 642).

In some cases, ground lines of package device 550 (e.g., lilies 560, 562, 564 and 566) may reduce (e.g., mitigate or decrease) (e.g., by a factor or 2, 3, 5 or 10 times) "data signal transmission line" crosstalk (and optionally may increase isolation) between one of the horizontal data signal transmission lines of one level (e.g., an "agressor" of level Lm, Ln, Lo or Lq) and a vertically adjacent data signal transmission line of a level two levels above or below the one transmission line (e.g., two levels above or below the agressor level Lm, Ln, Lo or Lq).

For example, in some cases, each ground isolation line 562 of package device 550 may reduce (e.g., by a factor or 2, 3, 5 or 10 times) "data signal transmission line" vertical crosstalk (and optionally may increase isolation) produced or created by an "agressor" horizontal RX data signal transmission line 138 of level Lm (e.g., of layer 612) from reaching a vertically adjacent TX data signal transmission line of level Lo (e.g., of layer 632) that is disposed two levels below the "agressor" RX line of level Lm (e.g., of layer 612), such as due to line 562 being disposed vertially between the signal transmission lines of levels Lm and Lo. This may occur for each of the horizontal TX data signal lines in level Lo, such as where each of ground lines 562 reduces horizontal crosstalk (and optionally may increase isolation) produced or created by each "agressor" horizontal RX data signal transmission line 138 of level Lm from reaching each vertically adjacent TX data signal transmission line of level Lo that is disposed two levels below the "agressor" RX line of level Lm. It is considered that lines 562 cause the same reduction in vertical crosstalk caused by the TX lines of level Lo from reaching the a vertically adjacent RX lines of level Lm.

Similarly, in some cases, each ground isolation line 564 of package device 550 may reduce (e.g., by a factor or 2, 3, 5 or 10 times) "data signal transmission line" vertical crosstalk (and optionally may increase isolation) produced or created by an "agressor" horizontal TX data signal transmission line 148 of level Lq (e.g., of layer 642) from reaching a vertically adjacent RX data signal transmission line of level Ln (e.g., of layer 622) that is disposed two levels above the "agressor" TX line of level Lq (e.g., of layer 642), such as due to line 564 being disposed vertially between the signal transmission lines of levels Lq and Ln. This may occur for each of the horizontal. RX data signal lines in level Ln, such as where each of ground lines 564 reduces horizontal crosstalk (and optionally may increase isolation) produced or created by each "agressor" horizontal TX data signal transmission line 148 of level Lq from reaching each vertically adjacent RX data signal transmission line of level Ln that is disposed two levels above the "agressor" TX line of level Lq. It is considered that lines 564 cause the same reduction in vertical crosstalk caused by the RX lines of level Ln from reaching the a vertically adjacent TX lines of level Lq.

It can be appreciated that ground isolation lines 560 can cause the same vertical crosstalk reduction (and optionally isolation increase) to occur for each of the RX data signal lines in level Ln as compared to a level 2 levels above level Ln. In some cases, ground isolation lines 566 can cause the same vertical crosstalk reduction (and optionally isolation increase) to occur for each of the TX data signal lines in level Lo as compared to a level 2 levels below level Lo.

For example, by being lines of conductive material electrically grounded (e.g., having a ground signal), each of ground isolation lines 560-566 may absorb, or shield electromagnetic crosstalk signals produced by (or increasing electronic isolation from) one data signal transmission line of the vertically adjacent levels two levels above (or below) the lines, from reaching each of the data signal transmission line of the one level, due to the amount of grounded conductive material, and location of the conductive grounded material between the two levels. This may include reducing electrical crosstalk caused by undesired capacitive, inductive, or conductive coupling of a first data signal type (e.g., RX or TX) received or transmitted through one of the horizontal data signal transmission lines of the vertically adjacent levels (e.g., an "agressor") from reaching (e.g., effecting or being mirrored in) a second data signal type (e.g., TX or RX; the opposite of the first type RX or TX, respectively) received or transmitted through the horizontal data signal transmission lines of the one level that the ground lines shields.

The combination of the two ground isolation lines (e.g., two of each of lines 560, 562, 564 or 566) horizontally surrounding each data signal line 138 RX or 148 TX in each of levels Lm-Lq; and the two ground isolation lines (e.g., a pair of 560 and 564; or 562 and 566) vertically surrounding each data signal line 138 RX or 148 TX in each of levels Lm-Lq may be described as four ground isolation lines "coaxially" surrounding each data signal line 138 RX or 148 TX in each of levels Lm-Lq. In some cases, each date signal RX line of level Ln (e.g., layer 622) can be said to be coaxially surrounded by being (1) horizontally surrounded by two ground isolation lines 562 of level Ln (e.g., layer 622), and (2) vertically surrounded by one of ground isolation lines 560 of level Lm (e.g., layer 612) and one of lines 564 of level Lo (e.g., layer 632). Also, in some cases, each date signal TX line of level Lo (e.g., layer 632) can be said to be coaxially surrounded by being (1) horizontally surrounded by two ground isolation lines 564 of level Lo (e.g., layer 632), and (2) vertically surrounded by one of ground isolation lines 562 of level Ln (e.g., layer 622) and one of lines 566 of level Lq (e.g., layer 642).

In some cases, the four ground isolation lines "coaxially" surrounding each horizontal data signal line 138 RX or 148 TX in each of levels Lm-Lq provides or causes (1) the two ground isolation lines (e.g., two of each of lines 560, 562, 564 or 566) horizontally surrounding each data signal line 138 RX or 148 TX in each of levels Lm-Lq to decrease (e.g., by a factor or 2, 3, 5 or 10 times) "data signal transmission line" electronic crosstalk (and optionally may increase electronic isolation) between each of the horizontal data signal transmission lines of one level (e.g., level Lm, Ln, Lo or Lq) and a horizontally adjacent data same type (e.g., RX or TX) signal transmission line of the same level (e.g., that one level Lm, Ln, Lo or Lq); and (2) the two ground isolation lines (e.g., a pair of 560 and 564; or 562 and 566) vertically surrounding each data signal line 138 RX or 148 TX in each of levels Lm-Lq to decrease (e.g., by a factor or 2, 3, 5 or 10 times) "data signal transmission line" crosstalk (and optionally may increase isolation) between one of the horizontal data signal transmission lines of one level (e.g., an "agressor" of level Lm, Ln, Lo or Lq) and a vertically adjacent data signal transmission line of a level two levels above or below the one transmission line (e.g., two levels above or below the agressor level Lm, Ln, Lo or Lq). In some embodiments, ground isolation lines 560-566 reduce electrical crosstalk and increase electrical isolation as noted above without re-ordering any horizontal order or sequence of the horizontal data signal transmission lines in a layer or level.

It is noted that there are four isolation lines surrounding each date signal RX line of level Ln (e.g., layer 622) in a "diamond" shape but no diagonally adjacent ground isolation line for that RX line. This may be due to diagonal spacing (e.g., by a predetermined, tuning determined, selected or otherwise designed distance) the RX and TX lines of the different levels sufficiently so that crosstalk is reduced enough (and optionally electronic isolation is increased enough) for the data signal lines to operate at the speeds and other characteristics as noted herein.

Figure 7:
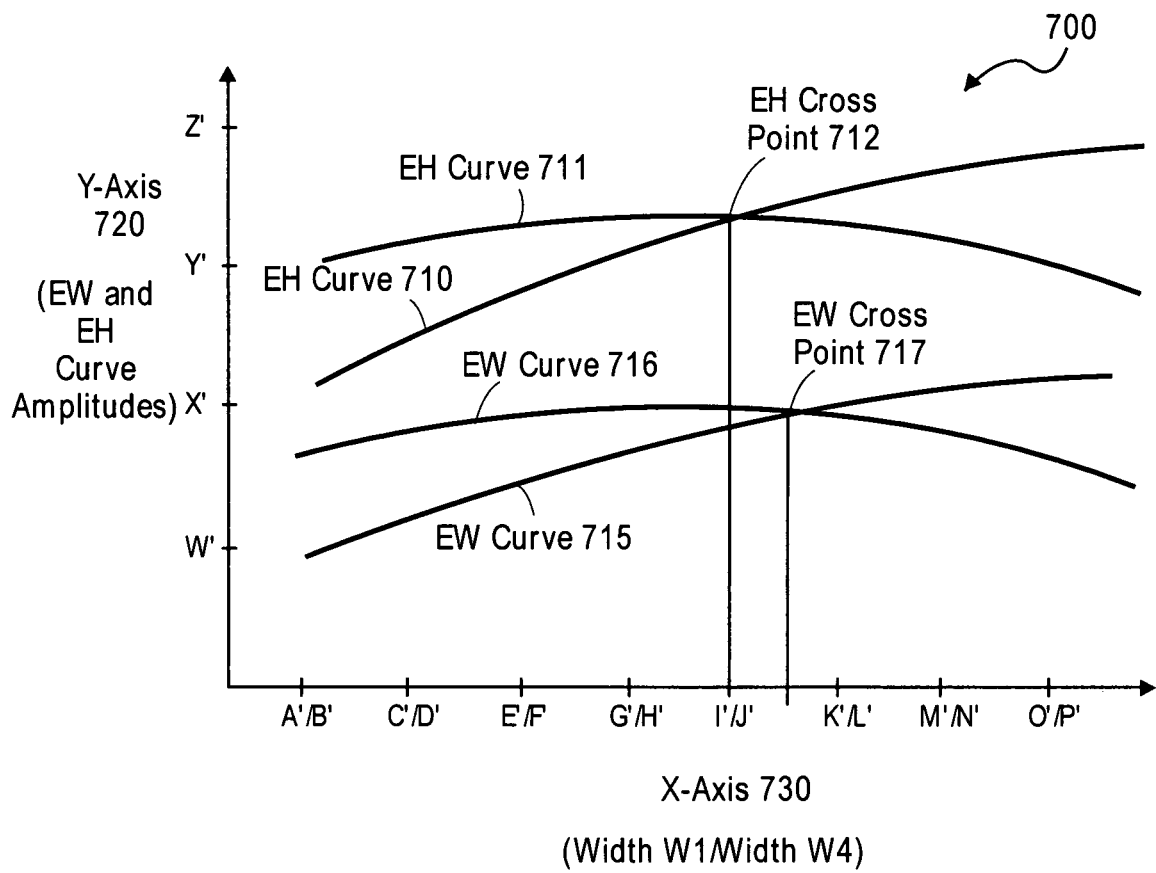
FIG. 7 shows a plot of eye height (EH) curves and eye width (EW) curves of an eye diagram produced by testing one of horizontal data signal transmission signal lines for a range of horizontal data signal transmission line width and ground line width, such as where spacing is constant between horizontally adjacent signal lines and ground lines.

FIG. 7 shows a plot of eye height (EH) curves and eye width (EW) curves of an eye diagram produced by testing one of horizontal data signal transmission signal lines for a range of horizontal data signal transmission line width and ground line width, such as where spacing is constant between horizontally adjacent signal lines and ground lines. In some cases, the horizontal signal lines 138 and 148; and the ground lines (e.g., 560, 562, 564 and 566) of device 550 are impedance tuned (e.g., see FIG. 7) to minimize impedance discontinuity and crosstalk between vertically adjacent and horizontally adjacent ones of signal lines 138 or 148 (e.g., a channel) of device 550. This may include performing such tuning to determine or identify: (1) a selected target width W1 (and optionally height H3) of one of signal lines 138 or 148 (e.g., given other set or known heights and widths such as noted below); and (2) a selected target width W4 (and optionally height H3) of one of the ground lines (e.g., 560, 562, 564 or 566) (e.g., given other set or known heights and widths such as noted below) that provides a the best channel performance as showed as the lowest amplitude cross point of eye height (EH) or eye width (EW) curves (e.g., see FIG. 7) of an eye diagram (e.g., see FIG. 3B) produced by testing one of signal lines 138 or 148. The EH and EW curves (e.g., curves 710-711 and 715-716) may be output signal measure (or computer modeled) at a location of the data signal line 138 or 148 when (e.g., as a result of running) one or more input test data signals are sent through length Lp of the data signal line such as described for FIGS. 3A-B to determine or identify isolated horizontal data signal transmission line widths W1 and ground line width W4 (optionally, and spacing W5) that are single line impedance tuned (e.g., see FIG. 7) in the routing segment of device 550 along the channel of signal lines 138 and 148 along length LP.

Impedance tuning of the signal line may be based on or include as factors: horizontal data signal transmission line width W1, height H3, length Lp; horizontal ground isolation line width W4, height 113, length Lp; width W5 between the isolation lines and horizontally adjacent horizontal data signal transmission lines of device 550; and height H4 between a signal line and a vertically adjacent grounding line of device 550. In some cases, once the length Lp, width W5, height 114 and height H3 are known (e.g., predetermined or previously selected based on a specific design of a package device 550), then tuning is performed (e.g., computer simulation, actual "beta" device testing, or other laboratory testing) to determine or identify a ranges of width W1 and W4 that provide the best channel performance as showed as the lowest amplitude cross point of eye height (EH) or eye width (EW) curves of an eye diagram produced by testing one of signal lines 138 or 148.

For example, FIG. 7 shows a plot of eye height (EH) curves 710 and 711; and eye width (EW) curves 715 and 716 of an eye diagram (e.g., see FIG. 3B) produced by testing one of horizontal data signal transmission signal lines 138 or 148 for a range of horizontal data signal transmission line width W1 and ground line width W4, such as where spacing W2 is constant between horizontally adjacent signal lines (e.g., lines 138 or 148) and ground lines (e.g., lines 560, 562, 564 or 566). The testing may include measuring or modeling an output signal in response to an input signals such as step up (e.g., r) and down (e.g., 1) signals as noted above for FIG. 3A. EH curve 710 may be the EH curve for a first design or use of device 550 that is independent of (e.g., not based on or does not consider) the above noted factors (e.g., horizontal data signal transmission line width W1, ground line width W4, height H3, length Lp; width W5 between the signal line and a horizontally adjacent ground lines of device 150; and height H4 between the signal line and a vertically adjacent grounding line of device 150). EH curve 711 may be the EH curve for a second, different design or use of device 550 that, is independent of the above noted factors. EW curve 715 may be the EW curve for the first design or use of device 150 that is independent of the above noted factors. EW curve 716 may be the EW curve for the second, different design or use of device 550 that is independent of the above noted factors.

In some cases, such a design or use may include where the different curves represent different manufacture variation combinations, such as where a low impedance package (e.g., package 510) is connected to high impedance interposer (e.g., interposer 506). In some cases, such a design or use may include where the different curves represent different corner combinations, or possible component variation combinations. In some cases, such a design or use may include where the different curves represent different designs or uses to tune the impedance to maximize the channel performance. In some cases, FIG. 7A shows EH and EW curves from various channels combining possible package and interposer manufacturing corners, (max/typical/min impedance corners from manufacturing variations). In some cases, for example, max Z patch+min Z interposer+max Z package, where Z denotes impedance. In some cases, the common or intersection area below the EH or EW curvers shows the channel EH/EW solution space. In some cases, the optimized impedance value is tied to the the cross point of EH or EW curves which provides the max EH/EW enveloping all the possible channel manufacture variations.

As described for EH curves 310-311 of FIGS. 3A-B, EH curves 710-711 may be examples of an eye-height for different designs, and different signal line width W1 and ground line width W4 (e.g., where spacing W2 is constant) for device 550. Also, as described for EW curves 315-316 of FIGS. 3A-B, EW curves 715-716 may be examples of an eye-width for the different designs, and the different signal line width W1 and ground line width W4 (e.g., where spacing W2 is constant) for device 550.

In some cases, curves 710-711 and 715-716 are for a selected (e.g., predetermined, desired, constant or certain) length Lp of the horizontal data signal transmission line (e.g., RX line 138 or TX line 148) and ground isolation lines of package device 550. In some cases, curves 710-711 and 715-716 are also for a selected signal line and ground line height H3 and spacing H4 between the signal line and a vertically adjacent ground line.

In some other cases, tuning includes knowing length Lp, width W5 and height H4, then tuning to determine or identify a range of width W1, width W4 and height H3 that provides a predetermined or target impedance for the line.

More specifically, FIG. 7 shows graph 700 plotting the amplitude of tuning curves 710-711 and 715-716 along vertical Y-axis 720 for different pairs of width W1 of a signal line (e.g., RX line 138 or TX line 148) and width W4 of ground lines (e.g., where spacing W5 is constant value or distance between horizontally adjacent one of the signal lines (e.g., RX or TX lines 138 or 148) and ground lines (e.g., lines 560, 562, 564 or 566) along horizontal X-axis 730. Although FIG. 7 shows the amplitude of curves 710-711 and 715-716 on the same graph 700, it can be appreciated that they may be on different graphs having different amplitude scaled Y-axis but the same X-axis 730 (e.g., the curves are all shown vertically scaled on graph 700 (e.g., moved up or down axis 720) to compare the cross points for the curves). Curves 710-711 and 715-716 may be output signal measure (or computer modeled) at a location of the data signal line when (e.g., as a result of running) the one or more test data signals are sent through length Lp of the data signal line (e.g., RX line 138 or TX line 148).

Graph 700 shows cross point 712 of EH curves 710 and 711. I can be appreciated that curves 710 and 711 represent more than two curves, but that those curves have a lowest Y-axis cross point at point 712. Graph 700 shows cross point 717 of EW curves 715 and 716. I can be appreciated that curves 715 and 716 represent more than two curves, but that those curves have a lowest Y-axis cross point at point 717.

FIG. 7 shows EW and EH curve amplitudes along vertical axis 720 having values, W', X', Y' and Z', such as representing different amplitudes for curves 710-711 or 715-716 (e.g., curves 715-716 or 710-711 may be scaled, respectively, to fit onto the same graph or plot). In some cases, for curves 710-711 values W', X', Y' and Z', represent different linearly increasing EH signal amplitude values (e.g., voltage amplitudes of EH derived from a test signal) such as 0.15, 0.2, 0.25 and 0.3 volts. In some cases, for curves 715-716 values W', X', Y' and Z', represent different linearly increasing EW signal time values (e.g., time values of EW derived from a test signal) such as 3.5, 4.0. 4.5 and 5.0 E-11 seconds.

FIG. 7 shows pairs of width W1/width W4 along horizontal axis 730 having pair values A'/B', C'/D', E'/F', G'/H', K'/L', M'/N' and O'/P'. In some cases, the aggregate (e.g., addition) of each pair of values (e.g., value A' plus value B'; or value O' plus value P', etc.) represents the same sum or a first constant; and that first constant plus two times the spacing width W5 is a second constant (e.g., such as pitch width PW2). In some cases, the signal line width W1 and ground line width W4 vary in an inversely proportional manner to add up to the first constant, such as where if W1 increases by a value (e.g., W1+W'), W4 decreases by that value (e.g., W4-W'), and vice versa. In some cases, the signal line width W1 and ground line width W4 may be described as being inversely proportional. In some cases, (1) the second constant is signal line to signal lined pitch width PW2; and (2) the signal line width W1 and ground line width W4 vary in an inversely proportional manner so that the addition of W1+W4+2×W5=PW2 (e.g., the second constant).

In some cases, PW2 is between 100 and 200 um. In some cases, it is between 120 and 150 um. In some cases it is between 130 and 140 um. In some cases, pair values A'/B' represent width W1 between 60 and 80 um, and width W4 between 55 and 75 um; pair values O'/P' represent width W1 between 25 and 45 um, and width W4 between 90 and 110 um; and the other pairs are at linear intervals between values A'/B' and values O'/P'. In some cases, pair values A'/B' represent width W1/width W4 of 70/65 um, pair values C'/D' represent width W1/width W4 of 65/70 um, pair values E'/F' represent width W1/width W4 of 60/75 um, pair values G'/H' represent width W1/width W4 of 55/80 um, pair values I'/J' represent width W1/width W4 of 50/85 um, pair values K'/L' represent width W1/width W4 of 45/90 um, pair values M'/N' represent width W1/width W4 of 40/95 um, and pair values O'/P' represent width W1/width W4 of 35/100 um.

In some cases, Y-axis 720 represents eye-height or eye-width which are the figures of merit to quantify the channel performance of the tested signal line (e.g., RX line 138 or TX line 148); and X-axis 730 is the combination of signal line width W1/width W4 (with constant spacing W5) at constant pitch (line width W1+width W4+2×W5=constant pitch PW, such as PW2). According to embodiments, the impedance tuning of horizontal signal line 138 or 148 of device 550 includes (or is) selecting (or "tuning") single horizontal routing signal line (e.g., TX and RX line) impedance, such as to select (or "tune" the TX and RX lines to or at) the combination of signal line width W1/width W4 to an optimized point to achieve the best channel performance as showed as the lowest cross point of EH or EW curves (e.g., such as shown in FIG. 7).

According to embodiments, the impedance tuning of horizontal signal line 138 or 148 of device 550 includes various possible selections of one or a range of locations on X-Axis 730 selected based on or as a result of a calculation using EH and EW cross point 712 and/or point 717. It can be appreciated that such tuning may include selecting or identifying one or a range of width W1/width W4 along axis 730 for one or both of (1) signal lines 138 and ground line pairs 560/562, or (2) signal lines 148 and ground line pairs 564/566, based on or as a result of a calculation using cross point 712 and/or point 717.

In some cases, such impedance tuning includes or is selecting the lowest amplitude cross point 712 of eye height (EH) curves 710-712 or of eye width (EW) curves 715-716 of an eye diagram produced by testing one of signal lines 138 or 148. Here, for example, as shown in FIG. 7, X-axis 730 location I'/J' which is under point 712; or a location at midpoint between I'/J' and K'/L' which is under point 712 may be chosen for width W1 and width W4 for one or both of (1) signal lines 138 and ground line pairs 560/562, or (2) signal lines 148 and ground line pairs 564/566. In some cases, one of those locations may be used for both of (1) signal lines 138 and ground line pairs 560/562, and (2) signal lines 148 and ground line pairs 564/566. In some cases, a range of width W1 and width W4 around either of those locations (e.g., a W1 and W4 tolerance, such as 5 or 10 percent around either location) may be used for both of (1) signal lines 138 and ground line pairs 560/562, and (2) signal lines 148 and ground line pairs 564/566. In some cases, a range of width W1 and width W4 between those locations (e.g., a W1 and W4 tolerance, within that range or any location within that range) may be used for both of (1) signal lines 138 and ground line pairs 560/562, and (2) signal lines 148 and ground line pairs 564/566.

According to some embodiments, the impedance tuning includes or is selecting the lowest amplitude cross point 712 and point 717 produced by testing one of signal lines 138 or 148. Here, for example, as shown in FIG. 7, an X-axis 730 location between (e.g., midpoint between, and average of, or another statistical calculation between) I'/J' which is under point 712 and a midpoint between I'/J' and K'/L' which is under point 712 may be chosen for width W1 and width W4 for one or both of (1) signal lines 138 and ground line pairs 560/562, or (2) signal lines 148 and ground line pairs 564/566. In some cases, the location between may be used for both of (1) signal lines 138 and ground line pairs 560/562, and (2) signal lines 148 and ground line pairs 564/566. In some cases, a range of width W1 and width W4 around the location between (e.g., a W1 and W4 tolerance, such as 5 or 10 percent around either location) may be used for both of (1) signal lines 138 and ground line pairs 560/562, and (2) signal lines 148 and ground line pairs 564/566. It can be appreciated that various other appropriate locations may be selected based on cross points 712 and 717.

It can be appreciated that such tuning as noted above may be for or represent tuning of a single one of, all of a level of, or all of (1) signal lines 138 and ground line pairs 560/562, or (2) signal lines 148 and ground line pairs 564/566 of device 550. It can be appreciated that such tuning as noted above may be represent by curves different than the convex curves 710-711 and 715-716 shown in FIG. 7, such as where the selected width W1/width W4 along axis 730 is selected to be at the highest point of the different curve along the vertical axis 720.

In some cases, this impedance tuning provides (e.g., by determining or identifying a range of or selected target width W1 and width W4 for both of (1) signal lines 138 and ground line pairs 560/562, or (2) signal lines 148 and ground line pairs 564/566): (1) the best channel performance for lines 138 and 148 (e.g., having length LP; width W1; width W4, pitch PW2 between the line and a horizontally adjacent horizontal data signal transmission line of device 550; and height H4 between the line and a vertically adjacent grounding line of device 550), (2) electrical isolation of horizontal data signal transmission lines (e.g., signal lines 138 and 148) that are single line impedance tuned in the routing segment of device 550 along the channel (e.g., signal lines 138 or 148 along length LP), and (3) minimized impedance discontinuity and crosstalk between vertically adjacent and horizontally adjacent ones of signal lines 138 or 148 of device 550.

In some cases, the tuning above includes separately tuning lines 138 and 148 of interposer 506, patch 504 and package 510. In some cases, it includes separately tuning lines 138 and 148 of interposer 506, patch 504 or package 510. In some cases, the tuning above includes tuning lines 138 and 148 of interposer 506 are tuned, but the signal lines of patch 504 and package 510 are not. In some cases, the width W1 and width W4 of interposer 506 are determined by tuning as noted above; and the width W1 and width W4 of patch 504 and package 510 are determined based on other factors, or design parameters that do not include the tuning noted above.

Figure 8:
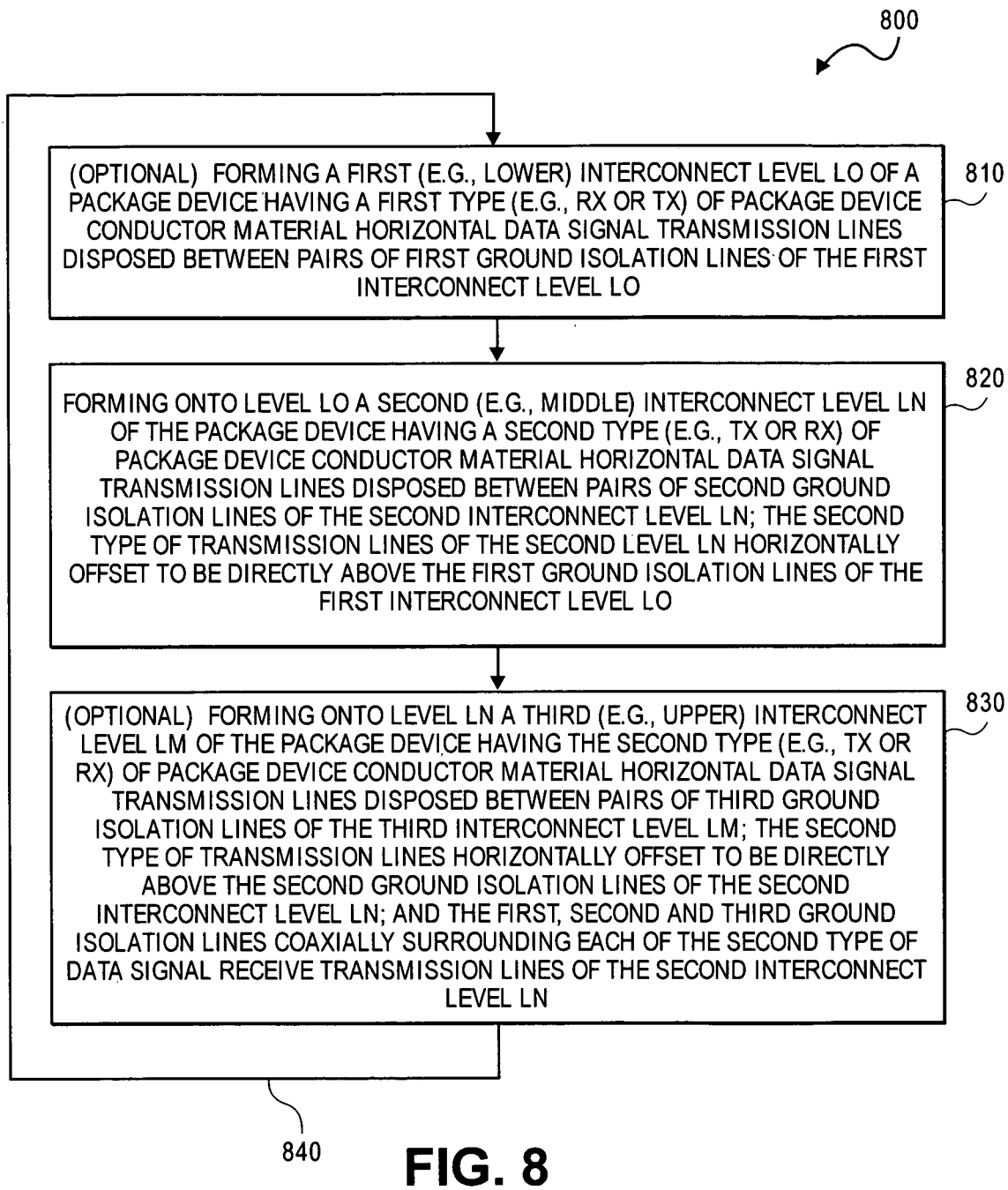
FIG. 8 is a flow chart illustrating a process for forming a ground isolated "coaxial" line separated data signal package, according to embodiments described herein.

FIG. 8 is a flow chart illustrating a process for forming a ground isolated "coaxial" line separated data signal package, according to embodiments described herein. FIG. 8 shows process 800 which may be a process for forming embodiments described herein of package 550 of any of FIGS. 5-7. It may also be a process for forming certain levels or layers of FIGS. 9-12 as noted further below. In some cases, process 800 is a process for forming a ground isolated horizontal data signal transmission line package device that has two ground isolation lines are horizontally surrounding each data signal line; and the two ground isolation lines vertically surrounding each data signal line to cause four ground isolation lines to "coaxially" surrounding each data signal line.

Process 800 begins at optional block 810 at which a first (e.g., lower) interconnect level Lo of a package device is formed, having a first type (e.g., RX or TX) of package device conductor material horizontal data signal transmission lines disposed between pairs of horizontally adjacent first ground isolation lines 564 of the first interconnect level Lo. Block 810 may also include forming first (e.g., lower) level Lo to have package device non-conductive material portions of the first interconnect level Lo disposed (e.g., horizontally adjacent) between each of the first type (e.g., RX or TX) of package device conductor material horizontal data signal receive transmission lines and each of the first ground isolation lines of the first interconnect level Lo.

Block 810 may also include forming the first (e.g., lower) interconnect level Lo of the package device with a first level package device non-conductive material layer formed on (e.g., touching) or over a layer having the first type (e.g., RX or TX) of package device horizontal data signal lines, the first ground isolation lines, and the non-conductive material portions of the first interconnect level Lo.

In some cases, block 810 includes forming non-conductive material layer 103*a* of the first (e.g., lower) interconnect level Lo (e.g., layer 630) on (e.g., touching) or over a layer (e.g., layer 632) having the first type TX horizontal data signal lines 148, first ground isolation lines 564, and non-conductive material portions 103*b* of first interconnect level Lo.

In some cases, block 810 may only include forming lower layer 632 of level Lo with first type of data TX signal 148 lines disposed horizontally between dielectric material portions 103*b* which are disposed between horizontally adjacent first ground isolation lines 564 of the first interconnect level Lo; and then forming upper layer 630 of or having dielectric material onto layer 632.

A first example embodiment of block 810 may include (e.g., prior to forming the upper layer 630), forming a mask (e.g., DFR, not shown) over a top surface of an upper layer 640 (e.g., of ajinomoto build up film (ABF)), the mask having (1) first openings over layer 640 in which to form the first type of data TX signal 148 lines of layer 632 and (2) second openings over layer 640 in which to form the horizontally adjacent first ground isolation lines 564. In some cases, the first openings may be horizontally open to and in communication with different, third openings in the mask over layer 640 in which data TX signal contacts or data TX signal via contacts will be formed. In some cases, the second openings may be horizontally open to and in communication with fourth openings in the mask over layer 640 in which ground signal contacts or via contacts will be formed.

Some of these cases may include electroless plating of a seed layer of the conductor material over layer 640, prior to forming the masks layer. In this case, block 810 may then include simultaneously forming conductive material (e.g., plating on the exposed seed layer of the openings) to form the data TX signal 148 lines and isolation lines 564 of layer 632 in the first and second openings (and optionally the data TX signal or via contacts in the third openings; and the ground signal contacts or via contacts in the fourth openings of layer 632).

In some of these cases, simultaneously forming the conductive material may include forming that conductive material of all of data TX signal 148 lines and isolation lines 564 of layer 632 (and optionally all of the data TX signal or via contacts; and the ground signal contacts or via contacts of layer 632) during the same process, deposition or growth of that conductive material in the first and second (and optionally third and fourth) openings. In some cases, simultaneously forming the conductive material includes electrolytic plating of conductor material in the first and second (and optionally third and fourth) opening's (e.g., on the electroless plating of seed layer).

In some cases of these, after simultaneously forming the conductive material, the mask (e.g., DFR) is removed. This removal may also include removing the seed layer from between the openings. Then dielectric material 103b (e.g., of ajinomoto build up film (ABF)) may be deposited where the mask was removed. In some cases, forming the mask includes forming a blanket layer of mask material and etching the blanket layer to form the first (and optionally second) openings.

Next, at block 820 a second (e.g., middle) interconnect level Ln of the package device is formed over or onto (e.g., touching) level Lo; level Ln, having a second type (e.g., TX or RX; the opposite of the first type RX or TX, respectively) of package device conductor material horizontal data signal transmission lines disposed between pairs of horizontally adjacent second ground isolation lines of the second interconnect level Ln; where the second type of transmission lines of second level Ln are horizontally offset to be directly above the first ground isolation lines of the first interconnect level Lo. Block 820 may also include forming second level Ln to have package device non-conductive material portions of the second interconnect level Ln disposed (e.g., horizontally adjacent) between each of the second type (e.g., TX or RX) of package device conductor material horizontal data signal transmission lines and each of the second ground isolation lines of the second interconnect level Ln.

Block 820 may also include forming the second level Ln of the package device with a second level package device non-conductive material layer formed on (e.g., touching) or over a layer having the second type (e.g., TX or RX) of package device horizontal data signal lines, the second ground isolation lines, and the non-conductive material portions of the second interconnect level Ln.

In some cases, block 820 includes forming non-conductive material layer 103a of the second (e.g., middle) interconnect level Ln (e.g., layer 620) on (e.g., touching) or over a layer (e.g., layer 622) having the second type RX horizontal data signal lines 138, second ground isolation lines 562, and non-conductive material portions 103b of second interconnect level Ln of package device 550.

In some cases, block 820 may only include forming lower layer 622 of level Ln with second type of data RX signal 138 lines disposed horizontally between dielectric material portions 103b which are disposed between horizontally adjacent second ground isolation lines 562 of the second interconnect level Ln; and then forming upper layer 620 of or having dielectric material onto layer 622.

A first example embodiment of block 820 may include (e.g., prior to forming the upper layer 620), forming a mask (e.g., DFR, not shown) over a top surface of an upper layer 630 (e.g., of ajinomoto build up film (ABF), the mask having (1) first openings over layer 630 in which to form the second type of data RX signal 138 lines of layer 622 and (2) second openings over layer 630 in which to form the horizontally adjacent second ground isolation lines 562. In some cases, the first openings may be horizontally open to and in communication with different, third openings in the mask over layer 630 in which data RX signal contacts or via contacts will be formed. In some cases, the second openings may be horizontally open to and in communication with fourth openings in the mask over layer 630 in which ground signal contacts or via contacts will be formed.

Some of these cases may include electroless plating of a seed layer of the conductor material over layer 630, prior to forming the masks layer. In this case, block 820 may then include simultaneously forming conductive material (e.g., plating on the exposed seed layer of the openings) to form the second type of data RX signal 138 and isolation lines 562 of layer 622 in the first and second openings (and optionally the data RX signal or via contacts in the third openings; and the ground signal contacts or via contacts in the fourth openings of layer 622).

In some of these cases, simultaneously forming the conductive material may include forming that conductive material of all of second type of data RX signal 138 and isolation lines 562 of layer 622 (and optionally all of the data RX signal or via contacts; and the ground signal contacts or via contacts of layer 622) during the same process, deposition or growth of that conductive material in the first and second (and optionally third and fourth) openings. In some cases, simultaneously forming the conductive material includes electrolytic plating of conductor material in the first and second (and optionally third and fourth) openings (e.g., on the electroless plating of seed layer).

In some cases of these, after simultaneously forming the conductive material, the mask (e.g., DFR) is removed. This removal may also include removing the seed layer from between the openings. Then dielectric material 103b (e.g., of ajinomoto build up film (ABF)) may be deposited where the mask was removed. In some cases, forming the mask includes forming a blanket layer of mask material and etching the blanket layer to form the first (and optionally second) openings.

Next, at block 830 a third (e.g., upper) interconnect level Lm of the package device is formed over or onto (e.g., touching) level Ln; level Lm having the second type (e.g., TX or RX) of package device conductor material horizontal data signal transmission lines disposed between pairs of horizontally adjacent third ground isolation lines of the third interconnect level Lm; where the second type of transmission lines of third level Lm are horizontally offset to be directly above the second ground isolation lines of the second interconnect level Ln; and where the first, second and third ground isolation lines (e.g., of the lower, middle and upper levels) coaxially surround each of the second type of data signal transmission lines of the second (e.g., middle) level Ln. Block 830 may also include forming third level Lm to have package device non-conductive material portions of the third interconnect level Lm disposed (e.g., horizontally adjacent) between each of the second type (e.g., TX or RX) of package device conductor material horizontal data signal transmission lines and each of the third ground isolation lines of the third interconnect level Lm.

Block 830 may also include forming the third level Lm of the package device with a third level package device non-conductive material layer formed on (e.g., touching) or over a layer having the second type (e.g., TX or RX) of package device horizontal data signal lines, the third ground isolation lines, and the non-conductive material portions of the third interconnect level Lm.

In some cases, block 830 includes forming non-conductive material layer 103*a* of the third (e.g., upper) interconnect level Lm (e.g., layer 610) on (e.g., touching) or over a layer (e.g., layer 612) having the second type RX horizontal data signal lines 138, third ground isolation lines 560, and non-conductive material portions 103*b* of third interconnect level Lm of package device 550.

In some cases, block 830 may only include forming lower layer 612 of level Lm with second type of data RX signal 138 lines disposed horizontally between dielectric material portions 103*b* which are disposed between horizontally adjacent third ground isolation lines 560 of the third interconnect level Lm; and then forming upper layer 610 of or having dielectric material onto layer 612.

A first example embodiment of block 830 may include (e.g., prior to forming the upper layer 610), forming a mask (e.g., DFR, not shown) over a top surface of an upper layer 620 (e.g., of ajinomoto build up film (ABF), the mask having (1) first openings over layer 620 in which to form the second type of data RX signal 138 lines of layer 612 and (2) second openings over layer 620 in which to form the horizontally adjacent third ground isolation lines 560.

In some cases, the first openings may be horizontally open to and in communication with different, third openings in the mask over layer 620 in which data RX signal contacts or via contacts will be formed. In some cases, the second openings may be horizontally open to and in communication with fourth openings in the mask over layer 620 in which ground signal contacts or via contacts will be formed.

Some of these cases may include electroless plating of a seed layer of the conductor material over layer 620, prior to forming the masks layer. In this case, block 830 may then include simultaneously forming conductive material (e.g., plating on the exposed seed layer of the openings) to form the second type of data RX signal 138 and isolation lines 560 of layer 612 in the first and second openings (and optionally the data RX signal or via contacts in the third openings; and the ground signal contacts or via contacts in the fourth openings of layer 612).

In some of these cases, simultaneously forming the conductive material may include forming that conductive material of all of second type of data RX signal 138 and isolation lines 560 of layer 612 (and optionally all of the data RX signal or via contacts; and the ground signal contacts or via contacts of layer 612) during the same process, deposition or growth of that conductive material in the first and second (and optionally third and fourth) openings. In some cases, simultaneously forming the conductive material includes electrolytic plating of conductor material in the first and second (and optionally third and fourth) openings (e.g., on the electroless plating of seed layer).

In some cases of these, after simultaneously forming the conductive material, the mask (e.g., DFR) is removed. This removal may also include removing the seed layer from between the openings. Then dielectric material 103*b* (e.g., of ajinomoto build up film (ABF)) may be deposited where the mask was removed. In some cases, forming the mask includes forming a blanket layer of mask material and etching the blanket layer to form the first (and optionally second) openings.

Next, at return arrow 840, process 800 may continue by returning to a second performance of optional block 810 at which another "first" (e.g., lower) interconnect level of a package device is formed, having a first type (e.g., RX or TX) of package device conductor material horizontal data signal transmission lines. Then, process 800 may proceed with a second performance of block 820, and a second performance of optional block 830. Process 800 may continue this way until a predetermined or sufficient number of levels or return processes are completed to form a desired package device 550. In some cases, it may repeat 3 to 10 times. In some cases, block 810 is repeated once to form a level similar to level Lq but formed on level Lm.

Next, in a first example case of process 800, block 810 may only include forming layer 632 as described herein; block 820 may only include forming layer 622 as described herein; and block 830 may only include forming layer 612 as described herein. In a second example case, block 810 may include forming layers 630 and 632 as described herein; block 820 may include forming layers 620 and 622 as described herein; and block 830 may include forming layers 610 and 612 as described herein.

It can be appreciated that although FIGS. 5-8 show and corresponding descriptions describe embodiments for level Lm having RX signal lines, level Ln having RX signal lines, level Lo having TX signal lines, and level Lq having TX signal lines, the figures and descriptions also apply to embodiments where there are only one level of vertically adjacent RX and TX signals (e.g., level Ln is TX and level Lo is RX signals), each level having ground isolation lines and offset as noted herein. In some embodiments, there may be three levels of vertically adjacent RX and TX signals, each level having ground isolation lines and offset as noted herein.

For example, an embodiment of a process similar to process 800 of FIG. 8 may include not performing block 830 before proceeding to return 840 and block 810, thus forming first (e.g., lower) interconnect level Lo of a package device having one layer of the first type (e.g., RX or TX) of horizontal data signal transmission lines (e.g., a first type of data signal lines or traces, such as RX or TX data signal lines disposed between package device first isolation lines) of the first interconnect level Lo. Then performing block 820 to form the second (e.g., middle) interconnect level Ln of a package device having one layers of the second type (e.g., TX or RX; the opposite of the first type RX or TX, respectively) of package device horizontal data signal transmission lines (e.g., a first type of data signal lines or traces, such as TX or RX data signal lines disposed between package device second isolation lines) of the second interconnect level Ln. Then returning to perform block 810 and block 820 again.

It can be appreciated that although FIGS. 4-8 show and corresponding descriptions describe embodiments for level Lm having RX signal lines, level Ln having RX signal lines, level Lo having TX signal lines, and level Lq having TX signal lines, the figures and descriptions also apply to embodiments where the order can be reversed such as for embodiments where level Lm has TX signal lines, level Ln has TX signal lines, level Lo has RX signal lines, and level Lq has RX signal lines.

It can be appreciated that although FIGS. 4-8 show and corresponding descriptions describe embodiments for levels having RX signal lines and TX signal lines, the figures and descriptions also apply to embodiments where other types of information, clock, timing, alternating current (AC) or data signals can be on those signal lines.

In some cases, a ground isolated horizontal data signal transmission line package device has (1) ground isolation planes separating horizontal data signal receive and transmit layers or levels (e.g., interconnect levels) (e.g., see device 150 of FIGS. 1-4) and (2) ground isolation lines "coaxially" surrounding (e.g., vertically and horizontally separating) vertically and horizontally adjacent horizontal data signal receive (RX) and transmit (TX) signal lines that are routed through the package device (e.g., see device 550 of FIGS. 5-8). The horizontal ground isolation planes located vertically between the horizontal data signal receive and transmit layers or levels (e.g., interconnect levels) may reduce crosstalk between vertically adjacent levels (e.g., between TX signal lines and RX signal lines in levels above and below each other) such as described for device 150 of FIGS. 1-4. The ground isolation lines horizontally, vertically or coaxially surrounding the horizontal data signal transmission lines may reduce crosstalk between and increase isolation of horizontally and vertically adjacent ones of the horizontal data signal transmission lines such as described for device 550 of FIGS. 5-8.

In some cases, the horizontal ground isolation planes combined with the isolation lines, reduce crosstalk between vertically adjacent levels (e.g., between TX signal lines and RX signal lines in levels above and below each other), and decrease crosstalk between the horizontal data signal transmission lines that are horizontally adjacent to each other (e.g., in a single vertical level or layer of the device package). This embodiment of a ground isolated horizontal data signal transmission line package device may be described as a "combined horizontal ground isolation planes and ground isolation coaxial lines separated data signal line package device" (e.g., see device 950).

Figure 9:
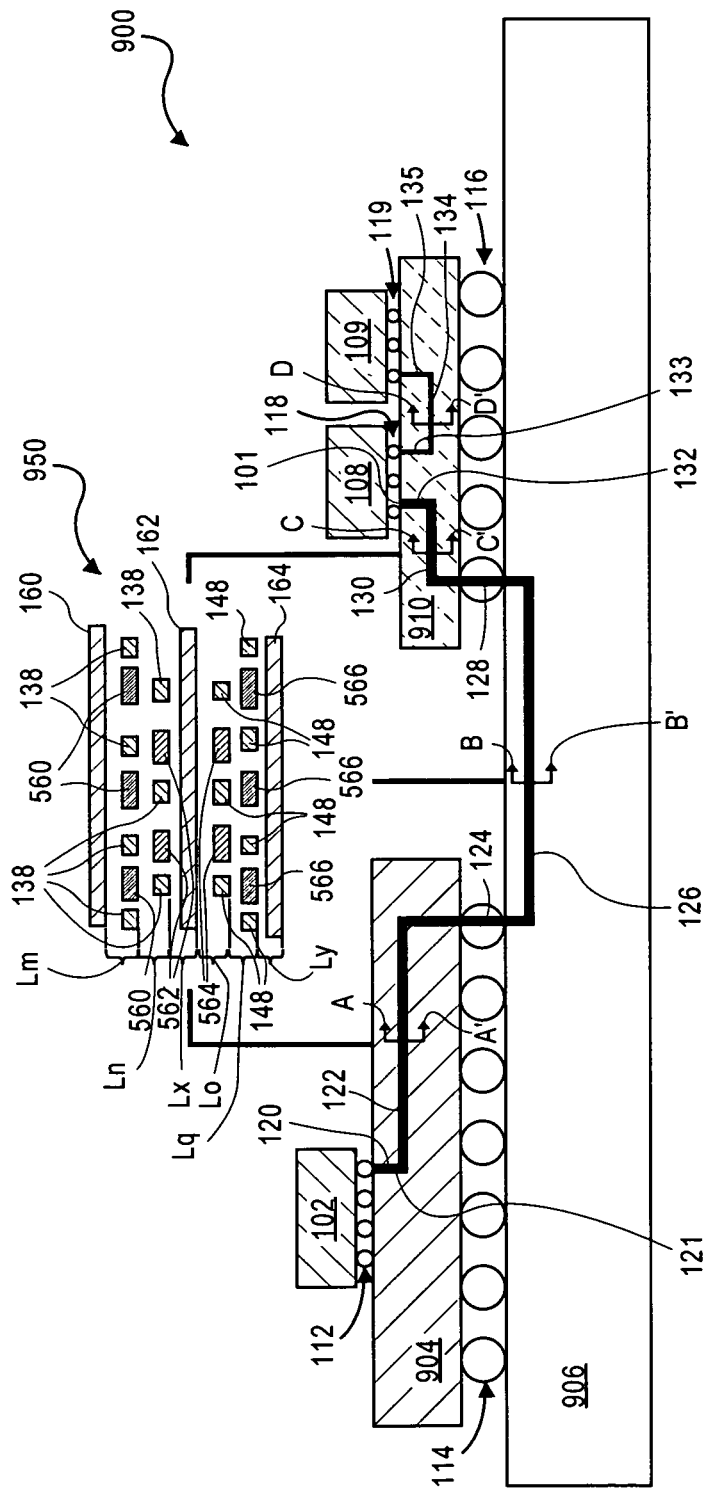
FIG. 9 is schematic cross-sectional side and length views of a computing system, including combined horizontal ground isolation planes and ground isolation coaxial lines separated data signal line package devices.

FIG. 9 is schematic cross-sectional side and length views of a computing system, including combined horizontal ground isolation planes and ground isolation coaxial lines separated data signal line package devices. FIG. 9 shows a schematic cross-sectional side view of computing system 900, including ground isolated horizontal data signal transmission line package devices, such as patch 904, interposer 906 and package 910. In some cases, system 900 has CPU chip 102 mounted on patch 904, which is mounted on interposer 906 at first location 107. It also shows chip 108 mounted on package 910 at first location 101; and chip 109 mounted on chip 910 at second location 111. Package 910 is mounted on interposer 906 at second location 113. For example, a bottom surface of chip 102 is mounted on top surface 105 of patch 904 using solder bumps or bump grid array (BGA) 112. A bottom surface of patch 904 is mounted on top surface 105 of interposer 906 at first location 107 using solder bumps or BGA 114. Also, a bottom surface of chip 108 is mounted on top surface 103 of package 910 at first location 101 using solder bumps or BGA 118. A bottom surface of chip 109 is mounted on surface 103 of package 910 at location 111 using solder bumps or BGA 119. A bottom surface of package 910 is mounted on surface 105 of interposer 906 at second location 113 using solder bumps or BGA 116.

In some cases the only difference between system 900 and 100 is the difference between patch 904 and 104; interposer 906 and 106; and package 910 and 110. In some cases the only difference between patch 904 and 104; interposer 906 and 106; and package 910 and 110 is that patch 904, interposer 906, and package 910 are or have combined horizontal ground isolation planes and ground isolation coaxial lines separated data signal line package device 950 instead of ground isolation plane separated data signal package device 150. In other words, in some cases the only difference between patch 904 and 104; interposer 906 and 106; and package 910 and 110 is that horizontal data signal transmission lines 122, 126, 130 and 135 are or have ground isolation "coaxial" line separated data signal package device 950 in place of ground isolation plane separated data signal package device 150.

FIG. 9 also show vertical data signal transmission lines 120 originating in chip 102 and extending vertically downward through bumps 112 and into vertical levels of patch 904, such as downward to levels Lm-Lq of patch 904 at first horizontal location 121.

FIG. 9 also shows patch horizontal data signal transmission lines 122 originating at first horizontal location 121 in levels Lm-Lq of patch 904 and extend horizontally through level Lm-Lq along length L1 of levels Lm-Lq to second horizontal location 123 in levels Lm-Lq of patch 904.

Next, FIG. 9 shows vertical data signal transmission lines 124 originating in patch 904 and extending vertically downward through bumps 114 and into vertical levels of interposer 906, such as downward to levels Lm-Lq of interposer 906 at first horizontal location 125.

FIG. 9 also shows interposer horizontal data signal transmission lines 126 originating at first horizontal location 125 in levels Lm-Lq of interposer 906 and extend horizontally through levels Lm-Lq along length L2 of levels Lm-Lq to second horizontal location 127 in levels Lm-Lq of interposer 906.

Next, FIG. 9 shows vertical data signal transmission lines 128 originating in interposer 906, such as originating at levels Lm-Lq at second horizontal location 127 of interposer 906 and extending vertically upward to levels Lm-Lq of package 910 at first horizontal location 129 of package 910.

FIG. 9 also shows package device horizontal data signal transmission lines 130 originating at first horizontal location 125 in levels Lm-Lq of package 910 and extend horizontally through levels Lm-Lq along length L3 of levels Lm-Lq to second horizontal location 131 in levels Lm-Lq of package 910.

Next, FIG. 9 shows vertical data signal transmission lines 132 originating in package 910, such as originating at levels Lm-Lq at second horizontal location 131 of package 910 and extending upward to and terminate at a bottom surface of chip 108.

FIG. 9 also show vertical data signal transmission lines 133 originating in chip 108 and extending vertically downward to levels Lm-Lq of package 910 at first horizontal location 134 of package 910.

FIG. 9 also shows package device horizontal data signal transmission lines 135 originating at third horizontal location 134 in levels Lm-Lq of package 910 and extend horizontally through levels Lm-Lq along length L4 of levels Lm-Lq to second horizontal location 136 in levels Lm-Lq of package 910.

Next, FIG. 9 shows vertical data signal transmission lines 137 originating in package 110, such as originating at levels Lm-Lq at fourth horizontal location 136 of package 910, and extending upward to and terminate at a bottom surface of chip 109. In some cases the data signal transmission signals of lines 120, 122, 124, 126, 128, 130, 132, 133, 135 and/or 137 are or include data signal transmission signals to an IC chip (e.g., chip 102, 108 or 109), patch 904, interposer 906, package 910, or another device attached to thereto, such as described for FIG. 1.

In some cases, lines 120, 122 and 124 also include power and ground signal lines or traces, such as described for FIG. 1 (not shown) that also extend horizontally from location 121 to location 123 within levels Lm-Lq, or other levels of patch 904.

In some cases, lines 124, 126 and 128 also include power and ground signal lines or traces, such as described for FIG. 1 (not shown) that also extend horizontally from location 125 to location 127 within levels Lm-Lq, or other levels of interposer 906. In some cases the power and ground signals transmitted and received (or existing) on the power and ground signal lines of lines 120, 122, 124 and 126 originate at or are provided by patch 904 or interposer 906, or another device attached to thereto, such as described for FIG. 1.

In some cases, lines 128, 130 and 132 also include power and ground signal lines or traces, such as described for FIG. 1 (not shown) that also extend horizontally from location 129 to location 131 within levels Lm-Lq, or other levels of package 904. In some cases the power and ground signals transmitted and received (or existing) on the power and ground signal lines of lines 128, 130 and 132 originate at or are provided by package 910 or interposer 906, or another device attached to thereto, such as described for FIG. 1.

In some cases, lines 133, 135 and 137 also include power and ground signal lines or traces, such as described for FIG. 1 (not shown) that also extend horizontally from location 134 to location 136 within levels Lm-Lq, or other levels of package 904. In some cases the power and ground signals transmitted and received (or existing) on the power and ground signal lines of lines 133, 135 and 137 originate at or are provided by package 910 or interposer 906, or another device attached to thereto, such as described for FIG. 1.

FIG. 9 also shows a schematic cross-sectional length view of a ground isolated horizontal data signal transmission line package device. In this case, the package device is combined horizontal ground isolation planes and ground isolation coaxial lines separated data signal line package device 950 (e.g., instead of, but combining package device 150 of FIGS. 1-4 and package device 550 of FIGS. 5-8). Device 950 may be a "package device" representing any of patch 904, interposer 906 or package 910. It can be appreciated that device 950 may represent another package device having horizontal data transmission lines. In some cases, package device 950 represents horizontal data signal transmission lines 122 of patch 904 through perspective A-A'; horizontal data signal transmission lines 126 of interposer 906 through perspective B-B'; horizontal data signal transmission lines 130 of package 910 through perspective C-C'; or horizontal data signal transmission lines 135 of package 910 through perspective D-D', such as described for package device 150 and patch 104, interposer 106 or package 110.

Figure 10A:
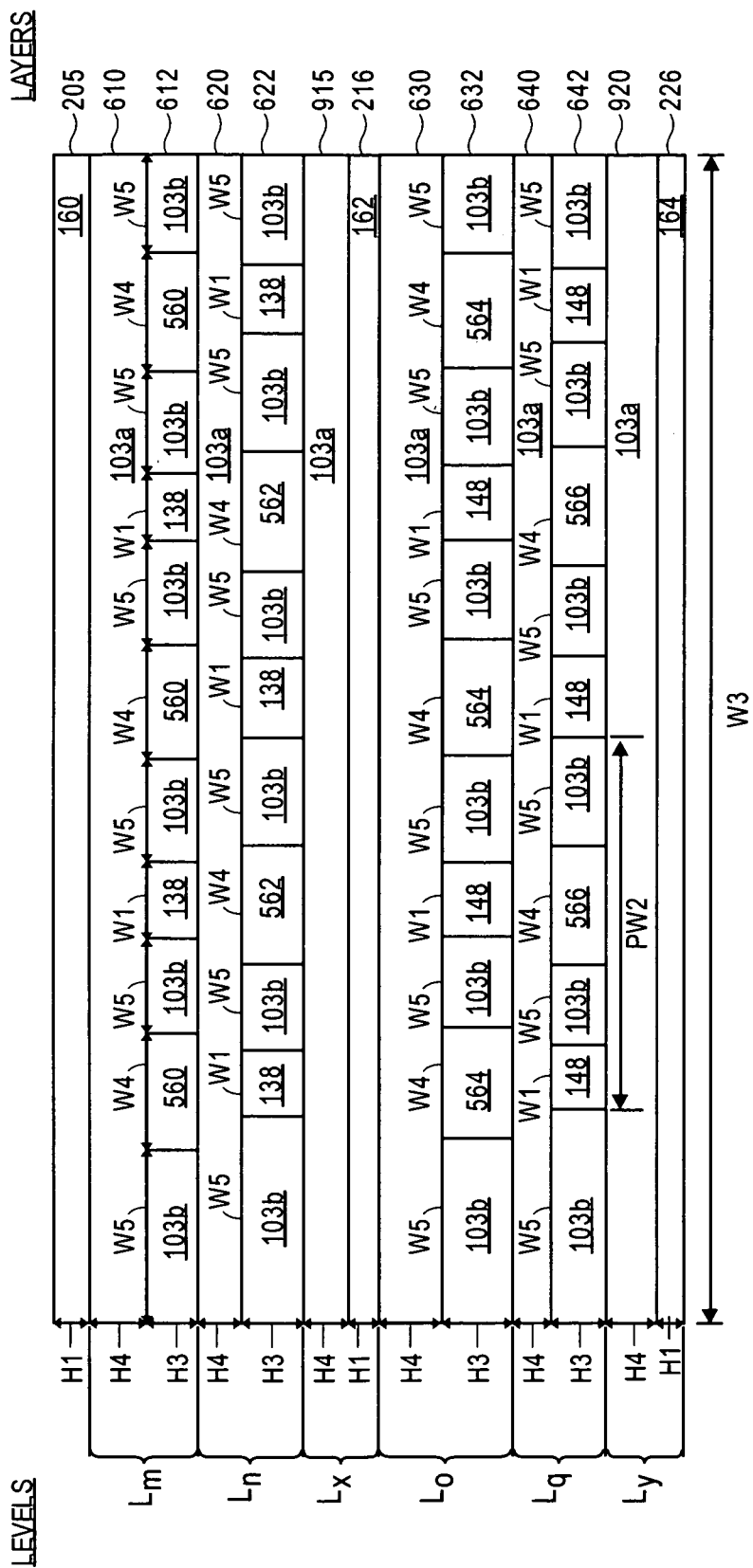
FIG. 10A is an exploded schematic cross-sectional length view of a ground isolated horizontal data signal transmission line package device of FIG. 9 showing combined horizontal ground isolation planes and ground isolation coaxial lines separating horizontal data signal receive and transmit lines.

FIG. 10A is an exploded schematic cross-sectional length view of a ground isolated horizontal data signal transmission line package device of FIG. 9 showing combined horizontal ground isolation planes and ground isolation coaxial lines separating horizontal data signal receive and transmit lines. FIG. 10A shows an exploded schematic cross-sectional length view of combined horizontal ground isolation planes and ground isolation coaxial lines separated data signal line package 950, such as a "package device" representing any of patch 904 (e.g., a view through perspective A-A'), interposer 906 (e.g., a view through perspective B-B') or package 910 (e.g., a view through perspective C-C' or D-D"). Package device 950 is shown having interconnect level Lm formed over or onto (e.g., touching) Level Ln which is formed over or onto Level Lx which is formed over or onto (e.g., touching) Level Lo which is formed over or onto (e.g., touching) Level Lq which is formed over or onto (e.g., touching) Level Ly. It also shows layer 205 formed onto (e.g., touching) layer 610, which is formed onto layer 612, which is formed onto layer 620, which is formed onto layer 622, which is formed onto layer 915, which is formed onto layer 216, which is formed onto layer 630, which is formed onto layer 632, which is formed onto layer 640, which is formed onto layer 642, which is formed onto layer 920, which is formed onto layer 226.

Figure 10B:
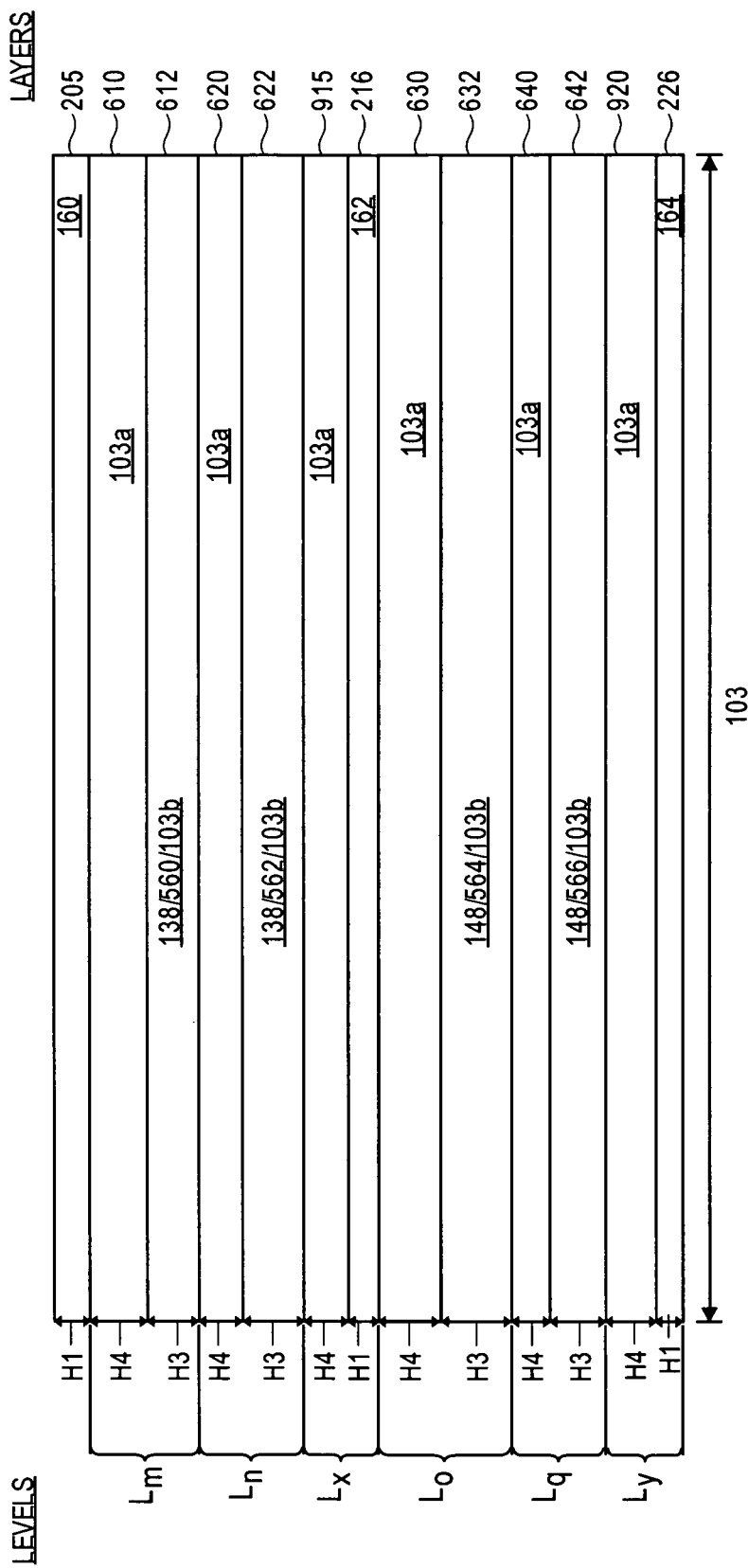
FIG. 10B is an exploded schematic cross-sectional side view of a ground isolated horizontal data signal transmission line package device of FIGS. 9 and 10A showing ground isolation planes separating vertically adjacent levels of horizontal data signal receive and transmit lines; and ground isolation "coaxial" lines separating vertically adjacent and horizontally adjacent ones of horizontal data signal receive and transmit lines.

FIG. 10B is an exploded schematic cross-sectional side view of a ground isolated horizontal data signal transmission line package device of FIGS. 9 and 10A showing ground isolation planes separating vertically adjacent levels of horizontal data signal receive and transmit lines; and ground isolation "coaxial" lines separating vertically adjacent and horizontally adjacent ones of horizontal data signal receive and transmit lines. FIG. 10B shows an exploded schematic cross-sectional side view of combined horizontal ground isolation planes and ground isolation coaxial lines separated data signal line package 950 of FIGS. 9 and 10A such as a "package device" representing any of patch 904 (e.g., along length L1), interposer 906 (e.g., along length L2) or package 910 (e.g., along length L3 and/or L4). Package device 950 is shown having interconnect levels Lm, Ln, Lo, Lq and Ly (e.g., see FIG. 10A).

More specifically, FIG. 10B shows package device 950 having levels Lm, Ln, Lo, Lq and Ly and layers 205, 610, 612, 620, 622, 910, 216, 630, 632, 640, 642, 920 and 226 along length Lp. Length Lp may represent any of lengths L1, L2, L3 or L4. In some cases, levels Lm-Ly and layers 205-226 in FIG. 10B may include (e.g., along with other materials that are beyond the edge of length Lp) or are (e.g., within length Lp) the same as in the descriptions above for levels Lm-Ly and layers 205-226 in FIGS. 9 and 10A, respectively.

FIG. 10B shows layer 612 that may include (e.g., along with other materials that are beyond the edge of length Lp) or be (e.g., within length Lp) lines 138, lines 560 and portions 103b. For example, layer 612 is shown having "138/560/103b" which may represent lines 138, lines 560, and/or portions 103b extending along length Lp. FIG. 10B shows layer 622 that may include (e.g., along with other materials that are beyond the edge of length Lp) or be (e.g., within length Lp) lines 138, lines 562 and portions 103b. FIG. 10B shows layer 632 that may include (e.g., along with other materials that are beyond the edge of length Lp) or be (e.g., within length Lp) lines 148, lines 564 and portions 103b. FIG. 10B shows layer 642 that may include (e.g., along with other materials that are beyond the edge of length Lp) or be (e.g., within length Lp) lines 148, lines 566 and portions 103b. In some cases, ground isolation planes 160, 162 and 164; and ground isolation lines 560, 562, 564 or 566 are each electronically coupled to (e.g., touching, formed with, or directly attached to) ground contacts or other ground signal providing circuitry of device 950, such as ground contacts disposed in the same layer as each ground plane or line, respectively.

More specifically, FIGS. 10A-B show package device 950 having layer 205 that includes (e.g., along with other materials that are beyond the edge of width W3) or is (e.g., within width W3) package device conductor material (e.g., pure conductor or metal) ground isolation plane 160 separating upper layer 610 of package device dielectric material (and package device horizontal data signal receive transmission lines 138 (e.g., data signal RX 138)) of level Lm from package device non-conductor material (and vertically adjacent horizontal data signal transmit transmission lines (e.g., data signal TX or RX lines)) of a level or layer of the package device that is above plane 160. Plane 160 may be the same as described for FIGS. 1-4, except that it is formed on level Lm, where level Lm is as described for FIGS. 5-8, and may be connected as appropriate for system 900.

Plane 160 may be directly physically connected to, electrically coupled to, or directly attached to ground contacts or via contacts in the same layer 205 as plane 160. In some cases, plane 160 is or includes ground signals from, originating at, provided by, or generated by patch 904, interposer 906, package 910, or another device attached to thereto as described for patch 104, interposer 106, package 110, or another device at FIGS. 1-4. This signal may have a voltage level as described at FIGS. 1-4.

Next, FIGS. 10A-B show package device 950 having Level Lm with upper layer 610 formed over or onto (e.g., touching) lower layer 612 which is formed over or onto upper layer 620 of level Ln. Level Lm, upper layer 610, and lower layer 612 may be the same a described for FIGS. 5-8, except that layer 205 is formed onto layer 610 and lines 560 may be connected as appropriate for system 900.

In some cases, lines 560 of layer 612 may be directly physically connected to, electrically coupled to, or directly attached to ground contacts or via contacts in the same layer 612 or level Lm as lines 560. In some cases the ground lines 560 are or include ground signals from, originating at, provided by, or generated by patch 904, interposer 906, package 910, or another device attached to thereto as described for patch 104, interposer 106, package 110, or another device at FIGS. 5-8. This signal may have a voltage level as described at FIGS. 5-8.

Next, FIGS. 10A-B show package device 950 having Level Ln with upper layer 620 formed over or onto (e.g., touching) lower layer 622 which is formed over or onto upper layer 915 of level Lx. Level Ln, upper layer 620, and lower layer 622 may be the same a described for FIGS. 5-8, except that layer 622 is formed onto layer 915 and lines 562 may be connected as appropriate for system 900.

In some cases, lines 562 of layer 622 may be directly physically connected to, electrically coupled to, or directly attached to ground contacts or via contacts in the same layer 622 or level Ln as lines 562. In some cases the ground lines 562 are or include ground signals from, originating at, provided by, or generated by patch 904, interposer 906, package 910, or another device attached to thereto as described for patch 104, interposer 106, package 110, or another device at FIGS. 5-8. This signal may have a voltage level as described at FIGS. 5-8.

Next, FIGS. 10A-B show package device 950 having Level Lx with upper layer 915 formed over or onto (e.g., touching) lower layer 216 which is formed over or onto upper layer 630 of level Lo. Upper layer 915 may be the same a layer 610 described for FIGS. 5-8, except that it is formed onto layer 216 and located vertically adjacent to and between layers 622 and 216. Lower layer 216 may include or be ground isolation plane 162 such as described for FIGS. 1-4. Plane 162 may be the same as described for FIGS. 1-4, except that it is formed on level Lo, where level Lo is as described for FIGS. 5-8, and may be connected as appropriate for system 900.

Plane 162 may be directly physically connected to, electrically coupled to, or directly attached to ground contacts or via contacts in the same layer 216 as plane 162. In some cases, plane 162 is or includes ground signals from, originating at, provided by, or generated by patch 904, interposer 906, package 910, or another device attached to thereto as described for patch 104, interposer 106, package 110, or another device at FIGS. 1-4. This signal may have a voltage level as described at FIGS. 1-4.

Next, FIGS. 10A-B show package device 950 having Level Lo with upper layer 630 formed over or onto (e.g., touching) lower layer 632 which is formed over or onto upper layer 640 of level Lq. Level Lo, upper layer 630, and lower layer 632 may be the same a described for FIGS. 5-8, except that layer 216 is formed onto layer 630 and lines 564 may be connected as appropriate for system 900.

In some cases, lines 564 of layer 632 may be directly physically connected to, electrically coupled to, or directly attached to ground contacts or via contacts in the same layer 632 or level Lm as lines 564. In some cases the ground lines 564 are or include ground signals from, originating at, provided by, or generated by patch 904, interposer 906, package 910, or another device attached to thereto as described for patch 104, interposer 106, package 110, or another device at FIGS. 5-8. This signal may have a voltage level as described at FIGS. 5-8.

Next, FIGS. 10A-B show package device 950 having Level L q with upper layer 640 formed over or onto (e.g., touching) lower layer 642 which is formed over or onto upper layer 920 of level Ly. Level Lq, upper layer 640, and lower layer 642 may be the same a described for FIGS. 5-8, except that level 642 is formed onto layer 920 and lines 566 may be connected as appropriate for system 900.

In some cases, lines 566 of layer 642 may be directly physically connected to, electrically coupled to, or directly attached to ground contacts or via contacts in the same layer 642 or level Lm as lines 566. In some cases the ground lines 566 are or include ground signals from, originating at, provided by, or generated by patch 904, interposer 906, package 910, or another device attached to thereto as described for patch 104, interposer 106, package 110, or another device at FIGS. 5-8. This signal may have a voltage level as described at FIGS. 5-8.

Next, FIGS. 10A-B show package device 950 having Level Ly with upper layer 920 formed over or onto (e.g., touching) lower layer 226 which may be formed over or onto another layer of device 950. Upper layer 920 may be the same a layer 610 described for FIGS. 5-8, except that it is formed onto layer 226 and located vertically adjacent to and between layers 642 and 226. Lower layer 226 may include or be ground isolation plane 164 such as described for FIGS. 1-4, except that layer 920 is formed onto layer 226 and it may be connected as appropriate for system 900. Plane 164 may be the same as described for FIGS. 1-4, except that it is formed on a lower level of package device 950, and may be connected as appropriate for system 900.

Plane 164 may be directly physically connected to, electrically coupled to, or directly attached to ground contacts or via contacts in the same layer 226 as plane 164. In some cases, plane 164 is or includes ground signals from, originating at, provided by, or generated by patch 904, interposer 906, package 910, or another device attached to thereto as described for patch 104, interposer 106, package 110, or another device at FIGS. 1-4. This signal may have a voltage level as described at FIGS. 1-4.

The embodiments of a ground isolated horizontal data signal transmission line package device 950 may be described as a combined horizontal ground isolation planes and ground isolation coaxial lines separated data signal line package 950.

The ground planes 160, 162 and 164 of package device 950 may each be a ground isolation plane or planar structure across a layer vertically between each horizontal data signal transmission line (e.g., RX or TX) of two levels (e.g., Lm and Ln; or Lo and Lq) and all data signal transmission lines of all levels above (or below) that ground plane (e.g., that one level), thus reducing (e.g., by a factor or 2, 3, 5 or 10 times) "data signal transmission line" crosstalk between each of the horizontal data signal transmission lines of the one level (e.g., an "agressor") and all data signal transmission lines of all levels above (or below) that ground plane (e.g., those two levels).

The ground isolation lines 560, 562, 564 or 566 horizontally, vertically and coaxially surrounding the horizontal data signal transmission lines 138 RX or 148 TX in each of levels Lm-Lq may (1) reduce crosstalk between vertically adjacent ones of the horizontal data signal transmission lines 138 RX or 148 TX of different levels of levels Lm-Lq; and (2) reduce crosstalk between horizontally adjacent ones of the horizontal data signal transmission lines 138 RX or 148 TX in each of same level of levels Lm-Lq.

More specifically, FIGS. 9-10B show that each of levels Lm-Lq may have an upper layer of non-conductive (e.g., dielectric) material 103a; and a lower layer having conductor material (e.g., pure conductor or metal) data signal lines (e.g., traces) 138 RX or 148 TX between (1) horizontally adjacent non-conductive (e.g., dielectric) material portions 103b that are between (2) horizontally adjacent ground isolation lines 560, 562, 564 or 566 (e.g., traces) of conductor material (e.g., pure conductor or metal), such as described for FIGS. 5-8.

In some cases, ground lines of package device 950 (e.g., lines 560, 562, 564 and 566) may reduce or decrease (e.g., by a factor or 2, 3, 5 or 10 times) "data signal transmission line" crosstalk (and optionally may increase electronic isolation) between one of the horizontal data signal transmission lines of one level (e.g., an "agressor" of level Lm, Ln, Lo or Lq) and a horizontally adjacent data same type (e.g., RX or TX) signal transmission line of the same level (e.g., that one level Lm, Ln, Lo or Lq), such as described for FIGS. 5-8. This may occur for each of the horizontal RX data signal lines in level Lm, Ln, Lo and Lq, such as described for FIGS. 5-8.

Each level of levels Lo-Lq of FIGS. 9-10B may also have staggered horizontal (e.g., lateral) spacing of its lower layer conductor material data signal lines 138 RX or 148 TX as compared to ground isolation lines 560, 562, 564 or 566 of a vertically adjacent level above it, such as described for FIGS. 5-8. However, in some cases, level Lo is not staggered with respect to level Ln as described for FIGS. 5-8 (e.g., lines 562 are directly above lines 564), such as due to isolation plane 162 providing vertical ground isolation for signal lines of level Ln in place of isolation lines 564 of level Lo, and for signal lines of level Lo in place of isolation lines 562 of level Ln.

Here, in some cases, one ground isolation line and one ground isolation plane vertically surround (e.g., are vertically to the top and bottom of) two non-conductive material layers 103a that vertically surround (e.g., are vertically to the top and bottom of) each data signal RX or TX line. For example, lines 562 are vertically below each of lines 138 of level Lm, and ground isolation plane 160 is vertically above each of lines 138 of level Lm. Thus, lines 562 and plane 160 vertically surround each of lines 138 of level Lm. Also, lines 560 are vertically above each of lines 138 of level Ln, and ground isolation plane 162 is vertically below each of lines 138 of level Ln. Thus, lines 560 and plane 162 vertically surround each of lines 138 of level Ln. In another example, lines 566 are vertically below each of lines 148 of level Lo, and ground isolation plane 162 is vertically above each of lines 148 of level Lo. Thus, lines 566 and plane 162 vertically surround each of lines 148 of level Lo. Next, lines 564 are vertically above each of lines 148 of level Lq, and ground isolation plane 164 is vertically below each of lines 148 of level Lq. Thus, lines 566 and plane 164 vertically surround each of lines 148 of level Lq. In some cases, the one ground isolation line and one ground isolation plane are described as vertically surrounding (e.g., are vertically above and below) each data signal line 138 RX or 148 TX in each of levels Lm-Lq.

In some cases, the combination of the ground planes of package device 950 (e.g., planes 160, 162 and 164) and the ground lines of package device 950 (e.g., lines 560, 562, 564 and 566) may reduce (e.g., by a factor or 2, 3, 5 or 10 times) "data signal transmission line" crosstalk (and optionally may increase isolation) between one of the horizontal data signal transmission lines of one level having signal lines (e.g., an "agressor" of level Lm, Ln, Lo or Lq) and a vertically adjacent data signal transmission line of a level that is two levels (e.g., two levels of levels having signal lines, or two levels of levels Lm, Ln, Lo or Lq) above or below the one transmission line (e.g., above or below the agressor level Lm, Ln, Lo or Lq).

In some cases, the levels of signal lines are also (or instead) vertically surrounded by the isolation planes, in addition to being vertically surrounded by the isolation lines (e.g., either above or below each level of signal lines). In one example, each pair of ground isolation planes of package device 950 (e.g., pair of planes 160 and 162; or 162 and 164) vertically surrounds each level of the signal lines. For example, plane 162 may reduce (e.g., by a factor or 2, 3, 5 or 10 times) "data signal transmission line" vertical crosstalk (and optionally may increase isolation) produced or created by an "agressor" horizontal RX data signal transmission line 138 of levels Lm and Ln from reaching a vertically adjacent TX data signal transmission line of level Lo that is disposed two levels (e.g., two levels of levels having signal lines, or two levels of levels Lm, Ln, Lo or Lq) below the "agressor" RX line of levels Lm and Ln, such as due to plane 162 being disposed vertially between the signal transmission lines of level Lo and levels Lm and Ln. This may be in addition to vertical isolation provided by an isolation line, such as described above. It is considered that plane 160 cause the same reduction in vertical crosstalk caused by the RX lines of levels Lm and Ln from reaching the a vertically adjacent TX lines of a level above plane 160. Here it can be said the planes 160 and 162 vertically surround levels Lm and Ln.

Similarly, in some cases, plane 162 may reduce (e.g., by a factor or 2, 3, 5 or 10 times) "data signal transmission line" vertical crosstalk (and optionally may increase isolation) produced or created by an "agressor" horizontal TX data signal transmission line 148 of levels Lo and Lq from reaching a vertically adjacent RX data signal transmission line of level Ln that is disposed two levels (e.g., two levels of levels having signal lines, or two levels of levels Lm, Ln, Lo or Lq) above the "agressor" TX line of levels Lo and Lq, such as due to plane 162 being disposed vertially between the signal transmission lines of level Ln and levels Lo and Lq. It is considered that plane 164 cause the same reduction in vertical crosstalk caused by the TX lines of levels Lp and Lq from reaching the a vertically adjacent RX lines of a level below plane 164. Here it can be said the planes 164 and 162 vertically surround levels Lo and Lq.

In some cases, due to the ground isolation planes (e.g., plane 162), it may not be necessary to horizontally stagger signal lines of level Lo from signal lines of level Ln. In addition, in some cases, it may not be necessary to horizontally stagger signal lines of level Lo from signal lines of level Lm. Also, in some cases, it may not be necessary to horizontally stagger signal lines of level Lo from signal lines of level Lq. Furthermore, in some cases, it may not be necessary to horizontally stagger signal lines of level Lq from signal lines of level Lm.

According to embodiments, by being planes and lines of conductive material electrically grounded (e.g., having a ground signal), each of ground isolation lines 560-566 and/or planes 160-164 may absorb, or shield electromagnetic crosstalk signals produced by (or increase electronic isolation from) one data signal transmission line of the vertically adjacent levels (of levels Lm, Ln, Lo or Lq) two levels above (or below) the lines, from reaching each of the data signal transmission line of the one level, due to the amount of grounded conductive material, and location of the conductive grounded material between the two levels. This may include reducing electrical crosstalk caused by undesired capacitive, inductive, or conductive coupling of a first data signal type (e.g., RX or TX) received or transmitted through one of the horizontal data signal transmission lines of the vertically adjacent levels (e.g., an "agressor") from reaching (e.g., effecting or being mirrored in) a second data signal type (e.g., TX or RX; the opposite of the first type RX or TX, respectively) received or transmitted through the horizontal data signal transmission lines of the one level that the ground lines shields.

The combination of the two ground isolation lines (e.g., two of each of lines 560, 562, 564 or 566) are horizontally surrounding each data signal line 138 RX or 148 TX in each of levels Lm-Lq; and the two ground isolation planes (e.g., pair of planes 160 and 162; or 162 and 164) and optionally isolation lines (e.g., a pair of lines 560 and plane 162; or plane 162 and lines 566) vertically surrounding each data signal line 138 RX or 148 TX in each of levels Lm-Lq may be described as four ground isolation lines "coaxially" surrounding each data signal line 138 RX or 148 TX in each of levels Lm-Lq.

In some cases, each date signal RX line of level Ln (e.g., layer 622) can be said to be coaxially surrounded by being (1) horizontally surrounded by two ground isolation lines 562 of level Ln (e.g., layer 622), (2) vertically surrounded by ground isolation line 560 of level Lm (and/or optionally plane 160) and plane 162 of level Lx (and/or optionally line 564 of level Lo). Also, in some cases, each date signal TX line of level Lo (e.g., layer 632) can be said to be coaxially surrounded by being (1) horizontally surrounded by two ground isolation lines 564 of level Lo (e.g., layer 632), (2) vertically surrounded by ground isolation line 566 of level Lq (and/or optionally plane 164) and plane 162 of level Lx (and/or optionally line 562 of level Ln).

In some cases, the four ground isolation lines "coaxially" surrounding each horizontal data signal line 138 RX or 148 TX in each of levels Lm-Lq provides or causes the combination of (1) the two ground isolation lines (e.g., two of each of lines 560, 562, 564 or 566) horizontally surrounding each data signal line 138 RX or 148 TX in each of levels Lm-Lq to reduce or decrease (e.g., by a factor or 2, 3, 5 or 10 times) "data signal transmission line" crosstalk (and optionally may increase electronic isolation) between each of the horizontal data signal transmission lines of one level (e.g., level Lm, Ln, Lo or Lq) and a horizontally adjacent data same type (e.g., RX or TX) signal transmission line of the same level (e.g., that one level Lm, Ln, Lo or Lq); and (2) the ground isolation lines and/or planes vertically surrounding each data signal line 138 RX or 148 TX in each of levels Lm-Lq to decrease (e.g., by a factor or 2, 3, 5 or 10 times) "data signal transmission line" crosstalk (and optionally may increase isolation) between one of the horizontal data signal transmission lines of one level (e.g., an "agressor" of level Lm, Ln, Lo or Lq) and a vertically adjacent data signal transmission line of a level two levels of level Lm, Ln, Lo or Lq above or below the one transmission line. In some embodiments, ground isolation lines and planes reduce electrical crosstalk and increase electrical isolation as noted above without re-ordering any horizontal order or sequence of the horizontal data signal transmission lines in a layer or level.

It is noted that for package device 950, signal lines of level Lm are diagonally isolated by plane 160 from signal lines above plane 160; that signal lines of level Ln are diagonally isolated by plane 162 from signal lines of levels Lo and Lq below plane 162; that signal lines of level Lo are diagonally isolated by plane 162 from signal lines of levels Ln and Lm above plane 162; and that signal lines of level Lq are diagonally isolated by plane 166 from signal lines below plane 166.

Due to the ground isolation planes, in some cases, it may not be necessary to diagonally space (e.g., by a predetermined, tuning determined, selected or otherwise designed distance) the RX and TX lines of the different levels sufficiently so that crosstalk is low enough and isolation is high enough for the data signal lines to operate at the speed and other characteristics as noted herein. In some cases, due to plane 162 it may not be necessary to provide such diagonally spacing of the signal lines of level Lo from signal lines of level Ln.

Figure 11:
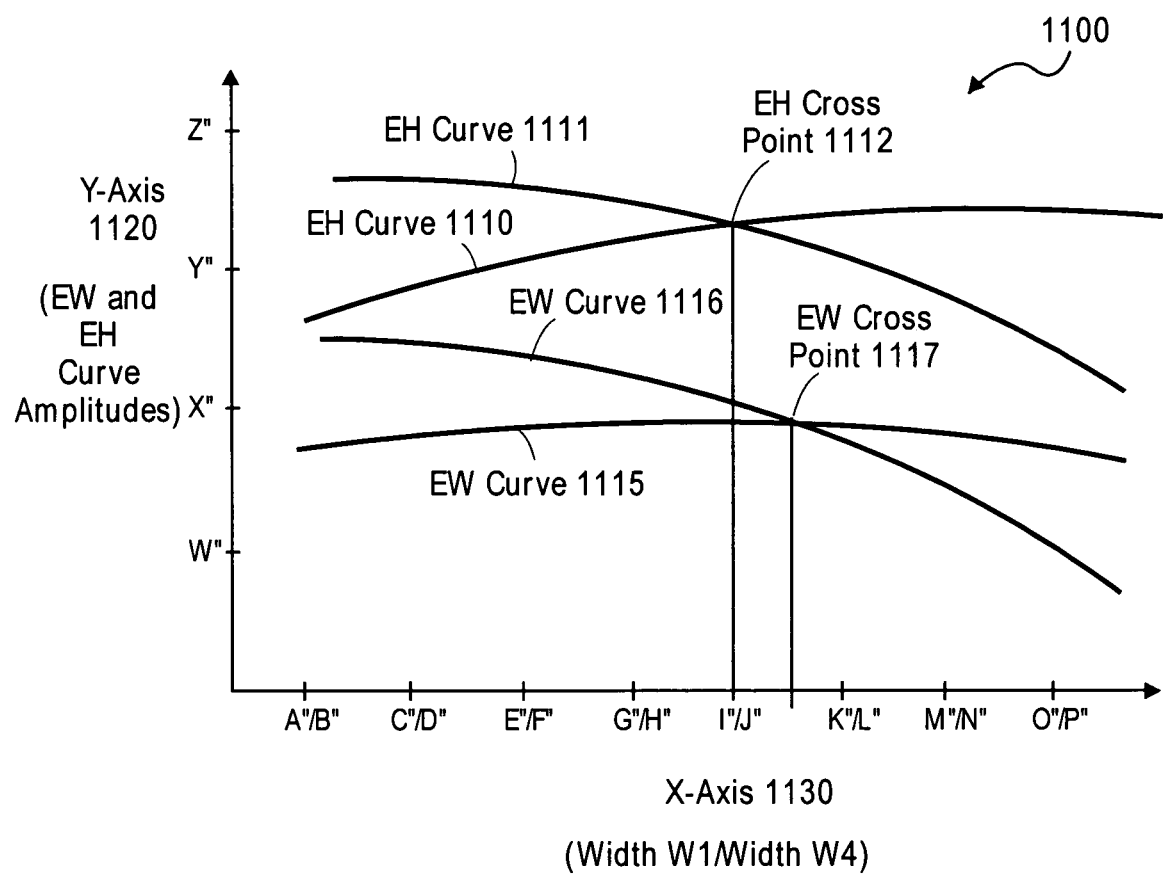
FIG. 11 shows a plot of eye height (EH) curves; and eye width (EW) curves of an eye diagram produced by testing one of horizontal data signal transmission signal lines for a range of horizontal data signal transmission line width and ground line width, such as where spacing is constant between horizontally adjacent signal lines and ground lines.

FIG. 11 shows a plot of eye height (EH) curves; and eye width (EW) curves of an eye diagram produced by testing one of horizontal data signal transmission signal lines for a range of horizontal data signal transmission line width and ground line width, such as where spacing is constant between horizontally adjacent signal lines and ground lines. In some cases, the horizontal signal lines 138 and 148; and the ground lines (e.g., 560, 562, 564 and 566) of device 950 are impedance tuned (e.g., see FIG. 11) to minimize impedance discontinuity and crosstalk between vertically adjacent and horizontally adjacent ones of signal lines 138 or 148 (e.g., a channel) of device 950. This may include performing such tuning to determine or identify: (1) a selected target width W1 (and optionally height H3) of one of signal lines 138 or 148 (e.g., given other set or known heights and widths such as noted below); and (2) a selected target width W4 (and optionally height H3) of one of the ground lines (e.g., 560, 562, 564 or 566) (e.g., given other set or known heights and widths such as noted below) that provides a the best channel performance as showed as the lowest amplitude cross point of eye height (EH) or eye width (EW) curves (e.g., see FIG. 11) of an eye diagram (e.g., see FIG. 3B) produced by testing one of signal lines 138 or 148. The EH and EW curves (e.g., curves 1110-1111 and 1115-1116) may be output signal measure (or computer modeled) at a location of the data signal line 138 or 148 when (e.g., as a result of running) one or more input test data signals are sent through length Lp of the data signal line such as described for FIGS. 3A-B to determine or identify isolated horizontal data signal transmission line widths W1 and ground line width W4 (optionally, and spacing W5) that are single line impedance tuned (e.g., see FIG. 11) in the routing segment of device 950 along the channel of signal lines 138 and 148 along length LP.

Impedance tuning of the signal line may be based on or include as factors: horizontal data signal transmission line width W1, height H3, length Lp; horizontal ground isolation line width W4, height H3, length Lp; width W5 between the isolation lines and horizontally adjacent horizontal data signal transmission lines of device 950; and height H4 between a signal line and a vertically adjacent grounding line (or isolation plane) of device 950. In some cases, once the length Lp, width W5, height H4 and height H3 are known (e.g., predetermined or previously selected based on a specific design of a package device 950), then tuning is performed (e.g., computer simulation, actual "beta" device testing, or other laboratory testing) to determine or identify a ranges of width W1 and W4 that provide the best channel performance as showed as the lowest amplitude cross point of eye height (EH) or eye width (EW) curves of an eye diagram produced by testing one of signal lines 138 or 148.

For example, FIG. 11 shows a plot of eye height (EH) curves 1110 and 1111; and eye width (EW) curves 1115 and 1116 of an eye diagram (e.g., see FIG. 3B) produced by testing one of horizontal data signal transmission signal lines 138 or 148 for a range of horizontal data signal transmission line width W1 and ground line width W4, such as where spacing W2 is constant between horizontally adjacent signal lines (e.g., lines 138 or 148) and ground lines (e.g., lines 560, 562, 564 or 566). The testing may include measuring or modeling an output signal in response to an input signals such as step up (e.g., _⌐) and down (e.g., ⌐_) signals as noted above for FIG. 3A. EH curve 1110 may be the EH curve for a first design or use of device 950 that is independent of (e.g., not based on or does not consider) the above noted factors (e.g., horizontal data signal transmission line width W1, ground line width W4, height H3, length Lp; width W5 between the signal line and a horizontally adjacent ground lines of device 150; and height H4 between the signal line and a vertically adjacent grounding line or isolation plane of device 150). EH curve 1111 may be the EH curve for a second, different design or use of device 950 that is independent of the above noted factors. EW curve 1115 may be the EW curve for the first design or use of device 150 that is independent of the above noted factors. EW curve 1116 may be the EW curve for the second, different design or use of device 950 that is independent of the above noted factors.

In some cases, such a design or use may include where the different curves represent different manufacture variation combinations, such as where a low impedance package (e.g., package 910) is connected to high impedance interposer (e.g., interposer 906). In some cases, such a design or use may include where the different curves represent different corner combinations, or possible component variation combinations. In some cases, such a design or use may include where the different curves represent different designs or uses to tune the impedance to maximize the channel performance. In some cases, FIG. 11A shows EH and EW curves from various channels combining possible package and interposer manufacturing corners, (max/typical/min impedance corners from manufacturing variations). In some cases, for example, max Z patch+min Z interposer+max Z package, where Z denotes impedance. In some cases, the common or intersection area below the EH or EW curvers shows the channel EH/EW solution space. In some cases, the optimized impedance value is tied to the the cross point of EH or EW curves which provides the max EH/EW enveloping all the possible channel manufacture variations.

As described for EH curves 310-311 of FIGS. 3A-B, EH curves 1110-1111 may be examples of an eye-height for different designs, and different signal line width W1 and ground line width W4 (e.g., where spacing W2 is constant) for device 950. Also, as described for EW curves 315-316 of FIGS. 3A-B, EW curves 1115-1116 may be examples of an eye-width for the different designs, and the different signal line width W1 and ground line width W4 (e.g., where spacing W2 is constant) for device 950.

In some cases, curves 1110-1111 and 1115-1116 are for a selected (e.g., predetermined, desired, constant or certain) length Lp of the horizontal data signal transmission line (e.g., RX line 138 or TX line 148) and ground isolation lines (and isolation planes) of package device 950. In some cases, curves 1110-1111 and 1115-1116 are also for a selected signal line and ground line height H3 and spacing H4 between the signal line and a vertically adjacent ground line (or isolation plane).

In some other cases, tuning includes knowing length Lp, width W5 and height H4, then tuning to determine or identify a range of width W1, width W4 and height H3 that provides a predetermined or target impedance for the line.

More specifically, FIG. 11 shows graph 1100 plotting the amplitude of tuning curves 1110-1111 and 1115-1116 along vertical Y-axis 1120 for different pairs of width W1 of a signal line (e.g., RX line 138 or TX line 148) and width W4 of ground lines (e.g., where spacing W5 is constant value or distance between horizontally adjacent one of the signal lines (e.g., RX or TX lines 138 or 148) and ground lines (e.g., lines 560, 562, 564 or 566) along horizontal X-axis 1130. Although FIG. 11 shows the amplitude of curves 1110-1111 and 1115-1116 on the same graph 1100, it can be appreciated that they may be on different graphs having different amplitude scaled Y-axis but the same X-axis 1130 (e.g., the curves are all shown vertically scaled on graph 1100 (e.g., moved up or down axis 1120) to compare the cross points for the curves). Curves 1110-1111 and 1115-1116 may be output signal measure (or computer modeled) at a location of the data signal line when (e.g., as a result of running) the one or more test data signals are sent through length Lp of the data signal line (e.g., RX line 138 or TX line 148) of device 950.

Graph 1100 shows cross point 1112 of EH curves 1110 and 1111. I can be appreciated that curves 1110 and 1111 represent more than two curves, but that those curves have a lowest Y-axis cross point at point 1112. Graph 1100 shows cross point 1117 of EW curves 1115 and 1116. I can be appreciated that curves 1115 and 1116 represent more than two curves, but that those curves have a lowest Y-axis cross point at point 1117.

FIG. 11 shows EW and EH curve amplitudes along vertical axis 1120 having values W", X", Y" and Z", such as representing different amplitudes for curves 1110-1111 or 1115-1116 (e.g., curves 1115-1116 or 1110-1111 may be scaled, respectively, to fit onto the same graph or plot). In some cases, for curves 1110-1111 values W", X", Y" and Z", represent different linearly increasing EH signal amplitude values (e.g., voltage amplitudes of EH derived from a test signal) such as 0.2, 0.25, 0.3 and 0.35 volts. In some cases, for curves 1115-1116 values W", X", Y" and Z", represent different linearly increasing EW signal-time values (e.g., time values of EW derived from a test signal) such as 4.0, 4.5, 5.0 and 5.5 E-11 seconds.

FIG. 11 shows pairs of width W1/width W4 along horizontal axis 1130 having pair values A"/B", C"/D", E"/F", G"/H", I"/J", K"/L", M"N" and O"/P". In some cases, the aggregate (e.g., addition) of each pair of values (e.g., value A" plus value B"; or value O" plus value P", etc.) represents the same sum or a first constant; and that first constant plus two times the spacing width W5 is a second constant (e.g., such as pitch width PW2). In some cases, the signal line width W1 and ground line width W4 vary in an inversely proportional manner to add up to the first constant, such as where if W1 increases by a value (e.g., W1+W"), W4 decreases by that value (e.g., W4-W"), and vice versa. In some cases, the signal line width W1 and ground line width W4 may be described as being inversely proportional. In some cases, (1) the second constant is signal line to signal lined pitch width PW2; and (2) the signal line width W1 and ground line width W4 vary in an inversely proportional manner so that the addition of W1+W4+2×W5=PW2 (e.g., the second constant).

In some cases, PW2 is between 100 and 200 um. In some cases, it is between 120 and 150 um. In some cases it is between 130 and 140 um. In some cases, pair values A"/B" represent width W1 between 60 and 80 um, and width W4 between 55 and 75 um; pair values O"/P" represent width W1 between 25 and 45 um, and width W4 between 90 and 110 um; and the other pairs are at linear intervals between values A"/B" and values O"/P". In some cases, pair values A"/B" represent width W1/width W4 of 70/65 um, pair values C"/D" represent width W1/width W4 of 65/70 um, pair values E"/F" represent width W1/width W4 of 60/75 um, pair values G"/H" represent width W1/width W4 of 55/80 um, pair values I"/J" represent width W1/width W4 of 50/85 um, pair values K"/L" represent width W1/width W4 of 45/90 um, pair values M"/N" represent width W1/width W4 of 40/95 um, and pair values O"/P" represent width W1/width W4 of 35/100 um.

In some cases, Y-axis 1120 represents eye-height or eye-width which are the figures of merit to quantify the channel performance of the tested signal line (e.g., RX line 138 or TX line 148); and X-axis 1130 is the combination of signal line width W1/width W4 (with constant spacing W5) at constant pitch (line width W1+width W4+2×W5=constant pitch PW, such as PW2). According to embodiments, the impedance tuning of horizontal signal line 138 or 148 of device 950 includes (or is) selecting (or "tuning") single horizontal routing signal line (e.g., TX and RX line) impedance, such as to select (or "tune" the TX and RX lines to or at) the combination of signal line width W1/width W4 to an optimized point to achieve the best channel performance as showed as the lowest cross point of EH or EW curves (e.g., such as shown in FIG. 11).

According to embodiments, the impedance tuning of horizontal signal line 138 or 148 of device 950 includes various possible selections of one or a range of locations on X-Axis 1130 selected based on or as a result of a calculation using EH and EW cross point 1112 and/or point 1117. It can be appreciated that such tuning may include selecting or identifying one or a range of width W1/width W4 along axis 1130 for one or both of (1) signal lines 138 and ground line pairs 560/562, or (2) signal lines 148 and ground line pairs 564/566, based on or as a result of a calculation using cross point 1112 and/or point 1117.

In some cases, such impedance tuning includes or is selecting the lowest amplitude cross point 1112 of eye height (EH) curves 1110-1112 or of eye width (EW) curves 1115-1116 of an eye diagram produced by testing one of signal lines 138 or 148. Here, for example, as shown in FIG. 11, X-axis 1130 location I"/J" which is under point 1112; or a location at midpoint between I"/J" and K"/L" which is under point 1112 may be chosen for width W1 and width W4 for one or both of (1) signal lines 138 and ground line pairs 560/562, or (2) signal lines 148 and ground line pairs 564/566. In some cases, one of those locations may be used for both of (1) signal lines 138 and ground line pairs 560/562, and (2) signal lines 148 and ground line pairs 564/566. In some cases, a range of width W1 and width W4 around either of those locations (e.g., a W1 and W4 tolerance, such as 5 or 10 percent around either location) may be used for both of (1) signal lines 138 and ground line pairs 560/562, and (2) signal lines 148 and ground line pairs 564/566. In some cases, a range of width W1 and width W4 between those locations (e.g., a W1 and W4 tolerance within that range or any location within that range) may be used for both of (1) signal lines 138 and ground line pairs 560/562, and (2) signal lines 148 and ground line pairs 564/566.

According to some embodiments, the impedance tuning includes or is selecting the lowest amplitude cross point 1112 and point 1117 produced by testing one of signal lines 138 or 148. Here, for example, as shown in FIG. 11, an X-axis 1130 location between (e.g., midpoint between, and average of, or another statistical calculation between) I"/J" which is under point 1112 and a midpoint between I"/J" and K"/L" which is under point 1112 may be chosen for width W1 and width W4 for one or both of (1) signal lines 138 and ground line pairs 560/562, or (2) signal lines 148 and ground line pairs 564/566. In some cases, the location between may be used for both of (1) signal lines 138 and ground line pairs 560/562, and (2) signal lines 148 and ground line pairs 564/566. In some cases, a range of width W1 and width W4 around the location between (e.g., a W1 and W4 tolerance, such as 5 or 10 percent around either location) may be used for both of (1) signal lines 138 and ground line pairs 560/562, and (2) signal lines 148 and ground line pairs 564/566. It can be appreciated that various other appropriate locations may be selected based on cross points 1112 and 1117.

It can be appreciated that such tuning as noted above may be for or represent tuning of a single one of, all of a level of, or all of (1) signal lines 138 and ground line pairs 560/562, or (2) signal lines 148 and ground line pairs 564/566 of device 950. It can be appreciated that such tuning as noted above may be represent by curves different than the convex curves 1110-1111 and 1115-1116 shown in FIG. 11, such as where the selected width W1/width W4 along axis 1130 is selected to be at the highest point of the different curve along the vertical axis 1120.

In some cases, this impedance tuning provides (e.g., by determining or identifying a range of or selected target width W1 and width W4 for both of (1) signal lines 138 and ground line pairs 560/562, or (2) signal lines 148 and ground line pairs 564/566): (1) the best channel performance for lines 138 and 148 (e.g., having length LP; width W1; width W4, pitch PW2 between the line and a horizontally adjacent horizontal data signal transmission line of device 950; and height H4 between the line and a vertically adjacent grounding line (or isolation plane) of device 950), (2) electrical isolation of horizontal data signal transmission lines (e.g., signal lines 138 and 148) that are single line impedance tuned in the routing segment of device 950 along the channel (e.g., signal lines 138 or 148 along length LP), and (3) minimized impedance discontinuity and crosstalk between vertically adjacent and horizontally adjacent ones of signal lines 138 or 148 of device 950.

In some cases, the tuning above includes separately tuning lines 138 and 148 of interposer 906, patch 904 and package 910. In some cases, it includes separately tuning lines 138 and 148 of interposer 906, patch 904 or package 910. In some cases, the tuning above includes tuning lines 138 and 148 of interposer 906 are tuned, but the signal lines of patch 904 and package 910 are not. In some cases, the width W1 and width W4 of interposer 906 are determined by tuning as noted above; and the width W1 and width W4 of patch 904 and package 910 are determined based on other factors, or design parameters that do not include the tuning noted above.

Figure 12:
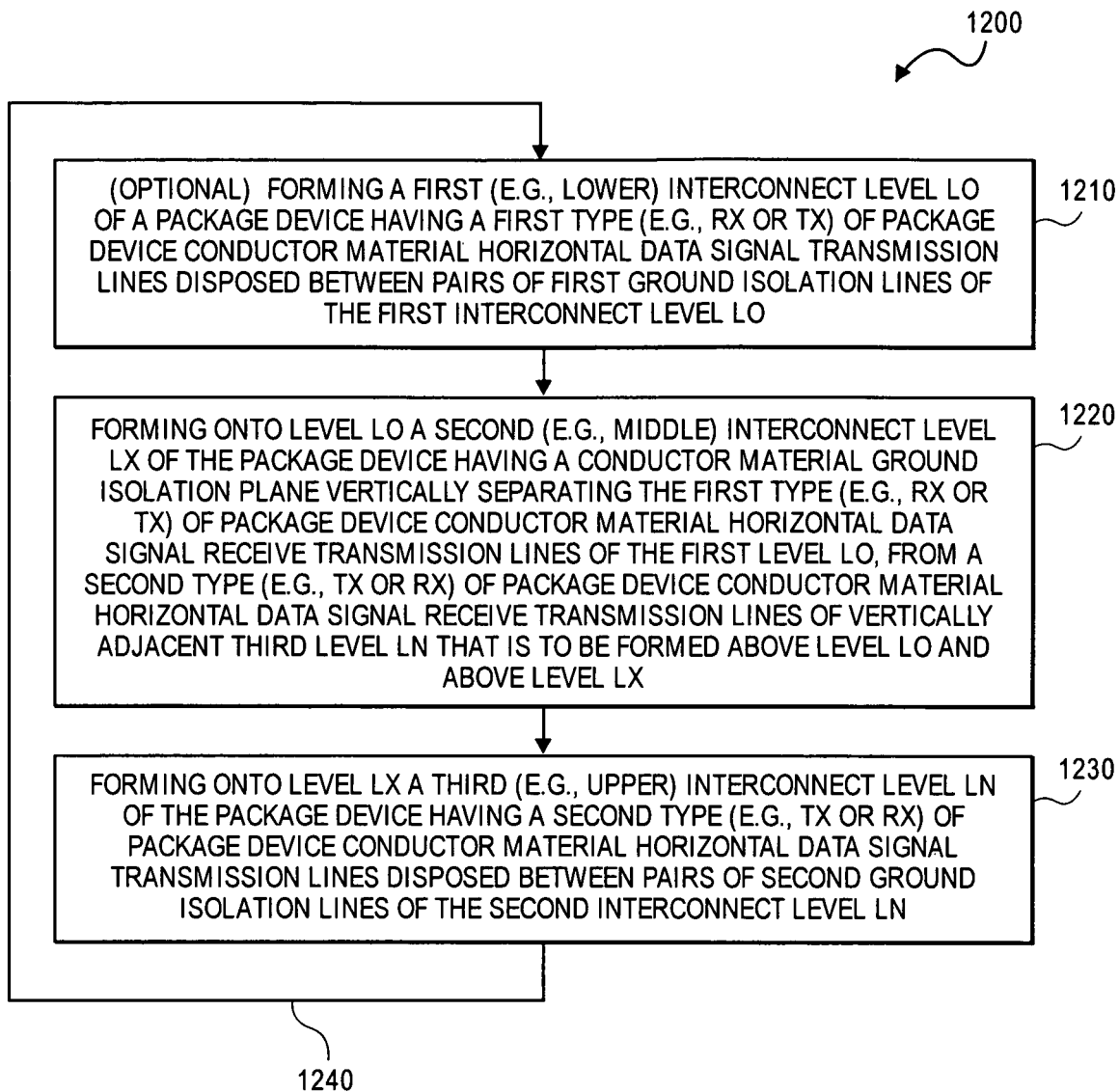
FIG. 12 is a flow chart illustrating a process for forming a combined horizontal ground isolation planes and ground isolation coaxial lines separated data signal line package, according to embodiments described herein.

FIG. 12 is a flow chart illustrating a process for forming a combined horizontal ground isolation planes and ground isolation coaxial lines separated data signal line package, according to embodiments described herein. FIG. 12 shows process 1200 which may be a process for forming embodiments described herein of package 950 of any of FIGS. 9-12. In some cases, process 1200 is a process for forming a ground isolated horizontal data signal transmission line package device that has ground isolation planes separating vertically adjacent levels of horizontal data signal receive and transmit lines; and ground isolation "coaxial" lines separating vertically adjacent and horizontally adjacent ones of horizontal data signal receive and transmit lines.

Process 1200 begins at optional block 1210 at which a first (e.g., lower) interconnect level Lo of a package device is formed, having a first type (e.g., RX or TX) of package device conductor material horizontal data signal transmission lines disposed between pairs of horizontally adjacent first ground isolation lines of the first interconnect level Lo. Block 1210 may also include forming first (e.g., lower) level Lo to have package device non-conductive material portions of the first interconnect level Lo disposed (e.g., horizontally adjacent) between each of the first type (e.g., RX or TX) of package device conductor material horizontal data signal receive transmission lines and each of the first ground isolation lines of the first interconnect level Lo.

Block 1210 may also include forming the first (e.g., lower) interconnect level Lo of the package device with a first level package device non-conductive material layer formed on (e.g., touching) or over a layer having the first type (e.g., RX or TX) of package device horizontal data signal lines, the first ground isolation lines, and the non-conductive material portions of the first interconnect level Lo.

In some cases, block 1210 includes forming non-conductive material layer 103a of the first (e.g., lower) interconnect level Lo (e.g., layer 630) on (e.g., touching) or over a layer (e.g., layer 632) having the first type TX horizontal data signal lines 148, first ground isolation lines 564, and non-conductive material portions 103b of first interconnect level Lo.

In some cases, block 1210 may only include forming lower layer 632 of level Lo with first type of data TX signal 148 lines disposed horizontally between dielectric material portions 103b which are disposed between horizontally adjacent first ground isolation lines 564 of the first interconnect level Lo; and then forming upper layer 630 of or having dielectric material onto layer 632.

A first example embodiment of block 1210 may include (e.g., prior to forming the upper layer 630), forming a mask (e.g., DFR, not shown) over a top surface of an upper layer 640 (e.g., of ajinomoto build up film (ABF)), the mask having (1) first openings over layer 640 in which to form the first type of data TX signal 148 lines of layer 632 and (2) second openings over layer 640 in which to form the horizontally adjacent first ground isolation lines 564. In some cases, the first openings may be horizontally open to and in communication with different, third openings in the mask over layer 640 in which data TX signal contacts or data TX signal via contacts will be formed. In some cases, the second openings may be horizontally open to and in communication with fourth openings in the mask over layer 640 in which ground signal contacts or via contacts will be formed.

Some of these cases may include electroless plating of a seed layer of the conductor material over layer 640, prior to forming the masks layer. In this case, block 810 may then include simultaneously forming conductive material (e.g., plating on the exposed seed layer of the openings) to form the data TX signal 148 lines and isolation lines 564 of layer 632 in the first and second openings (and optionally the data TX signal or via contacts in the third openings; and the ground signal contacts or via contacts in the fourth openings of layer 632).

In some of these cases, simultaneously forming the conductive material may include forming that conductive material of all of data TX signal 148 lines and isolation lines 564 of layer 632 (and optionally all of the data TX signal or via contacts; and the ground signal contacts or via contacts of layer 632) during the same process, deposition or growth of that conductive material in the first and second (and optionally third and fourth) openings. In some cases, simultaneously forming the conductive material includes electrolytic plating of conductor material in the first and second (and optionally third and fourth) openings (e.g., on the electroless plating of seed layer).

In some cases of these, after simultaneously forming the conductive material, the mask (e.g., DFR) is removed. This removal may also include removing the seed layer from between the openings. Then dielectric material 103b (e.g., of ajinomoto build up film (ABF)) may be deposited where the mask was removed. In some cases, forming the mask includes forming a blanket layer of mask material and etching the blanket layer to form the first (and optionally second) openings.

Next, at block 1220 a second (e.g., middle) level Lx of the package device is formed over or onto (e.g., touching) level Lo; level Lx having a conductor material (e.g., pure conductor or metal) ground isolation plane vertically separating the first type (e.g., RX or TX) of package device conductor material horizontal data signal transmission lines of the first level Lo, from a second type (e.g., TX or RX; the opposite of the first type RX or TX, respectively) of package device conductor material horizontal data signal transmission lines (e.g., a second type of data signal lines or traces, such as TX or RX data signal lines disposed between package device non-conductive material portions) of vertically adjacent level Ln that is to be formed above level Lo (and above level Lx).

In some cases, block 1220 may only include forming lower layer 216 of level Lx having a conductor material ground isolation plane 162 onto upper layer 630 of level Lo; and forming upper layer 915 of level Lx of dielectric material layer 103a. In some cases, block 1220 includes first forming lower layer 216 onto layer 630 (e.g., as noted above), then forming upper layer 915 of or having dielectric material 103a onto layer 216.

A first example embodiment of block 1220 may include (e.g., prior to forming the upper layer 915), forming a mask (e.g., DFR, not shown) over a top surface of upper layer 630 (e.g., of ajinomoto build up film (ABF) of level Lo, the mask having (1) a first opening over layer 630 in which to form isolation plane 162 of layer 216. In some cases, the first opening may be horizontally open to and in communication with different, second openings in the mask over layer 630 in which ground contacts or ground vial contacts will be formed. Some of these cases may include electroless plating of a seed layer of the conductor material over layer 630, prior to forming the masks layer.

In this case, block 1220 may then include simultaneously forming conductive material (e.g., plating on the exposed seed layer of the openings) to form the isolation plane 162 of layer 216 in the first openings (and optionally the ground contacts or ground vial contacts in the second openings of layer 216).

In some of these cases, simultaneously forming the conductive material may include forming that conductive material of all of isolation plane 162 of layer 216 (and optionally all of the ground contacts or ground vial contacts in the second openings of layer 216) during the same process, deposition or growth of that conductive material in the first (and optionally second) openings. In some cases, simultaneously forming the conductive material includes electrolytic plating of conductor material in the first (and optionally second) openings (e.g., on the electroless plating of seed layer).

In some cases of these, after simultaneously forming the conductive material, the mask is removed. This removal may also include removing the seed layer from between the openings. Then dielectric material (e.g., of ajinomoto build up film (ABF)) may be deposited where the mask was removed. In some cases, forming the mask includes forming a blanket layer of mask material and etching the blanket layer to form the first (and optionally second) openings.

Next, at block 1230 a third (e.g., upper) interconnect level Ln of the package device is formed over or onto (e.g., touching) level Lx; level Ln having a second type (e.g., TX or RX; the opposite of the first type RX or TX, respectively) of package device conductor material horizontal data signal transmission lines disposed between pairs of horizontally adjacent second ground isolation lines of the second interconnect level Ln. In some cases, block 1230 includes forming the third level so that the second type of transmission lines of third level Ln are horizontally offset to be directly above the first ground isolation lines of the first interconnect level Lo. Block 1230 may also include forming third level Ln to have package device non-conductive material portions of level Ln disposed (e.g., horizontally adjacent) between each of the second type (e.g., TX or RX) of package device conductor material horizontal data signal transmission lines and each of the second ground isolation lines of level Ln.

Block 1230 may also include forming level Ln of the package device with a third level package device non-conductive material layer formed on (e.g., touching) or over a layer having the second type (e.g., TX or RX) of package device horizontal data signal lines, the second ground isolation lines, and the non-conductive material portions of level Ln.

In some cases, block 1230 includes forming non-conductive material layer 103*a* of the third interconnect level Ln (e.g., layer 620) on (e.g., touching) or over a layer (e.g., layer 622) having the second type RX horizontal data signal lines 138, second ground isolation lines 562, and non-conductive material portions 103*b* of second interconnect level Ln of package device 950.

In some cases, block 1230 may only include forming lower layer 622 of level Ln with second type of data RX signal 138 lines disposed horizontally between dielectric material portions 103*b* which are disposed between horizontally adjacent second ground isolation lines 562 of the second interconnect level Ln; and then forming upper layer 620 of or having dielectric material onto layer 622.

A first example embodiment of block 1230 may include (e.g., prior to forming the upper layer 620), forming a mask (e.g., DFR, not shown) over a top surface of upper layer 915 (e.g., of ajinomoto build up film (ABF) of level Lx, the mask having (1) first openings over layer 915 in which to form the second type of data RX signal 138 lines of layer 622 and (2) second openings over layer 915 in which to form the horizontally adjacent second ground isolation lines 562. In some cases, the first openings may be horizontally open to and in communication with different, third openings in the mask over layer 915 in which data RX signal contacts or via contacts will be formed. In some cases, the second openings may be horizontally open to and in communication with fourth openings in the mask over layer 915 in which ground signal contacts or via contacts will be formed.

Some of these cases may include electroless plating of a seed layer of the conductor material over layer 915, prior to forming the masks layer. In this case, block 1230 may then include simultaneously forming conductive material (e.g., plating on the exposed seed layer of the openings) to form the second type of data RX signal 138 and isolation lines 562 of layer 622 in the first and second openings (and optionally the data RX signal or via contacts in the third openings; and the ground signal contacts or via contacts in the fourth openings of layer 622).

In some of these cases, simultaneously forming the conductive material may include forming that conductive material of all of second type of data RX signal 138 and isolation lines 562 of layer 622 (and optionally all of the data RX signal or via contacts; and the ground signal contacts or via contacts of layer 622) during the same process, deposition or growth of that conductive material in the first and second (and optionally third and fourth) openings. In some cases, simultaneously forming the conductive material includes electrolytic plating of conductor material in the first and second (and optionally third and fourth) openings (e.g., on the electroless plating of seed layer).

In some cases of these, after simultaneously forming the conductive material, the mask (e.g., DFR) is removed. This removal may also include removing the seed layer from between the openings. Then dielectric material 103*b* (e.g., of ajinomoto build up film (ABF)) may be deposited where the mask was removed. In some cases, forming the mask includes forming a blanket layer of mask material and etching the blanket layer to form the first (and optionally second) openings.

In some performances of process 1200, optional block 1210 is performed twice, once, first, to form a "zero" (e.g., lowest; "zero" indicating below the first level Lo) level Lq of the package device, and then repeated to form level Lo. The first performance of block 1210 forms a zero (e.g., lowest) interconnect level Lq of a package device, prior to forming level Lo, where level Lq is formed having the first type (e.g., RX or TX) of package device conductor material horizontal data signal transmission lines disposed between pairs of horizontally adjacent zero ground isolation lines of level Lq; where the first type of transmission lines of level Lq are horizontally offset to be directly below the first ground isolation lines of level Lo; and where the first and zero ground isolation lines and the ground isolation plane (e.g., of the lowest, lower and middle levels) coaxially surround each of the first type of data signal transmission lines of the first level Lo.

This first performance of block 1210 may also include forming level Lq to have package device non-conductive material portions of level Lq disposed (e.g., horizontally adjacent) between each of the first type (e.g., RX or TX) of package device conductor material horizontal data signal receive transmission lines and each of the zero ground isolation lines of level Lq.

This first performance of block 1210 may also include forming level Lq of the package device with a zero level package device non-conductive material layer formed on (e.g., touching) or over a layer having the first type (e.g., RX or TX) of package device horizontal data signal lines, the zero ground isolation lines, and the non-conductive material portions of level Lq.

In some cases, this first performance of block 1210 includes forming non-conductive material layer 103*a* of the first (e.g., lower) interconnect level Lq (e.g., layer 640) on (e.g., touching) or over a layer (e.g., layer 642) having the first type TX horizontal data signal lines 148, zero ground isolation lines 566, and non-conductive material portions 103*b* of level Lq.

In some performances of process 1200, block 1230 is performed twice, once, first, to form second level Ln, and then repeated to form third (e.g., uppermost or top) level Lm of the package device. The repeat or second performance of block 1230 forms a third (e.g., uppermost) interconnect level Lm of a package device, after forming level Ln, where level Lm is formed having the second type (e.g., TX or RX) of package device conductor material horizontal data signal transmission lines disposed between pairs of horizontally adjacent third ground isolation lines of level Lm; where the second type of transmission lines of level Lm are horizontally offset to be directly above the second ground isolation lines of level Ln; and where the second and third ground isolation lines and the ground isolation plane (e.g., of the uppermost, upper and middle levels) coaxially surround each of the second type of data signal transmission lines of the second level Ln.

This second performance of block 1230 may also include forming level Lm to have package device non-conductive material portions of level Lm disposed (e.g., horizontally adjacent) between each of the second type (e.g., TX or RX) of package device conductor material horizontal data signal receive transmission lines and each of the third ground isolation lines of level Lm.

This second performance of block 1230 may also include forming level Lm of the package device with a third level package device non-conductive material layer formed on (e.g., touching) or over a layer having the second type (e.g., TX or RX) of package device horizontal data signal lines, the third ground isolation lines, and the non-conductive material portions of level L.

In some cases, this second performance of block 1230 includes forming non-conductive material layer 103*a* of level Lm (e.g., layer 610) on (e.g., touching) or over a layer (e.g., layer 612) having the second type RX horizontal data signal lines 138, third ground isolation lines 560, and non-conductive material portions 103*b* of level Lm.

In some cases of process 1200, block 1210 is performed twice as noted above, and then block 1220 is performed once, but block 1230 is not performed. In some cases of process 1200, block 1210 is not performed, block 1220 is performed once, and then block 1230 is performed twice as noted above. In some cases of process 1200, block 1210 is performed twice as noted above, and then block 1220 is performed once, and then block 1230 is performed twice as noted above.

Next, at return arrow 1240, process 1200 may continue by returning to another performance of blocks 1210, 1220 and 1230 as noted above to form more levels of signal lines located between ground isolation lines, and levels having ground planes. Process 1200 may continue this way until a predetermined or sufficient number of levels or performances of processes 1200 are completed to form a desired package device 950. In some cases, it may repeat 3 to 10 times.

Next, in a first example case of process 1200, block 1210 may only include forming layer 632 as described herein; block 1220 may only include forming layer 216 as described herein; and block 1230 may only include forming layer 622 as described herein. In a second example case, block 1210 may include forming layers 630 and 632 as described herein; block 1220 may include forming layers 910 and 216 as described herein; and block 1230 may include forming layers 620 and 622 as described herein.

It can be appreciated that although FIGS. 9-12 show and corresponding descriptions describe for level Lm having RX signal lines, level Ln having RX signal lines, level Lo having TX signal lines, and level Lq having TX signal lines, the figures and descriptions also apply to embodiments where the TX and RX of those signal lines may be reversed. It can be appreciated that although FIGS. 9-12 show and corresponding descriptions describe embodiments for level Lm having RX signal lines, level Ln having RX signal lines, level Lo having TX signal lines, and level Lq having TX signal lines, the figures and descriptions also apply to embodiments where there are only one level of vertically adjacent RX and TX signals (e.g., level Ln is TX and level Lo is RX signals), each level having ground isolation lines and offset as noted herein (e.g., such as in FIGS. 1-4). For example, level Lm may be RX signal lines, while level Ln has TX signal lines, level Lo may be RX signal lines, while level Lq has TX signal lines. In some cases, the TX and RX of those signal lines of that example may be reversed. In some embodiments, there may be three levels of vertically adjacent RX and TX signals, each level having ground isolation lines and offset as noted herein.

It can be appreciated that although FIGS. 9-12 show and corresponding descriptions describe embodiments for levels having RX signal lines and TX signal lines, the figures and descriptions also apply to embodiments where other types of information, clock, timing, alternating current (AC) or data signals can be on those signal lines.

In some cases, levels Lj-Ll of FIGS. 1-4, or levels Lm-Lq of FIGS. 5-8, or levels Lm-Ly of FIGS. 9-12 may be levels within a package device (e.g., package device 150, 550 or 950) that are not the top or topmost 3, 5 or 6 levels. In some cases, these levels may be levels within a package device that are not the bottom or bottommost 3, 5 or 6 levels. In some cases they are not either. In some cases, these levels may be levels within a package device that are not considered to be a "top" or "bottom" layer such as an exposed layer (e.g., a final build-up (BU) layer, BGA, LGA, or die-backend-like layer) to which an IC chip (e.g., such as microprocessor, coprocessor, graphics processor, memory chip, modem chip, or other microelectronic chip devices), a socket, an interposer, a motherboard, or another next-level component will be mounted or directly attached. In some cases, these levels may be levels within a package device where horizontal signal transmission lines or traces are known to exist or extend horizontally form one to another horizontal location. In some cases, these levels may be levels within a package device that are between 3 and 30 levels from the top (e.g., exposed) level of the device. In some cases, these levels may be levels within a package device that are below a ground plane or a level 5 levels from the top (e.g., exposed) level of the device.

It can be appreciated that there may be additional levels above and/or below levels Lj-Ll of FIGS. 1-4, or levels Lm-Lq of FIGS. 5-8, or levels Lm-Ly of FIGS. 9-12. Also, more data signal lines may exist in these levels, such as additional lines 138 and 148 that are beside the ground isolation lines and have non-conductor portions between the additional lines as described.

In some embodiments, the level L5 from the top will include or be a solid ground plane 160 or a ground plane formed onto level Lm of FIGS. 5-8. In some embodiments, level L6, below level L5 will be a solid planar ground layer 160 or a ground plane formed onto level Lm of FIGS. 5-8.

In some cases, chip 102, chip 108 and chip 109 may each represent an integrated circuit (IC) chip or "die" such as a computer processing unit (CPU), microprocessor, coprocessor, graphics processor, memory chip, modem chip, or other microelectronic chip device. In some cases, chip 102 is an integrated circuit (IC) chip computer processing unit (CPU), microprocessor, or coprocessor. In some cases, chip 108 is an integrated circuit (IC) chip that is a coprocessor, graphics processor, memory chip, fabric controller chip, network interface chip, switch chip, accelerator chip, field programmable gate array (FPGA) chip, or application-specific integrated circuit (ASIC) chip device. In some cases, chip 109 is an integrated circuit (IC) chip coprocessor, graphics processor, memory chip, modem chip, communication output signal chip device, fabric controller chip, network interface chip, switch chip, accelerator chip, field programmable gate array (FPGA) chip, or application-specific integrated circuit (ASIC) chip.

For some embodiments, chips 102, 108 and/or 109 are not included. Some embodiments include only patch 104, interposer 106 and package 110 as described herein. Some embodiments include only patch 504, interposer 506 and package 510 as described herein. Some embodiments include only patch 904, interposer 906 and package 910 as described herein.

For some embodiments, only patch 104, 504 or 904 is included (e.g., chip 102 and interposer 106 are not included). For some embodiments, only interposer 106, 506 or 906 is included (e.g., patch 104 and package 110, 510 or 910 are not included). For some embodiments, only package 110, 510 or 910 is included (e.g., chips 108 and 109; and interposer 106, 506 or 906 are not included). Some embodiments include only package device 150, 550, or 950 as described herein. For some embodiments, only package device 150 is included. For some embodiments, only package device 550 is included. For some embodiments, only package device 950 is included.

In some cases, a pitch width (PW1 or PW2 is defined along width W3) between adjacent (a signal line and the signal lined immediately to the left or right of that signal line) data signal transmission lines of FIGS. 1-12 may be between 100 and 150 um. In, some cases it is between 50 and 300 um. This pitch may represent a distance (e.g., average or design rule) between the center point of two adjacent transmission lines. In some cases, it is approximately 110 micrometers (110×E-6 meter-"um"). In some cases, it is between 100 and 120 micrometers (um). In some cases, it is between 60 and 200 micrometers.

It is also considered that levels above and below levels Lj-Ll of FIGS. 1-4, or levels Lm-Lq of FIGS. 5-8, or levels Lm-Ly of FIGS. 9-12 may include various interconnect layers, packaging layers, conductive features (e.g., electronic devices, interconnects, layers having conductive traces, layers having conductive vias), layers having dielectric material and other layers as known in the industry for a semiconductor package device. In some cases, the package may be cored or coreless. In some cases, the package includes features formed according to a standard package substrate formation processes and tools such as those that include or use: lamination of dielectric layers such as ajinomoto build up films (ABF), laser or mechanical drilling to form vias in the dielectric films, lamination and photolithographic patterning of dry film resist (DFR), plating of conductive traces (CT) such as copper (Cu) traces, and other build-up layer and surface finish processes to form layers of electronic conductive traces, electronic conductive vias and dielectric material on one or both surfaces (e.g., top and bottom surfaces) of a substrate panel or peelable core panel. The substrate may be a substrate used in an electronic package device or a microprocessor package.

In some cases, any or all of levels Lj-Ll of FIGS. 1-4, or levels Lm-Lq of FIGS. 5-8, or levels Lm-Ly of FIGS. 9-12 may also include such structures noted above for package 150, 550 or 950, thought not shown in FIGS. 1-12. In some cases, the contacts and/or traces of these levels are electrically connected to (e.g., physically attached to or formed onto) the conductive structures noted above for package 150, 550 or 950.

Devices 150, 550 or 950 may have features having standard package pitch as known for a semiconductor die package, chip package; or for another device (e.g., interface, PCB, or interposer) typically connecting a die (e.g., IC, chip, processor, or central processing unit) to a socket, a motherboard, or another next-level component. In some embodiments, the pitch is determined by a standard package design rule (DR) or chip package as known. In some cases, that pitch is a line spacing (e.g., the actual value of the line widths and spaces between lines on the layers) or design rules (DR) of a feature (e.g., conductive contact, or trace) that is between 9 and 12 micrometers.

Lines 138, 148; planes 160, 162 and 164; and lines 560, 562, 564 and 566 may be formed within their described width, length and height of solid conductive material. The conductive material may be a pure conductor (e.g., a metal or pure conductive material). Such material may be or include copper (Cu), gold, silver, bronze, nickel, silver, aluminum, molybdenum, an alloy, or the like as known for such a contact. In some cases, they are all solid copper.

In some cases, the formation of lines 138, 148; planes 160, 162 and 164; and lines 560, 562, 564 and 566 (all of which, together, may be described below as "planes and lines" or "conductor material features") may be by processes know for typical chip package manufacturing processes (e.g., known in the industry for a semiconductor package device). In some cases, these conductor material features are formed according to a standard package substrate formation processes and tools such as those that include or use: lamination of dielectric layers such as ajinomoto build up films (ABF), curing, laser or mechanical drilling to form vias in the dielectric films, desmear of seed conductor material, lamination and photolithographic patterning of dry film resist (DFR), plating of conductive traces (CT) such as copper (Cu) traces, and other build-up layer and surface finish processes to form layers of electronic conductive traces, electronic conductive vias and dielectric material on one or both surfaces (e.g., top and bottom surfaces) of a substrate panel or peelable core panel. The substrate may be a substrate used in an electronic package device or a microprocessor package.

In some cases, these conductor material features are formed as a blanket layer of conductor material (e.g., a pure conductive material) that is masked and etched to form openings where dielectric material (e.g., 103, such as 103a-103i) will be deposited, grown or formed (and leave portions of the conductor material where the contacts, traces and webbing are now formed). Alternatively, the conductor material may be a layer (e.g., portions of a blanket layer) that is formed in openings existing through a patterned mask (e.g., ABF and/or dry film resist), and the mask then removed (e.g., dissolved or burned) to form the lines and planes (e.g., as conductor material remaining in the openings after removal of the mask). Such forming of the planes and lines may include plating or growing the conductor material such as an electrolytic layer of metal or conductor grown from a seed layer of electroless metal or conductor to form the planes and lines.

Layers of dielectric 103 (e.g., layers 103a-103i) may each be a height H2, H3 or H4 for a layer of solid non-conductive material. The dielectric material may be a pure non-conductor (e.g., a pure non-conductive material). Such material may be or include ajinomoto build up films (ABF), cured resin, dry film lamination, porcelain, glass, plastic, or the like as known for such a dielectric. In some cases it is ajinomoto build up films (ABF) and/or dry film lamination.

In some cases, the dielectric may be a blanket layer of dielectric material (e.g., a non-conductive insulator material) that is drilled, or masked and etched to form openings where the contacts, traces and webbing are deposited, grown or formed (e.g., the remaining material is "non-conductor material features") by processes know for typical chip package manufacturing processes (e.g., known in the industry for a semiconductor package device). In some cases, these non-conductor material features are formed according to a standard package substrate formation processes and tools such as those that include or use: lamination of dielectric layers such as ajinomoto build up films (ABF), curing, laser or mechanical drilling to form vias in the dielectric films, desmear of seed conductor material, lamination and photolithographic patterning of dry film resist (DFR), plating of conductive traces (CT) such as copper (Cu) traces, and other build-up layer and surface finish processes to form layers of electronic conductive traces, electronic conductive vias and dielectric material on one or both surfaces (e.g., top and bottom surfaces) of a substrate panel or peelable core panel. The substrate may be a substrate used in an electronic package device or a microprocessor package.

Alternatively, the dielectric may be a layer that is formed on a patterned mask, and the mask then removed (e.g., dissolved or burned) to form openings where the contacts, traces, lines and planes are deposited, grown or formed. Such forming of the dielectric layer, or portions may include or be depositing the dielectric material such as by vacuum lamination of ABF, or dry film lamination such as from or on a lower surface of a dielectric material (e.g., that may be the same type of material or a different type of dielectric material) to form the layer or portions. In some cases, the dielectric layer, portions of dielectric structure, or openings in dielectric layer may be formed by a process known to form such dielectric of a package or chip package device.

In some cases, any or all of the cross sectional length view shapes of lines 138 and lines 148 (e.g., height H3×width W1) is shown as a square or rectangular shape (e.g., see FIGS. 2A, 6A and 10A) it is considered that these shapes may instead be or represent a circle (e.g., having a diameter of H3 or W1); or an oval, a triangle, a rhombus, a trapezoid, or a polygon (e.g., having a maximum height of H3 and maximum width of W1). Also, in some cases, any or all of the cross sectional length view shapes of portions 103b, 103e and 103h of FIG. 2A (e.g., height H3×width W2) is shown as a square or rectangular shape it is considered that these shapes may instead be or represent a circle (e.g., having a diameter of H3 or W2); or an oval, a triangle, a rhombus, a trapezoid, or a polygon (e.g., having a maximum height of H3 and maximum width of W2). Next, in some cases, any or all of the cross sectional length view shapes of portions 103b of FIGS. 6A and 10A (e.g., height H3×width W5) is shown as a square or rectangular shape it is considered that these shapes may instead be or represent a circle (e.g., having a diameter of H3 or W5); or an oval, a triangle, a rhombus, a trapezoid, or a polygon (e.g., having a maximum height of H3 and maximum width of W5). Finally, in some cases, any or all of the cross sectional length view shapes of lines 560, 562, 564, and 566 of FIGS. 6A and 10A (e.g., height H3×width W4) is shown as a square or rectangular shape it is considered that these shapes may instead be or represent a circle (e.g., having a diameter of H3 or W4); or an oval, a triangle, a rhombus, a trapezoid, or a polygon (e.g., having a maximum height of H3 and maximum width of W4).

In some cases, embodiments of (e.g., packages, systems and processes for forming) package devices 150, 550 and 950, such as described for FIGS. 1-12, provide quicker and more accurate data signal transfer between the two IC's attached to a package by including ground isolation planes; lines; or planes and lines of package devices 150, 550 and 950 that reduce signal line crosstalk, and increase signal line isolation (e.g., see FIGS. 1, 5 and 9). In some cases, embodiments of processes for forming package devices 150, 550 and 950, or embodiments of package devices 150, 550 and 950 provide a package device having better components for providing high frequency transmit (e.g., through lines 148) and receive (e.g., through lines 138) data signals between horizontal endpoints of those lines (e.g., see FIGS. 1, 5 and 9). The components may be better due to the addition of the ground isolation planes; lines; or planes and lines of package devices 150, 550 and 950.

In some cases, embodiments of processes for forming package devices 150, 550 and 950, or embodiments of package devices 150, 550 and 950 provide the benefits embodied in computer system architecture features, package devices and interfaces made in high volumes (e.g., see FIGS. 1, 5 and 9). In some cases, embodiments of such processes and devices provide all the benefits of solving very high frequency data transfer interconnect problems, such as between two IC chips or die (e.g., where hundreds even thousands of signals between two die need to be routed), or for high frequency data transfer interconnection within a system on a chip (SoC) (e.g., see FIGS. 1, 5 and 9). In some cases, embodiments of such processes and devices provide the demanded lower cost high frequency data transfer, interconnects solution that is needed across the above segments (e.g., see FIGS. 1, 5 and 9). These benefits may be due to the addition of the ground isolation planes; lines; or planes and lines of package devices 150, 550 and 950.

In addition to this, such processes and devices can provide for direct and local data signal delivery to both chips. In some cases, embodiments of such processes and devices provide communication between two IC chips or board ICs including memory, modem, graphics, and other functionality, directly attached to each other (e.g., see FIGS. 1, 5 and 9). These processes and devices provide increased input/output (IO) frequency data transfer at lower cost. These provisions and increases may be due to the addition of the conductive material ground isolation planes; lines; or planes and lines of package devices 150, 550 and 950.

Figure 13:
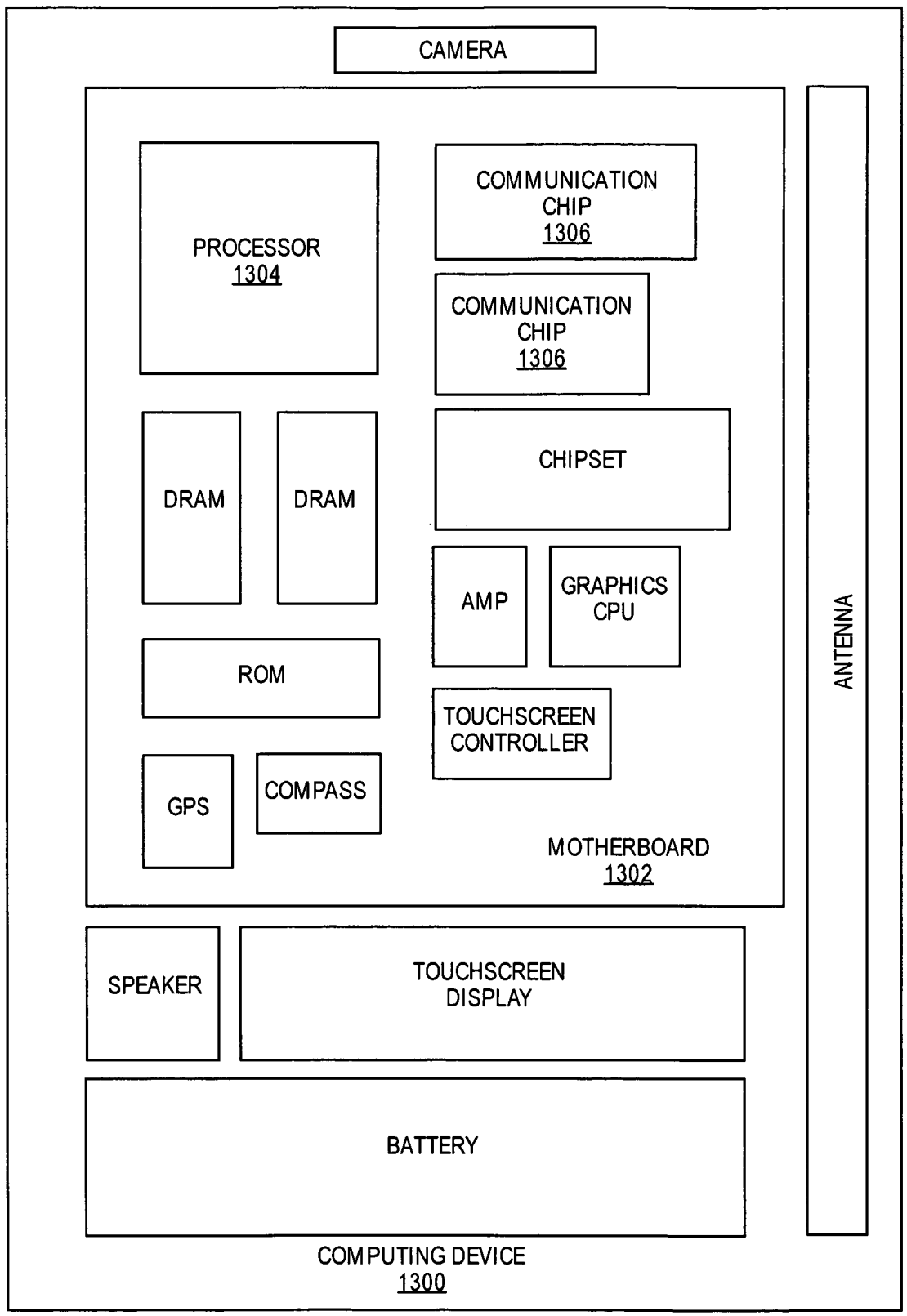
FIG. 13 illustrates a computing device in accordance with one implementation.

FIG. 13 illustrates a computing device in accordance with one implementation. FIG. 13 illustrates computing device 1300 in accordance with one implementation. Computing device 1300 houses board 1302. Board 1302 may include a number of components, including but not limited to processor 1304 and at least one communication chip 1306. Processor 1304 is physically and electrically coupled to board 1302. In some implementations at least one communication chip 1306 is also physically and electrically coupled to board 1302. In further implementations, communication chip 1306 is part of processor 1304.

Depending on its applications, computing device 1300 may include other components that may or may not be physically and electrically coupled to board 1302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 1306 enables wireless communications for the transfer of data to and from computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 1306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1300 may include a plurality of communication chips 1306. For instance, first communication chip 1306 may be dedicated to shorter range wireless communications such as Wi-Fi and Bluetooth and second communication chip 1306 may be dedicated to longer range wireless communications such as GPS, EDGE, GPRS, CDMA, WiMAX, LTE, Ev-DO, and others.

Processor 1304 of computing device 1300 includes an integrated circuit die packaged within processor 1304. In some implementations, the integrated circuit die of the processor includes one or more devices, such as transistors or metal interconnects. In some embodiments, the package of the integrated circuit die or processor 1304 includes embodiments of processes for forming package devices 150, 550 and 950, or embodiments of package devices 150, 550 and 950 as described herein. The term "processor" may refer to any device or portion of a device that processes electronic data from registers and/or memory to transform that electronic data into other electronic data that may be stored in registers and/or memory.

Communication chip 1306 also includes an integrated circuit die packaged within communication chip 1306. In accordance with another implementation, the integrated circuit die of the communication chip includes one or more devices, such as transistors or metal interconnects. In some embodiments, the package of the integrated circuit die or chip 606 includes embodiments of processes for forming package devices 150, 550 and 950, or embodiments of package devices 150, 550 and 950 as described herein.

In further implementations, another component housed within computing device 600 may contain an integrated circuit die that includes one or more devices, such as transistors or metal interconnects. In some embodiments, the package of the other integrated circuit die or chip includes embodiments of processes for forming package devices 150, 550 and 950, or embodiments of package devices 150, 550 and 950 as described herein.

In various implementations, computing device 1300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 1300 may be any other electronic device that processes data.

EXAMPLES

The following examples pertain to embodiments.

Example 1 is a ground isolated horizontal data signal transmission line package device including a first interconnect level having a first level lower layer with first level first type of data signal lines, the first level first type of data signal lines disposed between (1) horizontally adjacent first level non-conductive material portions that are disposed between (2) horizontally adjacent first level ground isolation lines of conductor material; a second interconnect level below the first interconnect level; the second interconnect level having a second level lower layer with second level second type of data signal lines, the second level second type of data signal lines disposed between (1) horizontally adjacent second level non-conductive material portions that are disposed between (2) horizontally adjacent second level ground isolation lines of conductor material; the second level ground isolation lines horizontally offset to cause each of the second level ground isolation lines to be centered directly under each of the first level first type of data signal lines; and a third interconnect level between the first interconnect level and the second interconnect level; the third interconnect level having a third level lower layer with a third level ground isolation plane structure disposed between the first level first type of data signal contacts and the second level second type of data signal contacts.

In Example 2, the subject matter can optionally include the package device of Example 1 further including the first interconnect level having a first level upper layer having dielectric material formed onto the first level lower layer; the first level lower layer formed onto a third level upper layer having dielectric material; the third level upper layer formed onto the third level lower layer; the third level lower layer formed onto a second level upper layer having dielectric material; the first level lower layer having first level ground contacts directly connected to the first level ground isolation lines; the second level lower layer having second level ground contacts directly connected to the second level ground isolation lines; and the third level lower layer having third level ground contacts directly connected to the third level ground isolation plane structure.

In Example 3, the subject matter can optionally include the package device of Example 2 further including a forth interconnect level below the second interconnect level; the fourth interconnect level having a fourth level lower layer with fourth level second type of data signal lines, the fourth level second type of data signal lines disposed between (1) horizontally adjacent fourth level non-conductive material portions that are disposed between (2) horizontally adjacent fourth level ground isolation lines of conductor material; and the fourth level ground isolation lines horizontally offset to cause each of the fourth level ground isolation lines to be centered directly under each of the second level second type of data signal lines.

In Example 4, the subject matter can optionally include the package device of Example 3 further including the second level lower layer formed onto a fourth level upper layer having dielectric material; the fourth level upper layer formed onto the fourth level lower layer; and the fourth level lower layer having fourth level ground contacts directly connected to the fourth level ground isolation lines.

In Example 5, the package device of Example 1, the first type of data signal lines being one of receive data signal lines or transmit data signal lines configured to communicate data to a device at a frequency of between 7 and 25 gigatransfers per second (GT/s); the second type of data signal lines being one of transmit data signal lines and receive data signal lines configured to communicate data to a device at a frequency of between 7 and 25 gigatransfers per second (GT/s); and the second type of data signal lines being a different type than the first type.

In Example 6, the subject matter can optionally include the package device of Example 5, the second level ground isolation lines configured to decrease crosstalk between the second level second type of data signal contacts; the second level ground isolation lines configured to reduce crosstalk between the first level first type of data signal contacts and the fourth level second type of data signal contacts; and the third level ground isolation plane structure configured to reduce crosstalk between the first level first type of data signal contacts and the second level second type of data signal contacts.

In Example 7, the subject matter can optionally include the package device of Example 1, the first and second type of data signal lines being impedance tuned using eye heights and widths of an eye diagram to determine a width of the first and second type of data signal lines and a spacing between horizontally adjacent ones of the first and second type of data signal lines.

Example 8 is a system for communicating with an integrated circuit (IC) chip including the IC chip mounted on a ground isolated horizontal data signal transmission line package device, the ground isolated horizontal data signal transmission line package device including a first interconnect level having a first level lower layer with first level first type of data signal lines, the first level first type of data signal lines disposed between (1) horizontally adjacent first level non-conductive material portions that are disposed between (2) horizontally adjacent first level ground isolation lines of conductor material; a second interconnect level below the first interconnect level; the second interconnect level having a second level lower layer with second level second type of data signal lines, the second level second type of data signal lines disposed between (1) horizontally adjacent second level non-conductive material portions that are disposed between (2) horizontally adjacent second level ground isolation lines of conductor material; the second level ground isolation lines horizontally offset to cause each of the second level ground isolation lines to be centered directly under each of the first level first type of data signal lines; a third interconnect level between the first interconnect level and the second interconnect level; the third interconnect level having a third level lower layer with a third level ground isolation plane structure disposed between the first level first type of data signal contacts and the second level second type of data signal contacts; and data signal contacts of the IC chip electrically coupled to the first type of data signal lines and to the second type of data signal lines of the ground isolated horizontal data signal transmission line package device.

In Example 9, the subject matter can optionally include the system of Example 8 wherein ground contacts of the IC chip are electrically coupled to the first level ground isolation lines, to the second level ground isolation lines, and to the third level ground isolation plane structure of the package device; and wherein the first level ground isolation lines.

In Example 10, the subject matter can optionally include the system of Example 9 wherein the second level ground isolation lines and the third level ground isolation plane structure are configured to provide quicker and more accurate data signal transfer through the first type of data signal lines and through the second type of data signal lines of the ground isolated horizontal data signal transmission line package device.

In Example 11, the subject matter can optionally include the system of Example 8, wherein the IC chip is a first IC chip and the system further including a second IC chip mounted on the package structure; data signal contacts of the second IC chip electrically coupled to the first type of data signal lines and to the second type of data signal lines of the ground isolated horizontal data signal transmission line package device; and wherein the first type of data signal lines and the second type of data signal lines of the ground isolated horizontal data signal transmission line package device are configured to communicate data signals between the first IC chip and the second IC chip.

In Example 12, the subject matter can optionally include the system of Example 8, the first type of data signal lines being one of receive data signal lines or transmit data signal lines configured to communicate data to a device at a frequency of between 7 and 25 gigatransfers per second (GT/s); the second type of data signal lines being one of transmit data signal lines and receive data signal lines configured to communicate data to a device at a frequency of between 7 and 25 gigatransfers per second (GT/s); and the second type of data signal lines being a different type than the first type; and wherein the second level ground isolation lines configured to decrease crosstalk between the second level second type of data signal contacts; wherein the second level ground isolation lines configured to reduce crosstalk between the first level first type of data signal contacts and the fourth level second type of data signal contacts; and wherein the third level ground isolation plane structure configured to reduce crosstalk between the first level first type of data signal contacts and the second level second type of data signal contacts.

In Example 13, the subject matter can optionally include the system of Example 8, the first and second type of data signal lines being impedance tuned using eye heights and widths of an eye diagram to determine a width of the first and second type of data signal lines and a spacing between horizontally adjacent ones of the first and second type of data signal lines.

Example 14 is a method of forming a ground isolated horizontal data signal transmission line package device including forming a second interconnect level having a second level lower layer with second level second type of data signal lines, the second level second type of data signal lines disposed between (1) horizontally adjacent second level non-conductive material portions that are disposed between (2) horizontally adjacent second level ground isolation lines of conductor material; forming a third interconnect level above the second interconnect level, the third level having a third level lower layer with a third level ground isolation plane structure; forming a first interconnect level above the third interconnect level; wherein forming the first interconnect level includes forming a first level lower layer with first level first type of data signal lines, the first level first type of data signal lines disposed between (1) horizontally adjacent first level non-conductive material portions that are disposed between (2) horizontally adjacent first level ground isolation lines of conductor material; wherein the first level ground isolation lines are horizontally offset to cause each of the first level ground isolation lines to be centered directly over each of the second level second type of data signal lines; and wherein the third level ground isolation plane structure is disposed between the first level first type of data signal contacts and the second level second type of data signal contacts.

In Example 15, the subject matter can optionally include the method of Example 14, wherein forming the second interconnect level further includes forming a second level upper layer having dielectric material onto the second level lower layer; wherein forming the third interconnect level further includes forming the third level lower layer onto a second level upper layer having dielectric material; forming a third level upper layer having dielectric material onto the third level lower layer; wherein forming the first interconnect level further includes forming the first level lower layer onto a third level upper layer having dielectric material; forming a first level upper layer having dielectric material onto the first level lower layer.

In Example 16, the subject matter can optionally include the method of Example 15, the first level lower layer having first level ground contacts directly connected to the first level ground isolation lines; the second level lower layer having second level ground contacts directly connected to the second level ground isolation lines; and the third level lower layer having third level ground contacts directly connected to the third level ground isolation plane structure.

In Example 17, the subject matter can optionally include the method of Example 16, further including prior to forming the second level, forming a forth interconnect level below the second interconnect level; wherein forming the fourth interconnect level further includes forming a fourth level lower layer with fourth level second type of data signal lines, the fourth level second type of data signal lines disposed between (1) horizontally adjacent fourth level non-conductive material portions that are disposed between (2) horizontally adjacent fourth level ground isolation lines of conductor material; and the fourth level ground isolation lines horizontally offset to cause each of the fourth level ground isolation lines to be centered directly under each of the second level second type of data signal lines; the fourth level lower layer having fourth level ground contacts directly connected to the fourth level ground isolation lines; and forming a fourth level upper layer having dielectric material onto the fourth level lower layer; wherein forming the second interconnect level further includes forming the second level lower layer onto the fourth level upper layer.

In Example 18, the subject matter can optionally include the method of Example 14, further including transmitting on the first type of data signal lines, receive data signals at a frequency of between 7 and 25 gigatransfers per second (GT/s); transmitting on the second type of data signal lines, transmit data signals at a frequency of between 7 and 25 gigatransfers per second (GT/s); and the second level ground isolation lines increasing isolation between the second level second type of data signal contacts.

In Example 19, the subject matter can optionally include the method of Example 18, the second level ground isolation lines reducing crosstalk between the first level first type of data signal contacts and the fourth level second type of data signal contacts; and the third level ground isolation plane structure reducing crosstalk between the first level first type of data signal contacts and the second level second type of data signal contacts.

In Example 20, the subject matter can optionally include the method of Example 14, further including prior to forming the second interconnect level, impedance tuning the first and second type of data signal lines using eye heights and widths of an eye diagram to determine a width of the first and second type of data signal lines and a spacing between horizontally adjacent ones of the first and second type of data signal lines.

In Example 21, the subject matter can optionally include an apparatus including means for performing the method of any one of Examples 14-20.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize. These modifications may be made to the invention in light of the above detailed description.

For example, although the descriptions above show only ground isolation planes; lines; or planes and lines in levels Lj-Ll of FIGS. 1-4, or levels Lm-Lq of FIGS. 5-8, or levels Lm-Ly of FIGS. 9-12 those descriptions can apply to fewer, more or different ground isolation planes; lines; or planes and lines. Embodiments of fewer such structures may be where only one or two of levels Lj-Ll of FIGS. 1-4, or levels Lm-Lq of FIGS. 5-8, or levels Lm-Ly of FIGS. 9-12 exist. Embodiments of more of such structures may be where additional levels of ground isolation planes; lines; or planes and lines similar to levels Lj-Ll of FIGS. 1-4, or levels Lm-Lq of FIGS. 5-8, or levels Lm-Ly of FIGS. 9-12 exist in devices 150, 550 or 950, above or below levels Lj-Ll of FIGS. 1-4, or levels Lm-Lq of FIGS. 5-8, or levels Lm-Ly of FIGS. 9-12. Embodiments of different of such ground isolation planes; lines; or planes and lines may be such as where ones of levels Lj-Ll of FIGS. 1-4, or levels Lm-Lq of FIGS. 5-8, or levels Lm-Ly of FIGS. 9-12 replace or are mixed with other levels of levels Lj-Ll of FIGS. 1-4, or levels Lm-Lq of FIGS. 5-8, or levels Lm-Ly of FIGS. 9-12.

The terms used in the following claims should not be construed to limit the invention to the specific implementations disclosed in the specification and the claims. Rather, the scope is to be determined entirely by the following claims, which are to be construed in accordance with established doctrines of claim interpretation.

The invention claimed is:

1. A ground isolated horizontal data signal transmission line package device comprising:
   a first interconnect level having a first level lower layer with first level first type of data signal lines, the first level first type of data signal lines disposed between (1) horizontally adjacent first level non-conductive material portions that are disposed between (2) horizontally adjacent first level ground isolation lines of conductor material;

a second interconnect level below the first interconnect level;

the second interconnect level having a second level lower layer with second level second type of data signal lines, the second level second type of data signal lines disposed between (1) horizontally adjacent second level non-conductive material portions that are disposed between (2) horizontally adjacent second level ground isolation lines of conductor material;

the second level ground isolation lines horizontally offset to cause each of the second level ground isolation lines to be centered under each of the first level first type of data signal lines; and a third interconnect level between the first interconnect level and the second interconnect level;

the third interconnect level having a third level lower layer with a third level ground isolation plane structure disposed between the first level first type of data signal lines and the second level second type of data signal lines.

2. The package device of claim 1 further comprising:

the first interconnect level having a first level upper layer having dielectric material formed onto the first level lower layer;

the first level lower layer formed onto a third level upper layer having dielectric material;

the third level upper layer formed onto the third level lower layer;

the third level lower layer formed onto a second level upper layer having dielectric material;

the first level lower layer having first level ground contacts directly connected to the first level ground isolation lines;

the second level lower layer having second level ground contacts directly connected to the second level ground isolation lines; and the third level lower layer having third level ground contacts directly connected to the third level ground isolation plane structure.

3. The package device of claim 2 further comprising:

a fourth interconnect level below the second interconnect level;

the fourth interconnect level having a fourth level lower layer with fourth level second type of data signal lines, the fourth level second type of data signal lines disposed between (1) horizontally adjacent fourth level non-conductive material portions that are disposed between (2) horizontally adjacent fourth level ground isolation lines of conductor material; and the fourth level ground isolation lines horizontally offset to cause each of the fourth level ground isolation lines to be centered directly under each of the second level second type of data signal lines.

4. The package device of claim 3 further comprising:

the second level lower layer formed onto a fourth level upper layer having dielectric material;

the fourth level upper layer formed onto the fourth level lower layer; and the fourth level lower layer having fourth level ground contacts directly connected to the fourth level ground isolation lines.

5. The package device of claim 1, the first type of data signal lines being one of receive data signal lines or transmit data signal lines configured to communicate data to a device at a frequency of between 7 and 25 gigatransfers per second (GT/s); the second type of data signal lines being one of transmit data signal lines and receive data signal lines configured to communicate data to a device at a frequency of between 7 and 25 gigatransfers per second (GT/s); and the second type of data signal lines being a different type than the first type.

6. The package device of claim 5, the second level ground isolation lines configured to decrease crosstalk between the second level second type of data signal contacts;

the second level ground isolation lines configured to reduce crosstalk between the first level first type of data signal contacts and the fourth level second type of data signal contacts; and the third level ground isolation plane structure configured to reduce crosstalk between the first level first type of data signal contacts and the second level second type of data signal contacts.

7. The package device of claim 1, the first and second type of data signal lines being impedance tuned using eye heights and widths of an eye diagram to determine a width of the first and second type of data signal lines and a spacing between horizontally adjacent ones of the first and second type of data signal lines.

8. A system for communicating with an integrated circuit (IC) chip comprising:

the IC chip mounted on a ground isolated horizontal data signal transmission line package device, the ground isolated horizontal data signal transmission line package device including:

a first interconnect level having a first level lower layer with first level first type of data signal lines, the first level first type of data signal lines disposed between (1) horizontally adjacent first level non-conductive material portions that are disposed between (2) horizontally adjacent first level ground isolation lines of conductor material;

a second interconnect level below the first interconnect level;

the second interconnect level having a second level lower layer with second level second type of data signal lines, the second level second type of data signal lines disposed between (1) horizontally adjacent second level non-conductive material portions that are disposed between (2) horizontally adjacent second level ground isolation lines of conductor material;

the second level ground isolation lines horizontally offset to cause each of the second level ground isolation lines to be centered under each of the first level first type of data signal lines;

a third interconnect level between the first interconnect level and the second interconnect level;

the third interconnect level having a third level lower layer with a third level ground isolation plane structure disposed between the first level first type of data signal lines and the second level second type of data signal lines; and data signal contacts of the IC chip electrically coupled to the first type of data signal lines and to the second type of data signal lines of the ground isolated horizontal data signal transmission line package device.

9. The system of claim 8 wherein ground contacts of the IC chip are electrically coupled to the first level ground isolation lines, to the second level ground isolation lines, and to the third level ground isolation plane structure of the package device; and wherein the first level ground isolation lines.

10. The system of claim 9 wherein the second level ground isolation lines and the third level ground isolation plane structure are configured to provide quicker and more accurate data signal transfer through the first type of data signal lines and through the second type of data signal lines of the ground isolated horizontal data signal transmission line package device.

11. The system of claim 8, wherein the IC chip is a first IC chip and the system further comprising:
a second IC chip mounted on the package structure;
data signal contacts of the second IC chip electrically coupled to the first type of data signal lines and to the second type of data signal lines of the ground isolated horizontal data signal transmission line package device; and
wherein the first type of data signal lines and the second type of data signal lines of the ground isolated horizontal data signal transmission line package device are configured to communicate data signals between the first IC chip and the second IC chip.

12. The system of claim 8, the first type of data signal lines being one of receive data signal lines or transmit data signal lines configured to communicate data to a device at a frequency of between 7 and 25 gigatransfers per second (GT/s); the second type of data signal lines being one of transmit data signal lines and receive data signal lines configured to communicate data to a device at a frequency of between 7 and 25 gigatransfers per second (GT/s); and the second type of data signal lines being a different type than the first type; and wherein the second level ground isolation lines configured to decrease crosstalk between the second level second type of data signal contacts;
wherein the second level ground isolation lines configured to reduce crosstalk between the first level first type of data signal contacts and the fourth level second type of data signal contacts; and
wherein the third level ground isolation plane structure configured to reduce crosstalk between the first level first type of data signal contacts and the second level second type of data signal contacts.

13. The system of claim 8, the first and second type of data signal lines being impedance tuned using eye heights and widths of an eye diagram to determine a width of the first and second type of data signal lines and a spacing between horizontally adjacent ones of the first and second type of data signal lines.

14. A method of forming a ground isolated horizontal data signal transmission line package device comprising:
forming a second interconnect level having a second level lower layer with second level second type of data signal lines, the second level second type of data signal lines disposed between (1) horizontally adjacent second level non-conductive material portions that are disposed between (2) horizontally adjacent second level ground isolation lines of conductor material;
forming a third interconnect level above the second interconnect level, the third level having a third level lower layer with a third level ground isolation plane structure;
forming a first interconnect level above the third interconnect level; wherein forming the first interconnect level includes:
forming a first level lower layer with first level first type of data signal lines, the first level first type of data signal lines disposed between (1) horizontally adjacent first level non-conductive material portions that are disposed between (2) horizontally adjacent first level ground isolation lines of conductor material;
wherein the first level ground isolation lines are horizontally offset to cause each of the first level ground isolation lines to be centered over each of the second level second type of data signal lines; and
wherein the third level ground isolation plane structure is disposed between the first level first type of data signal lines and the second level second type of data signal lines.

15. The method of claim 14, wherein forming the second interconnect level further comprises forming a second level upper layer having dielectric material onto the second level lower layer;
wherein forming the third interconnect level further comprises:
forming the third level lower layer onto a second level upper layer having dielectric material;
forming a third level upper layer having dielectric material onto the third level lower layer;
wherein forming the first interconnect level further comprises:
forming the first level lower layer onto a third level upper layer having dielectric material;
forming a first level upper layer having dielectric material onto the first level lower layer.

16. The method of claim 15, the first level lower layer having first level ground contacts directly connected to the first level ground isolation lines;
the second level lower layer having second level ground contacts directly connected to the second level ground isolation lines; and
the third level lower layer having third level ground contacts directly connected to the third level ground isolation plane structure.

17. The method of claim 16, further comprising:
prior to forming the second level, forming a fourth interconnect level below the second interconnect level;
wherein forming the fourth interconnect level further comprises:
forming a fourth level lower layer with fourth level second type of data signal lines, the fourth level second type of data signal lines disposed between (1) horizontally adjacent fourth level non-conductive material portions that are disposed between (2) horizontally adjacent fourth level ground isolation lines of conductor material; and
the fourth level ground isolation lines horizontally offset to cause each of the fourth level ground isolation lines to be centered directly under each of the second level second type of data signal lines;
the fourth level lower layer having fourth level ground contacts directly connected to the fourth level ground isolation lines; and
forming a fourth level upper layer having dielectric material onto the fourth level lower layer;
wherein forming the second interconnect level further comprises forming the second level lower layer onto the fourth level upper layer.

18. The method of claim 14, further comprising:
transmitting on the first type of data signal lines, receive data signals at a frequency of between 7 and 25 gigatransfers per second (GT/s);
transmitting on the second type of data signal lines, transmit data signals at a frequency of between 7 and 25 gigatransfers per second (GT/s); and
the second level ground isolation lines increasing isolation between the second level second type of data signal contacts.

19. The method of claim 18, the second level ground isolation lines reducing crosstalk between the first level first type of data signal contacts and the fourth level second type of data signal contacts; and the third level ground isolation plane structure reducing crosstalk between the first level first type of data signal contacts and the second level second type of data signal contacts.

20. The method of claim 14, further comprising:

prior to forming the second interconnect level, impedance tuning the first and second type of data signal lines using eye heights and widths of an eye diagram to determine a width of the first and second type of data signal lines and a spacing between horizontally adjacent ones of the first and second type of data signal lines.

\* \* \* \* \*